US011614502B2

(12) United States Patent
Al Faruque et al.

(10) Patent No.: US 11,614,502 B2
(45) Date of Patent: Mar. 28, 2023

(54) ANALOG AND DIGITAL CO-DESIGN TECHNIQUES TO MITIGATE NON-INVASIVE SPOOFING ATTACK ON MAGNETIC SENSORS

(71) Applicant: THE REGENTS OF THE UNIVERSITY OF CALIFORNIA, Oakland, CA (US)

(72) Inventors: Mohammad Abdullah Al Faruque, Irvine, CA (US); Anomadarshi Barua, Irvine, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 17/518,483

(22) Filed: Nov. 3, 2021

(65) Prior Publication Data

US 2022/0137159 A1    May 5, 2022

Related U.S. Application Data

(60) Provisional application No. 63/109,175, filed on Nov. 3, 2020.

(51) Int. Cl.
*G01R 33/032* (2006.01)
*G01R 33/07* (2006.01)
(52) U.S. Cl.
CPC ....... *G01R 33/0322* (2013.01); *G01R 33/072* (2013.01)
(58) Field of Classification Search
CPC combination set(s) only.
See application file for complete search history.

(56) References Cited

U.S. PATENT DOCUMENTS

| 2014/0043085 A1* | 2/2014 | Motz | G01R 33/07 327/307 |
| 2016/0282425 A1* | 9/2016 | Haas | G01R 33/0017 |
| 2017/0016966 A1* | 1/2017 | Goodwin | G01P 3/44 |

(Continued)

OTHER PUBLICATIONS

Anonymous Submission "PreMSat: Preventing Magnetic Saturation Attack on Hall Sensors," IACR TCHES; Obtained Nov. 4, 2021; 24 pages.

(Continued)

*Primary Examiner* — Alvaro E Fortich
(74) *Attorney, Agent, or Firm* — Nguyen Tarbet LLC

(57) ABSTRACT

A structure for magnetic flux sensor conditioning is presented which partitions an input analog signal of unknown integrity into two: susceptible and insusceptible. The structure scrutinizes the susceptible signal partition, in view of additional guard sensor information, through a mixed-signal processing side-chain that employs a non-invasive physical magnetic attack detection algorithm. The side-chain either validates, or replaces with a best estimate, the susceptible signal partition, depending upon the absence or presence of attack, respectively. The structure finally recombines the scrutinized susceptible signal partition with the insusceptible signal partition. The result is an analog magnetic flux sensor signal that is robust against skillful, surreptitious, spoofing attacks. If unmitigated, such attacks may induce catastrophic consequences into systems relying upon the magnetic flux sensor.

20 Claims, 25 Drawing Sheets

(56) References Cited

U.S. PATENT DOCUMENTS

2017/0030979 A1* 2/2017 Cesaretti ............ G01R 33/0035
2018/0292469 A1* 10/2018 Hohe ................. G01R 33/0017

OTHER PUBLICATIONS

"HALC: A Real-time In-sensor Defense against the Magnetic Spoofing Attack on Hall Sensors" Obtained Nov. 4, 2021, 18 pages.

* cited by examiner

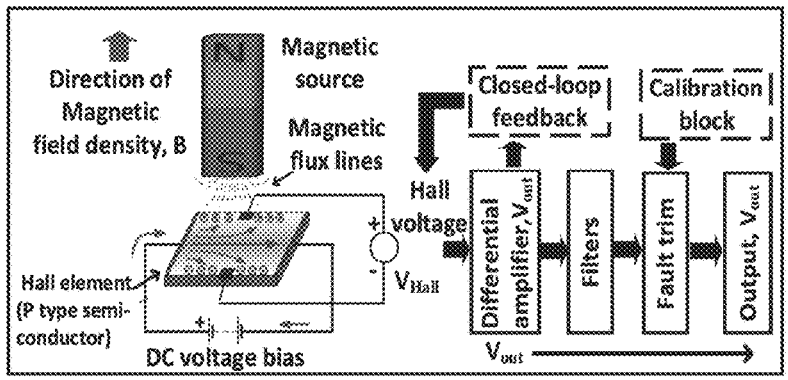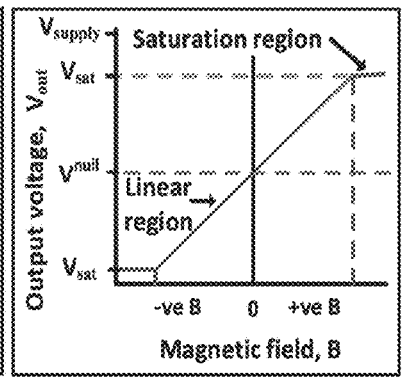
FIG. 2A    FIG. 2B
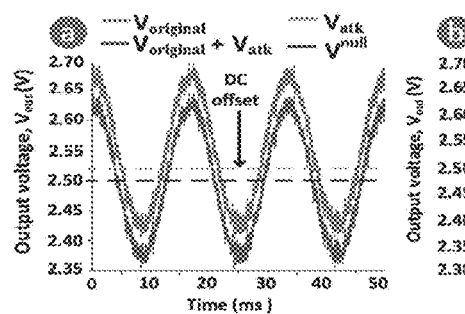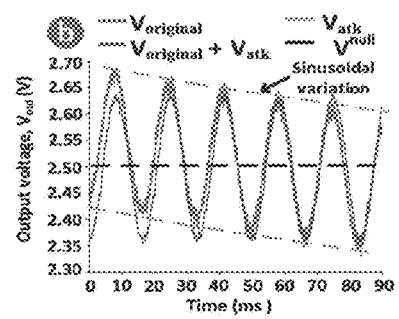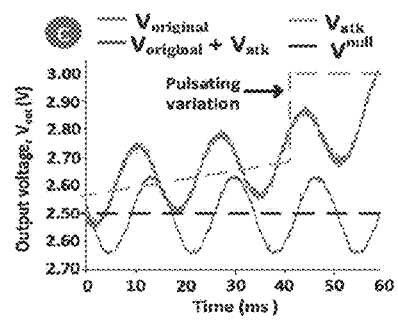
FIG. 3A    FIG. 3B    FIG. 3C
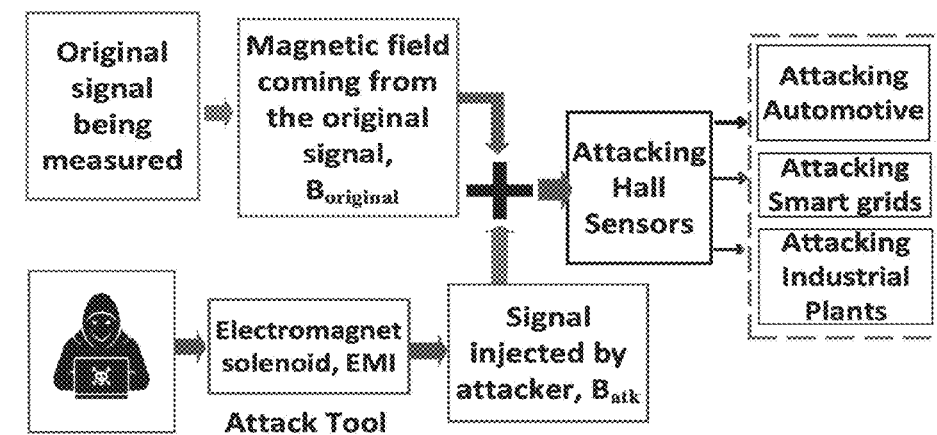
FIG. 3D

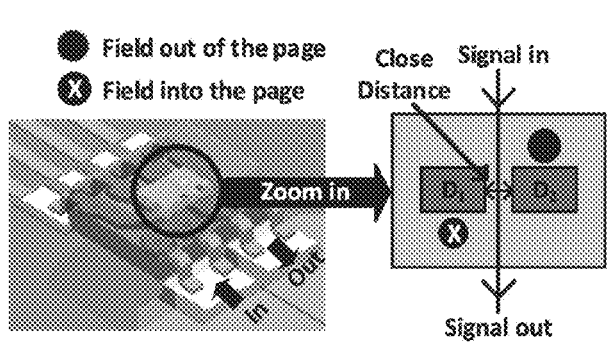
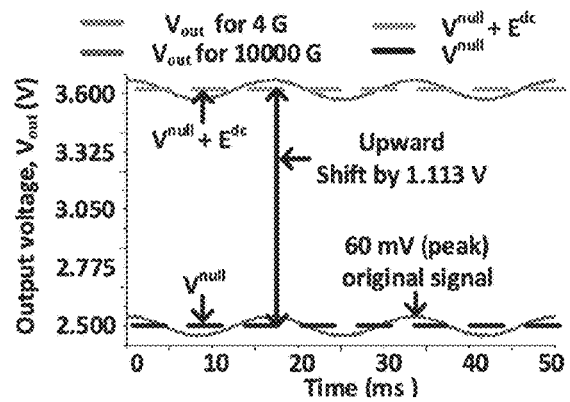
FIG. 4A  FIG. 4B
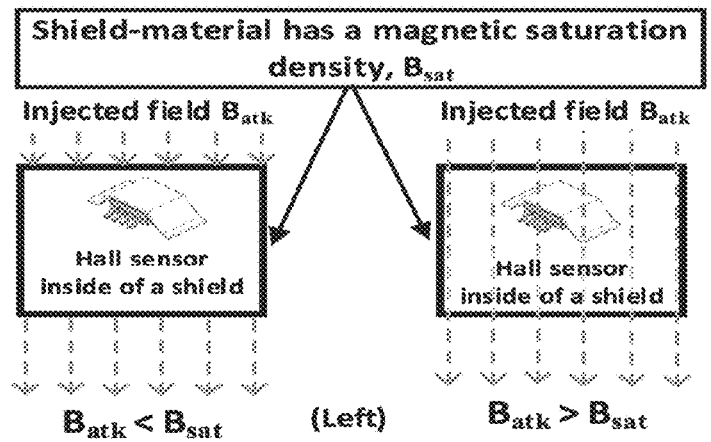
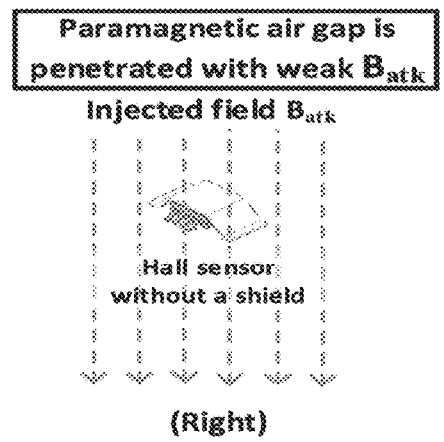
FIG. 5A  FIG. 5B
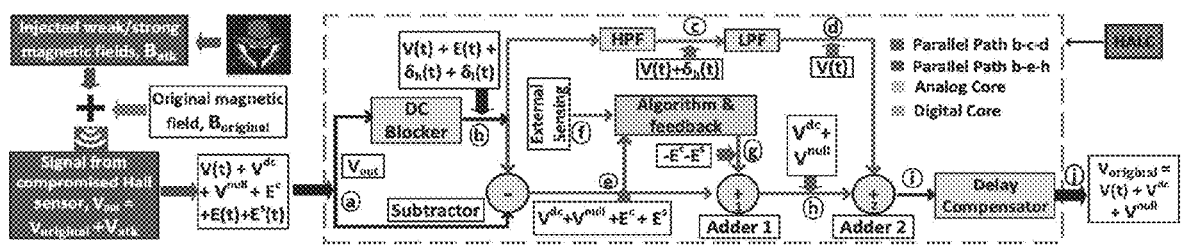
FIG. 6

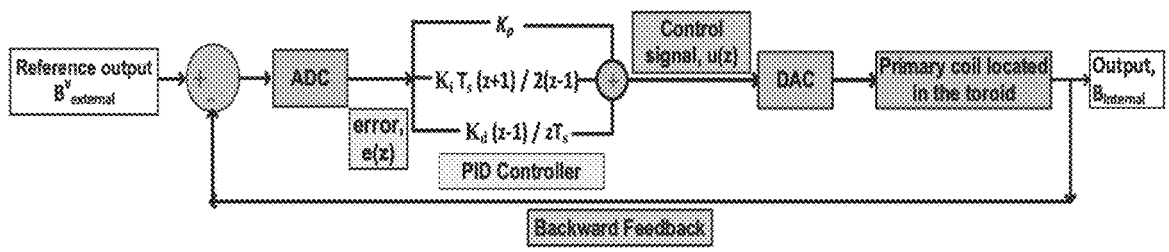

FIG. 25

Algorithm 2: Algorithm running in the PreMSat

```
Input: Data from ADC: V_secondary^diff
Output: Current signals to the primary coil: I_primary
1  Setup ADC ← (12 bits, sampling freq. = 35 kHz)
2  B_internal ← 0
3  for t ← 1 to ∞ do
4      Track V_secondary^diff
5      if V_secondary^diff changes then
6          Notification of Attack happens
7          Setup ADC ← (12 bits, sampling freq. = 900 kHz)
8          Calculate B_external^v from V_secondary^diff using Eqn. 5
9          Calculate e(z) ← B_external^v - B_internal
10         for Continue until e(z) is within 1% of the B_external^v do
11             Generate u(z) and u(k) using Eqns. 7, and 8
12             Convert u(k) to I_primary, where I_primary is an analog version of u(k), using DAC
13             Generate B_internal from I_primary using Eqns. 2, and 3
14             Calculate e(z) ← B_external^v - B_internal
15         Output = I_primary
16     else
17         Do not Generate B_internal from I_primary using Eqns. 2, and 3
```

FIG. 26

ANALOG AND DIGITAL CO-DESIGN TECHNIQUES TO MITIGATE NON-INVASIVE SPOOFING ATTACK ON MAGNETIC SENSORS

CROSS-REFERENCES TO RELATED APPLICATIONS

This application is a non-provisional and claims benefit of U.S. Provisional Application No. 63/109,175, filed Nov. 3, 2020, the specification(s) of which is/are incorporated herein in their entirety by reference.

BACKGROUND OF THE INVENTION

Hall Effect magnetic flux sensors typically participate in the context of a larger electronic system, the consequences of whose malfunction may be severe. Since analog sensors, such as Hall sensors, are not intrinsically optimized for security, maliciously injected electromagnetic interference (EMI) can easily affect different onboard analog sensors, which can eventually propagate to the connected analog and radio-frequency (RF) electronics and their related controllers, which can eventually disrupt the functionality of the entire electronic system. Therefore, improving the integrity of signals obtained from Hall-effect sensors improves the larger electronic system's immunity to maliciously injected EMI, also called 'spoofing'.

FIELD OF THE INVENTION

The present invention relates to electronic systems that employ magnetic field sensors. These systems may be subject to malicious signal interference, or signal spoofing, because magnetic flux of sufficient strength may penetrate any practical container that attempts to localize the volume of space in which the expected magnetic flux is perceived by a sensor. The present invention anticipates spoofing attacks by malicious magnetic flux signal interference and actively mitigates them at the sensor level, which improves confidence in the intended operation of the entire system.

BRIEF SUMMARY OF THE INVENTION

It is an objective of the present invention to provide structures and methods that allow for improved integrity of signals available from magnetic flux sensors in the presence of non-invasive physical attacks upon them, as specified in the independent claims. Embodiments of the invention are given in the dependent claims. Embodiments of the present invention can be freely combined with each other if they are not mutually exclusive.

The present invention introduces a novel in-sensor hardware-software co-design methodology to make state-of-the-art analog Hall-effect magnetic flux sensors robust against any type of external Electromagnetic Interference (EMI) spoofing attacks. The present invention employs a novel algorithm to separate external EMI spoofing from the desired signal by using digital signal processing (DSP) cores in the in-sensor computational memory-blocks to keep the connected analog and radio-frequency (RF) systems operational during an attack, in an unperturbed fashion. Hence, the present invention is novel in the sense that it cannot only detect any type of external EMI spoofing attacks but also it can contain the attack inside of the Hall-effect sensors, so that the attack cannot propagate further into the sensor's connected, enclosing, analog and RF systems.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCRIPTION OF THE SEVERAL VIEWS OF THE DRAWINGS

The features and advantages of the present invention will become apparent from a consideration of the following detailed description presented in connection with the accompanying drawings in which:

FIG. 2A shows in-sensor components of a typical Hall sensor.

FIG. 2B shows the transfer function of a typical Hall sensor. The Hall element can generate $V_H$ proportional to magnetic fields being sensed.

FIG. 3A shows that constant $B_{atk}$ adds a DC offset.

FIG. 3B shows how the sinusoidal $B_{atk}$ modulates the $V_{original}$ sinusoidally.

FIG. 3C shows how the square pulsating $B_{atk}$ creates a pulsating variation in $V_{original}$.

FIG. 3D shows a noninvasive magnetic spoofing attack on Hall sensors.

FIG. 4A shows a differential Hall sensor.

FIG. 4B shows that a differential Hall sensor only works against a weak field (<5G).

FIG. 5A shows that if $B_{atk}>B_{sat}$, the $B_{atk}$ can penetrate the shield.

FIG. 5B shows the situation where a paramagnetic air gap is penetrated with a weak $B_{atk}$.

FIG. 6 shows the basic blocks of an example Hall Spoofing Container (HALC).

FIG. 10 shows signal analysis at all nodes of the HALC. The signal at node i is a phase-delayed form of the input signal at node a.

FIG. 25 shows how the PID controller minimizes the error between $B_{external}$ and $B^v_{external}$.

FIG. 26 shows an example algorithm for a PreMSat embodiment.

DETAILED DESCRIPTION OF THE INVENTION

Figure 1:
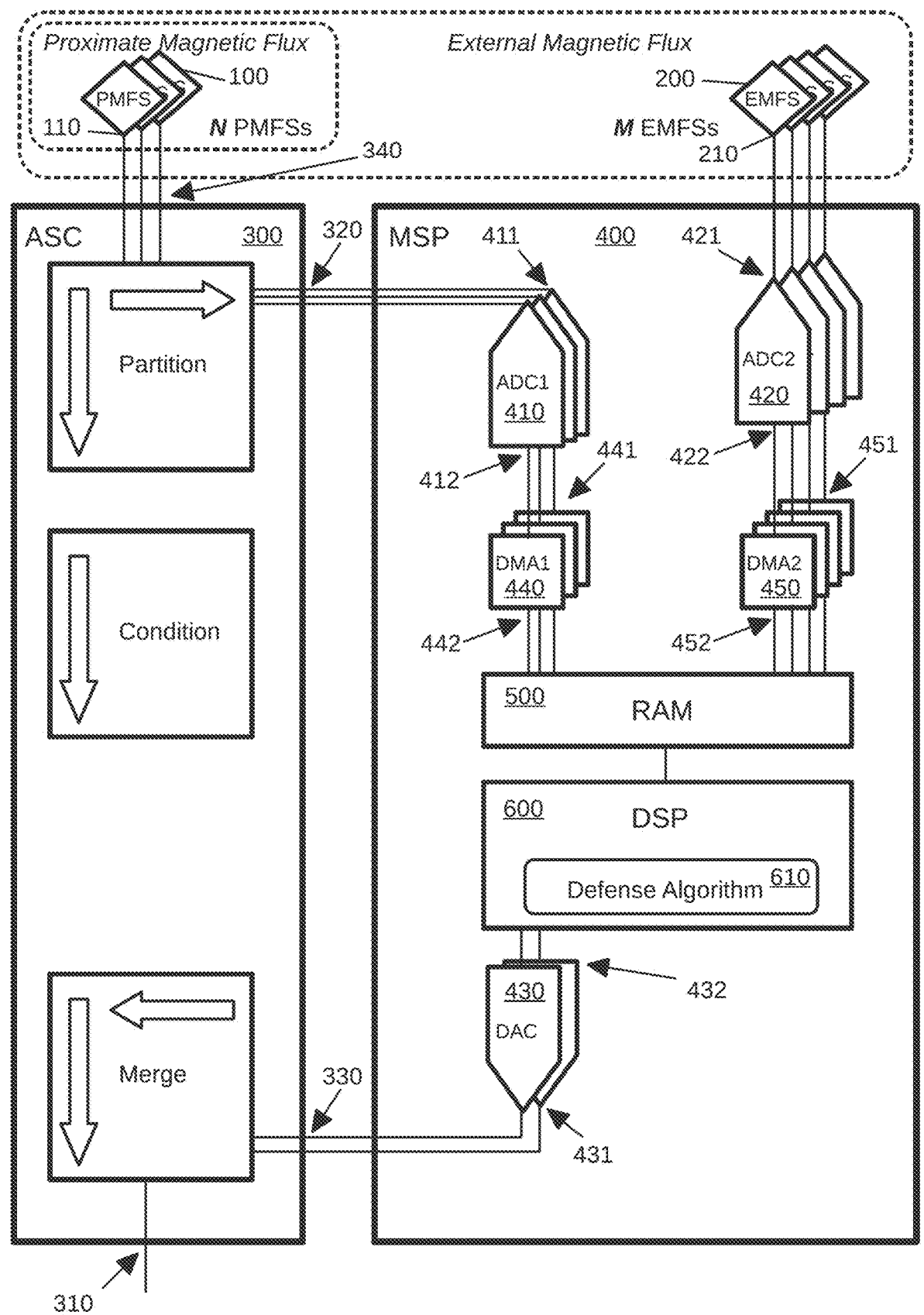
FIG. 1 shows a block diagram of the structure of the analog and digital co-design technique to mitigate non-invasive spoofing attacks on magnetic sensors, of the present invention. A plurality of proximate magnetic flux sensors (PMFSs) (100) is strongly receptive of magnetic flux signal of interest, termed the "proximate magnetic flux", but inevitably also receptive to extraneous, and possibly malicious, stray flux, termed the "external magnetic flux". A plurality of external magnetic flux sensors (EMFSs) (200), are receptive to external flux alone. An analog sensor conditioning block (ASC) (300) partitions susceptible signals from insusceptible signals arising from the PMFSs, passing the susceptible signals to the mixed-signal processing block (MSP) (400) for scrutiny. Based upon signals from the EMFSs, the MSP classifies the susceptible signals from the PMFSs as trustworthy, or not, by applying the defense algorithm (610). Based upon said classification, the digital signal processor (DSP) (600) provides the last known best estimate of the susceptible signal partition back to the ASC, where it is merged with the insusceptible signal partition, and presented at the ASC overall analog output port (310).

Following is a list of elements corresponding to a particular element referred to herein:
100 proximate magnetic flux sensor (PMFS)
110 PMFS analog output port
200 external magnetic flux sensor (EMFS)
210 EMFS analog output port
300 analog sensor conditioning block (ASC)
310 ASC overall analog output port
320 ASC decomposed analog output port
330 ASC recomposed analog input port
340 ASC raw analog input port
400 mixed-signal processing block (MSP)
410 analog-to-digital converter (ADC1)
411 ADC1 analog input port
412 ADC1 output port
420 analog-to-digital converter (ADC2)
421 ADC2 analog input port
422 ADC2 output port
430 digital-to-analog converter (DAC)
431 DAC analog output port
432 DAC input port
440 direct-memory-access channel (DMA1)
441 DMA1 peripheral port
442 DMA1 random-access memory (RAM) port
450 direct-memory-access channel (DMA2)
451 DMA2 peripheral port
452 DMA2 random-access memory (RAM) port
500 random-access memory (RAM)
600 digital signal processor (DSP)
610 defense algorithm Referring now to FIG. 1, the present invention features a structure to improve the security and integrity of the signals delivered by a magnetic flux sensor, such as a Hall-effect sensor, that is subject to a non-invasive physical spoofing attack by strong external magnetic flux. In this context, the term "attack" abbreviates the words "non-invasive physical spoofing attack". The present invention may comprise plurality of proximate magnetic flux sensors (PMFSs) (100), a plurality of external magnetic flux sensors (EMFSs) (200), an analog signal conditioning block (ASC) (300), and a mixed-signal processing block (MSP) (400). The PMFSs may detect magnetic flux due to an expected or intended signal source, such as the alternating current flowing in nearby wire of interest, or a nearby time-varying magnetic flux, such as that produced by a permanent magnet attached to a motor shaft for the purpose of sensing its angular velocity. In this context, the term "proximate", in describing a magnetic flux sensor, means that it is physically near to an expected or intended magnetic flux source. Additionally, both the PMFSs and the EMFSs may detect magnetic flux due to unexpected or unintended sources, such as Earth's magnetic field, which is very weak, or an attack by strong external magnetic fields. In this context, the term "external", in describing a magnetic flux sensor, means that it need not be physically near to intended magnetic flux sources. Magnetic shielding enclosing the PMFSs may reduce, but not eliminate, attacks by strong external magnetic flux. In this context, the intensity of a strong magnetic flux may be one that exceeds about 1000 gauss. The ASC and MSP may work in concert to provide a magnetic flux sensor signal that may be about free from attack interference.

A structure to mitigate non-invasive physical attacks upon a magnetic flux sensor may comprise a plurality of proximate magnetic flux sensors (PMFSs) (100) N in number, a plurality of external magnetic flux sensors (EMFSs) (200) M in number, an analog sensor conditioning block (ASC) (300), and a mixed-signal processing block (MSP) (400). The integer N, the number of PMFSs, may be in the range of 1 to 20, as the needs of any specific application may dictate. The integer M, the number of EMFS, may be in the range of 1 to 20, and may be chosen independently of N.

Each PMFS may comprise an analog output port (110), and each EMFS may comprise an analog output port (210). The analog output ports may convey an electrical analog representation of the magnetic flux sensed by a Hall-effect sensor, or other magnetic flux sensor.

An ASC may comprise an overall analog output port (310), a plurality of decomposed analog output ports (320) N in number, a plurality of recomposed analog input ports (330), and a plurality of raw analog input ports (340), N in number. Analog input signals from the PMFSs may arrive to the ASC at the plurality of raw analog input ports. Analog signals may depart the ASC for MSP processing via the decomposed analog output ports, and may reenter the ASC from the MSP via the recomposed analog input ports. The ASC may present a secured sensor analog output signal at the overall analog output port. In this context, a "secured" signal is one that has been conditioned by the defense algorithm (610).

An MSP may comprise a first plurality of analog-to-digital converters (ADC1s) N in number, wherein each ADC1 (410) may comprise an analog input port (411) and an output port (412), and an MSP may comprise a second plurality of analog-to-digital converters (ADC2s) M in number, wherein each ADC2 (420) may comprise an analog input port (421) and an output port (422). Here may begin a partial elaboration of sub-components within the MSP. Mixed-signal processing of the susceptible signal may begin subsequent to analog-to-digital conversion. In this context, a "susceptible" signal is one that is known, a priori, to be vulnerable to an attack by strong external magnetic flux.

An MSP may comprise a plurality of digital-to-analog converters (DACs), wherein each DAC (430) may comprise an analog output port (431) and an input port (432). Before reintroduction of the secured susceptible signal into the ASC, digital-to-analog conversion may be required.

An MSP may comprise a first plurality of direct memory access channels (DMA1s) N in number, wherein each DMA1 (440) may comprise a peripheral port (441) and a random-access memory (RAM) port (442). The DMA1s may convey the data stream arriving from the ADC1s, via the DMA1s peripheral ports, into the random-access memory (RAM) (500), via the DMA1s RAM ports.

An MSP may comprise a second plurality of direct memory access channels (DMA2s) M in number, wherein each DMA2 (450) may comprise a peripheral port (451) and a random-access memory (RAM) port (452). The DMA2s may convey the data stream arriving from the ADC2s, via the DMA2s peripheral ports, into the RAM, via the DMA2s RAM ports.

An MSP may comprise a random-access memory (RAM) (500) and a digital signal processor (DSP) (600), which may comprise a defense algorithm (610). The RAM may accumulate the data streams arriving from the DMA1s and DMA2s, until the defense algorithm may be applied the data streams by the DSP.

The plurality of PMFSs (100) may sense intentional magnetic flux, and may sense external magnetic flux, while the plurality of EMFSs (200) may sense external magnetic flux. The PMFSs may naively sense intentional magnetic flux, while the EMFSs may introduce due skepticism regarding the PMFSs analog output signals by sensing the external magnetic flux. The MSP may apply the defense algorithm to resolve said skepticism.

The PMFS analog output ports (110) may connect electrically, respectively, to the ASC raw analog input ports (340); and the EMFS analog output ports (210) may connect electrically, respectively, to the ADC2 analog input ports (421). Communication among the various blocks constituting the present invention may thus be established.

The ASC decomposed analog output ports (320) may connect electrically, respectively, to the ADC1 analog input ports (411), and the DAC analog output ports (431) may connect electrically, respectively, to the ASC recomposed analog input ports (330). Communication among the various blocks constituting the present invention may thus be established.

The ADC1 output ports (412) may connect electrically, respectively, to the DMA1 peripheral ports (441), and the ADC2 output ports (422) may connect electrically, respectively, to the DMA2 peripheral ports (451). Communication among the various blocks constituting the present invention may thus be established.

The DMA1 RAM ports (442) may connect electrically to the RAM (500), and the DMA2 RAM ports (452) may connect electrically to the RAM (500). Communication among the various blocks constituting the present invention may thus be established.

The RAM (500) may connect electrically to the DSP (600), and the DSP (600) may connect electrically, respectively, to the DAC input ports (432). Communication among the various blocks constituting the present invention may thus be established.

The ASC (300) may decompose the PMFS signals from the ASC raw analog input ports (340) and may send a first partition of the PMFS signals to the ASC decomposed analog output ports (320). The ASC may send the susceptible signal partition from the PMFSs to the MSP via the ASC decomposed analog output ports, while the ASC may retain the insusceptible partition for further analog processing, in parallel with that of the MSP.

The ASC (300) may recompose a second partition of the PMFS signals with signals from the ASC recomposed analog input ports (330). The ASC may reincorporate the susceptible signal partition, having arrived processed by the MSP via the ASC recomposed analog input ports, with the insusceptible partition to create a secure sensor signal.

The DSP (600) may apply the defense algorithm (610) to detect an attack by means of external magnetic flux upon the EMFSs (200) and, if an attack is detected, the DSP (600) may suppress and replace the decomposed signal arising from the PMFSs (100) with the last known best estimate from the PMFSs (100); otherwise the DSP (600) may update the last known best estimate arising from the PMFSs (100). In the event of detection of an attack by the defense algorithm due to strong external magnetic fields, data arriving to the DSP from the PMFSs may be ignored and replaced with their best available estimates from prior known-good data. Absent detection of an attack by the defense algorithm, the DSP may validate the data arriving from the PMFSs, and may evaluate and update the last known best estimate accordingly.

The DSP (600) may configure the DAC analog output ports (431) with the last known best estimate arising from the PMFSs (100). The DAC analog output ports may represent the last known best estimate arising from the PMFSs in an analog manner.

The ASC (300) may recompose the magnetic flux sensor signal free from external magnetic flux, and the ASC (300) may apply the recomposed magnetic flux sensor signal to the ASC overall analog output port (310), so as to mitigate non-invasive physical attacks upon the PMFSs (100) by external magnetic flux.

Example 1

A HALC: A Real-Time In-Sensor Defense against the Magnetic Spoofing Attack on Hall Sensors Several papers have been published over the last six years to provide a defense against intentional spoofing to sensors. These techniques work against weak unwanted signals (e.g., EMI, etc.), which can change sensor output on a millivolt scale. However, they do not work against a strong magnetic spoofing that can change a passive Hall sensor output in volt scale and drive the Hall sensor close to its saturation region.

The present invention begins to fill this gap by providing a defense against the strong magnetic spoofing to passive Hall sensors. The defense HALC can detect and contain all types of strong and weak magnetic spoofing, such as constant, sinusoidal, and pulsating magnetic fields, in hard real-time. It works up to 9000 G of external magnetic fields within a frequency range 0 Hz-150 kHz, whereas existing defenses work only against weak EMI signals (i.e., <~5 G). The HALC utilizes the analog and digital cores to achieve a constant computational complexity $O(1)$.

Moreover, it is low-power (1.9 mW), low-cost ($12), and can be implemented in the sensor hardware domain. We have tested the HALC on 10 different industry-used Hall sensors to prove its efficacy and found that the correlation coefficient between the signals before and after the attack is greater than 0.91 in every test case. Moreover, we demonstrate its efficacy in two practical systems: a grid-tied solar inverter and a rotation-per-minute (RPM) measurement system. It is believed that this is the first methodology providing robust real-time defense against a weak and strong magnetic spoofing attack on passive Hall sensors.

INTRODUCTION

Recent decades have observed the proliferation of smart sensors in embedded and cyber-physical systems (ECPSs). One widely used sensor is the Hall sensor, which can output analog voltage proportional to the magnetic field it senses in the environment. Due to the continuous development in Hall sensing technology, nowadays, the Hall sensor has excellent accuracy, high efficiency, and good linearity, and their markets are growing rapidly. Despite this growth, they are still not secured, and recently, it has been proved that an attacker can compromise the integrity of the Hall sensor by injecting fake external magnetic fields.

Broadly speaking, the external magnetic field can introduce two types of errors in the Hall sensor output: the attacker can inject weak magnetic fields (e.g., EMI, etc.) to spoof the output within its linear region or can spoof with strong magnetic fields to drive the output close to its saturation region. In this example, a magnetic field less than 5 G is defined as weak magnetic field. We define the term strong magnetic fields by the amount of fields (i.e., 5 G) required to drive a sensor output from its linear region to close to its saturation region. As driving the output close to saturation changes the output on a large scale (i.e., volt range), the existing defenses do not work against it. Rather they would work against weak magnetic fields (i.e., ~5 G), which can change the output in its linear region on a small scale (i.e., millivolt range). Moreover, Hall sensors are of two types: active and passive. As passive sensors are naive devices, they blindly send signals to the upper level without proper authentication. Hence, the security of passive sensors is always challenging.

It is believed that there is no work in the literature and industry that can work against the strong magnetic spoofing on passive Hall sensors. As used herein the term "Hall sensors" refers to unipolar/bipolar, open-loop/closed-loop passive Hall sensors, unless stated otherwise. Hence, this example, proposes HALC: Hall Spoofing Container, to close this gap. The HALC can detect and contain all types of strong magnetic spoofing (i.e., constant, sinusoidal, and pulsating fields) in hard real-time and can prevent both unwanted spoofing and denial-of-service of the system. One core idea behind the HALC is that it can separate the injected fake signal from the original signal using two different cores-analog and digital core. The analog core removes the fake AC (i.e., time-dependent) magnetic fields using inexpensive fast-order filters, and the digital core removes the fake DC (i.e., constant) fields using a DC feedback signal keeping the original signal intact. The analog core is implemented in such a way that introduces two parallel paths to process inputs enabling faster signal processing, and the digital core runs low-power algorithm with $O(1)$ complexity that can even contain attack signals having the same frequency and amplitude as the original input signals. The HALC is low-power and can be implemented in the sensor hardware domain. Therefore, we name this solution as in-sensor defense, which is cheap and compatible with connected systems. Reportedly, the HALC is a robust real-time and in-sensor defense against the strong and weak magnetic spoofing on the Hall sensor that is the first of its kind in the literature and industry.

Contributions: Key technical contributions include the following:

1. HALC is a low-cost and low-power (1.9 mW) defense that can detect and contain the strong and weak magnetic spoofing in hard real-time. This embodiment also has a constant computational complexity $O(1)$.

2. The effectiveness of this HALC embodiment has been shown through over 150 experiments on 10 different Hall sensors from 4 different manufacturers. Experiments with different types, namely unipolar, bipolar, open-loop, closed-loop, and differential sensors to prove its efficacy on a wide varieties of Hall sensors.

3. The efficacy of the HALC has been proven in two critical systems: a grid-tied inverter in smart grids and a rotation-per-minute (RPM) system in industrial control systems (ICSs)

Related Works

The existing defenses can be broadly classified as system-level and sensor-level defenses.

System-level defenses: Shoukry et al. proposed PyCRA that is applicable only for active sensors, not for passive sensors. Wang et al. demonstrated a state-relation graph-based technique that can only detect intrusion but cannot provide a way to recover from the attack. Cardenas et al. and Urbina et al. incorporated the knowledge of the physical system under control to detect an attack on ICSs. But their approaches cannot contain the attack. Again, Shoukry et al. proposed to reconstruct the state to recover from a sensor spoofing attack using the satisfiability modulo theory (SMT) that cannot be implemented in the in-sensor hardware.

In general, system-level defenses require complex computations to converge for attack detection and recovery, requiring powerful hardware resources. Therefore, they are not suitable for low-power and real-time systems with constrained resources. In addition, they may not work against a time-varying magnetic spoofing because it may create oscillations between two or more safe states of the system controller, and they are not capable of handling these oscillations in real-time.

Sensor-level defenses: It is believed that no state-of-the-artwork specifically provides a sensor-level defense against a strong magnetic spoofing attack on the Hall sensor.

However, there are a few related works that exist for other sensors that work against low-power unwanted signals (e.g., EMI, noise, etc.). Sensor-level defenses, such as randomized out-of-phase sampling, differential sensing, differential comparator, adaptive filtering, low-pass-filter (LPF)/band-pass-filter (BPF), non-linearity tracing via classifier may work for low-power magnetic fields, still, they may not work against strong magnetic spoofing attacks. Moreover, randomized out-of-phase sampling does not work against constant/non-periodic magnetic fields, whereas this example defense does. Sensor fusion adds extra price and complexity to the system; therefore, designers try to avoid this unless it is arguably required. The defense of this example is believed to be the first that can detect and contain a strong magnetic spoofing of any type, such as constant, sinusoidal, and pulsating magnetic fields, in hard real-time and can keep the connected system running during the attack.

BACKGROUND

Hall in-sensor components: The basic components of a Hall sensor are shown in FIG. 2A. A Hall sensor has a Hall element (i.e., p-type semiconductor), which generates a Hall voltage ($V_{Hall}$) proportional to an input magnetic field, B. A DC voltage bias is applied across the Hall element to energize it. The generated $V_{Hall}$ is given as input to a differential amplifier with a closed-loop feedback and a self-calibration block to reduce the measurement error. However, Hall sensors are still lacking hardware in the sensor domain to prevent magnetic spoofing.

Transfer function: The term $V_{Hall}$ can be +ve or −ve because B can be +ve or −ve (i.e., north/south pole). Therefore, the output of the differential amplifier, denoted by $V_{out}$, can go either +ve or −ve from the null-voltage position. The null-voltage is denoted by $V^{null}$, which is the position of the $V_{out}$ with no input magnetic field (i.e., B=0). Therefore, the transfer function of a typical Hall sensor can be expressed as:

$$V_{out}=(K \times B)+V^{null} \quad (1)$$

where K is a coefficient. The graphical representation of Eqn. 1 shown in FIG. 2B indicates that $V_{out}$ linearly varies with the input B. As mentioned earlier, existing defenses work against weak magnetic spoofing (i.e., $<\sim5$ G), which can vary the output in its linear region, but don't work against strong magnetic spoofing (i.e., $\geq\sim5$ G), which can drive $V_{out}$ close to the saturation voltage, $V_{sat}$.

Passive and Active Hall Sensor

A passive Hall sensor can simply detect magnetic fields coming from the environment, whereas an active Hall sensor transmits a signal to be reflected from a target, with data gathered by the sensor upon their reflection. PyCRA works only with the active sensor. State-of-the-art passive Hall sensors are largely blind that relay signals to the upper level without considering the signal integrity. Therefore, this example defense targets passive hall sensors.

Differential Hall Sensor

The differential Hall sensor is the state-of-the-art Hall sensor in the industry. It is an in-sensor defense. As the present defense is also an in-sensor, the differential Hall sensor's limitations are important to understand one novel aspect of the present example.

A differential Hall sensor has two Hall elements, $D_1$ and $D_2$, placed close to each other (FIG. 4A). Let us assume $D_1$ sees magnetic field $B_1$, and $D_2$ sees magnetic field $B_2$. So, the transfer function of a differential Hall sensor is:

$$V_{out}=K \times (B_1-B_2)+V^{null} \quad (2)$$

where K is a proportionality coefficient. Let us assume an attacker injects an external magnetic field, $B_{atk}$. As $D_1$ and $D_2$ are placed close to each other, they may see the same magnetic field, $B_{atk}$. As a result, Eqn. 2 is changed as follows:

$$V_{out} = K \times \{(B_1 + B_{atk}) - (B_2 + B_{atk})\} + V^{null} = K \times \{(B_1 - B_2)\} + V^{null} \quad (3)$$

The $B_{atk}$ can only be nullified in Eqn. 3 if and only if $D_1$ and $D_2$ can see the same (i.e., common-mode) $B_{atk}$. However, practically speaking, there is always a small physical distance between $D_1$ and $D_2$ for which they may not see the same $B_{atk}$. Because of this mismatch, $B_{atk}$ may not be exactly nullified in Eqn. 3. The mismatch gets worse if the injected magnetic field is strong. At a strong field, the magnetic reluctance of the material present in the tiny distance between $D_1$ and $D_2$ gets increased. The increase of reluctance increases the magnetic field gradient between the $D_1$ and $D_2$. To prove this claim, an experiment is carried on a differential Hall sensor (Part #ACS724) by injecting a weak external magnetic field of 4 G, and a strong magnetic field of 10000 G using a solenoid. The ACS724 typically has $V^{null}$=2.5 V. FIG. 4B shows that 4 G shifts the $V_{out}$ by 0.8 μV, which is negligible, whereas 10000 G adds a large DC offset, denoted by $E^{dc}$, with $V^{null}$. This shifts the $V_{out}$ by 1.113 V upward. This experiment proves that the differential Hall sensor is still vulnerable to a strong magnetic spoofing.

Attack Primitive

We first describe the attack primitive against which the defense of this example works. The components of the attack primitive are:

Noninvasive attack: The attacker targets the Hall sensor and can surreptitiously place his attack tool containing a magnetic source (i.e., electromagnet, EMI, etc.) near the Hall sensor to inject seemingly legitimate but malicious magnetic fields (FIG. 3D). The attacker could be a disgruntled employee, a guest, or it could be an interdiction and is not allowed to access and modify the target Hall sensor. The injected magnetic fields propagate from sensors to upward connected systems and may cause a system shut-down or catastrophic incidents. For example, the attacker can cause an accident by spoofing the ABS's Hall sensors of automotive systems. The attacker can also shut down a weak micro-grid by spoofing the Hall sensors located in a solar inverter.

Injecting any type of magnetic fields: We assume a strong attacker, who can inject any type of magnetic field. Here, we consider constant, sinusoidal, and square pulsating fields because all other patterns can be derived from these three basic fields (i.e., Fourier transformation). Let's denote the magnetic field coming from the original signal being measured by $B_{original}$ and magnetic fields injected by the attacker by $B_{atk}$. The term $B_{atk}$ can be modelled as follows:

$$B_{atk} = \{M_k; \text{ constant field } B_m \sin in\omega t; \quad (4)$$
$$\text{sinusoidal field sgn}(B_m \sin in\omega t); \text{ square pulsating field}$$

where $M_k$ is a constant, $\omega$ is the angular frequency and $B_m$ is the magnitude of the injected magnetic field, and sgn is the signum function. Eqn. 1 can be written after an attack as:

$$V_{out} = \{K \times B_{original}\} + V^{null} + (K \times B_{atk}) \quad (5)$$
$$= V_{original} + V_{atk}$$

Eqn. 5 shows that $V_{out}$ has two components: an original component, $V_{original}$, coming from the $B_{original}$ and an attack component, $V_{atk}$, coming from the injected $B_{atk}$. The results after injecting a $B_{atk}$ into a sinusoidal $V_{original}$ are shown in FIG. 3A-C as a proof-of-concept. The constant $B_{atk}$ adds a DC offset, shifting the $V_{original}$ by 0.02 V. A 2 Hz sinusoidal and pulsating $B_{atk}$ modulates the $V_{original}$ in a sinusoidal and pulsating way, respectively. A solenoid with an Arduino can generate these distinct types of $B_{atk}$.

Penetrating the sensor shield: Hall sensors may or may not be placed inside of a shield. In the presence of shield, the $B_{atk}$ should be strong enough to penetrate the shield first.

Threat Landscape Using Physical Laws

The attacker needs a magnetic source (i.e., electromagnet, EMI, etc.) to generate weak/strong magnetic fields to spoof the Hall sensor in its linear region or drive it close to the saturation region. The strength of the magnetic source, which is quantified by Magneto-Motive Force (MMF), is calculated first to provide a defense (i.e., HALC) against it.

According to the physical laws of Electromagnetism, the required MMF can be calculated by considering the following four points: (i) to overcome the air gap between the Hall sensor and the magnetic source, (ii) to penetrate the shield present around the Hall sensor, (iii) to penetrate the sensor body, and (iv) the sensor types. As the presence of a shield is the most important factor that influences the required MMF to spoof the Hall sensor, at first, we calculate the required MMF with shield and without shield to design a defense against it.

MMF Calculation with a Shield

At first, we introduce the Proposition 1 below to calculate the MMF required with the presence of a shield (FIG. 5A).

Proposition 1. In the presence of a shield, the injected $B_{atk}$ by the attacker should be equal to the magnetic saturation density, $B_{sat}$, of the shield to penetrate the shield. Therefore, the MMF of the magnetic source should be strong enough to generate that amount of $B_{sat}$ (i.e., $B_{atk}=B_{sat}$).

Explanation of Proposition 1: First, we briefly discuss on shield-material. Ferromagnetics are good for shielding as they have high $B_{sat}$. Iron is a common shield-material that has $B_{sat}$ within a range of 6000 G-18000 G. Lets consider a worst-case scenario where iron with the lowest $B_{sat}$ (i.e., 6000 G) is used as a shield around a target Hall sensor. Therefore, according to the Proposition 1, the MMF from the magnetic source should generate at least a $B_{atk}=6000$ G to penetrate the shield. In this worst-case scenario, let's place the magnetic source very close to the Hall sensor to increase its impact. We place the source at 1.1 cm (0.5 cm air gap+0.5 cm thick iron shield+0.1 cm sensor body thickness) far from the Hall sensor. To overcome a 0.5 cm air gap, penetrate a 0.5 cm thick iron shield and 0.1 cm thick Hall sensor with a $B_{atk}$ of 6000 G, in total, 2900 A-t of MMF is required from a magnetic source.

After penetrating a Hall sensor, the proper amount of $B_{atk}$ required to spoof the sensor in its linear region or drive close to its saturation region depends upon sensor types. In this example, we consider 10 Hall sensors from 4 makers with different varieties, namely uni/bipolar, open/close-loop, and differential sensors. We calculate the minimum magnetic fields, denoted by $B_{satMin}$, required to drive these sensors close to saturation using Eqn. 6 and tabulate in Table 1.

$$B_{satMin} = \{(V_{sat}V_{outMax})/S)\} \times C_F \times \text{CMRR} \quad (6)$$

where $V_{outMax}$ is the maximum output voltage before saturation, S is the sensitivity, $C_F$ is the magnetic coupling factor, and CMRR is the short form of common-mode-rejection-ratio of the Hall sensor. The significance of the $B_{satMin}$ is that a $B_{atk}<B_{satMin}$ can spoof the sensor in its linear region, whereas a $B_{atk}>B_{satMin}$ can drive it close to its saturation region.

TABLE 1

Calculation of the Bsat/Min

| Sl. | Makers | Part # | Polarity/Loop | Bsat/Min |
|---|---|---|---|---|
| 1 | Allegro | ACS718MATR-20B | Bi/open | 9 G |
| 2 | Allegro | ACS710KLATR-10B | Bi/open | 150.9 G |
| 3 | Allegro | ACS715ELCTR-20A | Uni/open | 32.43 G |
| 4 | Allegro | ACS724LLCTR-10AU | Uni/open | 550 G |
| 5 | Honeywell | SS49/SS19 | Bi/open | 8 G |
| 6 | Honeywell | SS39ET | Bi/open | 71.42 G |
| 7 | Honeywell | SS490 | Bi/open | 40 G |
| 8 | Texas Ins. | DRV5053OA | Bi/open | 9 G |
| 9 | LEM | LTSR 6-NP | Bi/close | 7 G |
| 10 | LEM | LV 25 P | Bi/close | 10 G |

Conclusion of Proposition 1: As the calculated $B_{atk} \gg B_{satMin}$, a $B_{atk}=6000$ G or 2900 A-t of MMF saturates the Hall sensors even in the presence of a ferromagnetic shield. Here, we choose an iron shield having the lowest amount of $B_{sat}$ (i.e., 6000 G) to propose a worst-case scenario. The reason behind using the lowest amount of $B_{sat}$ in the shield is to calculate the minimum MMF (i.e., 2900 A-t) required to spoof the Hall sensor in the presence of a shield. Please note that ferromagnetics having more than $B_{sat}=6000$ G might be used as shields to protect the sensor. In this case, an MMF>2900 A-t might be required from the magnetic source. This HALC example is designed in such a way that it works against more than 2900 A-t of MMF and provides robust defense against a very strong MMF, which can even penetrate a shield.

5.2 MMF Calculation without a Shield

We introduce the Proposition 2 below to calculate the required MMF without the presence of a shield (FIG. 5B).

Proposition 2. Without the presence of a shield, the $B_{atk}$ injected by the attacker should have an MMF to overcome the air gap present between the Hall sensor and magnetic source and to penetrate the sensor body.

Explanation of Proposition 2: Without the presence of a shield, the injected $B_{atk}$ should only need to penetrate the air gap and sensor body. Air and the sensor body both are paramagnetic materials. Therefore, a weak magnetic field can penetrate them easily. We now consider the lowest $B_{satMin}$ (i.e., 7 G) from Table 1 as $B_{atk}$ and calculate the required MMF to generate this $B_{atk}=7$ G. We place the magnetic source at 0.6 cm (0.5 cm air gap+0.1 cm sensor body thickness) far from the sensor. To overcome a 0.5 cm air gap and a 0.1 cm thick sensor with a $B_{atk}$ of 7 G, in total, ~3.33 A-t of MMF is required from a magnetic source.

Conclusion of Proposition 2: The reason behind using the lowest amount of $B_{satMin}$ from Table 1 is to calculate the minimum MMF (i.e., ~3.33 A-t) against which the HALC needs to be sensitive. We design the HALC in such a way that it is sensitive to even less than ~3.33 A-t (i.e, ~0 A-t) and works against a weak MMF that cannot penetrate a shield.

Hall Spoofing Container (HALC)

This section provides details on the design process of this HALC example by answering the following three questions.

Q1. Is the HALC robust enough to contain all types, such as constant, sinusoidal, and pulsating magnetic fields?

Q2. Can the HALC contain the magnetic spoofing attack in real-time for all types of input magnetic field?

Q3. Can the HALC remove the injected fake magnetic field B, from the original magnetic field $B_{original}$ even if the frequencies of $B_{atk}$ and $B_{original}$ are same?

One core idea behind this HALC example is that its functionality is implemented in two different cores-the analog core and the digital core. The analog core handles computationally expensive tasks, such as different arithmetic operations on signals using first-order circuits, whereas the digital core handles the generation of feedback signals using a novel algorithm. The analog core is implemented in such a way (FIG. 6) that introduces two parallel paths—path b-c-d and path b-e-h, to process inputs. These parallel paths enable faster signal processing with lower computational complexity and do not hamper the existing bit-rate of the connected systems.

Attack modeling: A Hall sensor can measure AC (i.e., time-dependent) and DC (i.e., constant) magnetic fields. Let us define the AC and the DC portions of the original input signal by $V(t)$ and $V^{dc}$, respectively. Therefore, we can write the original input signal, $V_{original}=V(t)+V^{dc}+V^{null}$. Let us assume that the attacker can cause a DC error voltage $E^c$ by injecting a constant magnetic field, a sinusoidal error voltage $E(t)$ by injecting sinusoidal magnetic fields, and a square error voltage $E_s(t)$ by injecting square magnetic fields. Here, we consider an extreme scenario when the attacker injects all three patterns at the same time. Therefore, the attack component in the output voltage of the compromised Hall sensor can be written as, $V_{atk}=E^c+E(t)+E^s(t)$. Moreover, Fourier analysis of the square error voltage, $E^s(t)$ shows that it has a DC portion $E^s$ and a low and high frequency portion $\delta_l(t)$ and $\delta_h(t)$, respectively. Therefore, the $V_{out}$ of the compromised Hall sensor (Eqn. 5) during an attack, while measuring an input can be written as:

$$V_{out} = V_{original} + V_{atk} \quad (7)$$
$$= (V(t) + V^{dc} + V^{null}) + (E^c + E(t) + E^s(t))$$
$$= C_{original} + (E^c + E(t) + E^s + \delta_l(t) + \delta_h(t))$$

From Eqn. 7, it is apparent that $V_{out}$ under attack has two components, namely AC (i.e., time-dependent) component, and DC (i.e. constant) component, $V^{dc}+V^{null}+E^c+E^s$. The generated $V_{out}$ is then fed into node a of the HALC (FIG. 6). The analog and digital cores of the HALC will contain the $V_{atk}$ in the following ways.

(i) Analog core: The analog core removes the high and low frequency attack components, $E(t)+\delta_h(t)+\delta_l(t)$, from the $V_{out}$ using different filtering techniques in path b-o-d.

(i) Digital core: The digital core, present in path b-e-h, removes the DC attack components, $E^c+E^s$, from the $V_{out}$ using a novel algorithm.

The parallel handling of two different tasks in two different paths makes this design faster than the sequential handling of the two tasks. We are going to discuss each core separately in the following sections.

Figures 7, 8:
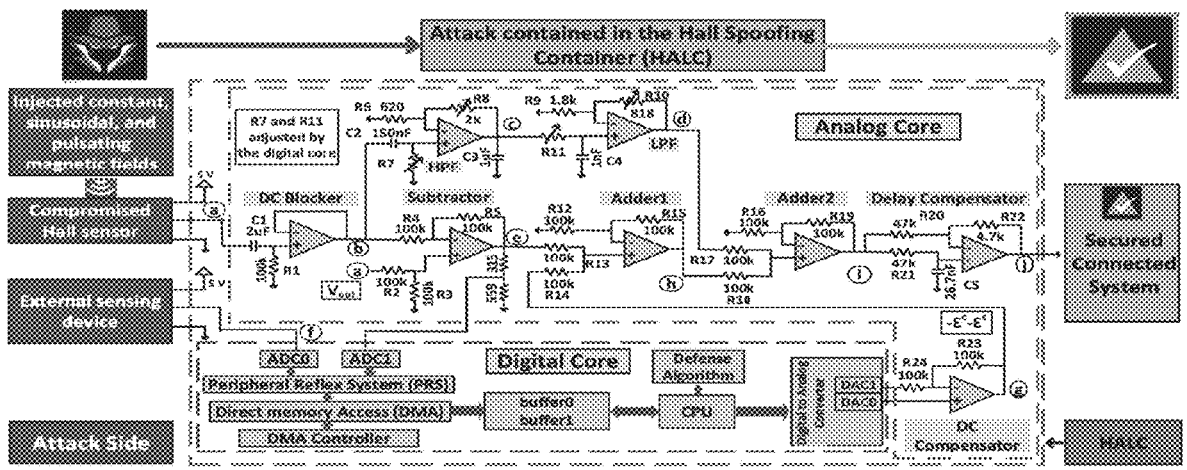
FIG. 7 shows implementation details of the analog and digital cores of an example Hall Spoofing Container (HALC).
FIG. 8 shows an example defense algorithm for a Hall Spoofing Container.

Analog Core: FIG. 6 shows all blocks, and FIG. 7 shows the details of each block of the analog core. At first, we use the DC blocker and subtractor to separate the AC and DC components from $V_{out}$.

DC Blocker: The DC blocker blocks the DC portion, $V^{dc}+V^{null}+E^c+E^s$ of $V_{out}$ and outputs only the high and low frequency AC signals, $V(t)+E(t)+\delta_h(t)+\delta_l(t)$, at node b. It uses a first-order high pass filter, which passes frequencies greater than 0.8 Hz. In other words, it only blocks the DC signals.

Subtractor: The subtractor subtracts the signal of node b from $V_{out}$ and outputs only the DC portion, $V^{dc}+V^{null}+E^c+E^s$ at node e. The signal at node e is the DC portion of $V_{out}$. The subtractor is implemented by using an active differential amplifier.

Next, the low and high frequency AC portion of $V_{out}$ is processed by the high-pass and low-pass filters, and the DC portion of $V_{out}$ is processed by the digital core.

High-Pass Filter (HPF) & Low-Pass Filter (LPF): A first-order active HPF and LPF are used to filter out the low-frequency attack component ($E(t)+\delta_l(t)$) and high-frequency attack component ($\delta_h(t)$) from $V_{out}$, respectively, by keeping the original signal $V(t)$ intact. The cut-off frequencies (i.e., $f_c$) of the HPF and LPF can be adjusted to filter out different low/high frequency attack components by varying the R7 and R11 (see FIG. 7) in our implementation. The digital core adjusts R7 and R11 using digital rheostats (part #MCP4252) to vary the cut-off frequencies of the HPF and LPF within 0-150 kHz. Please note that the gain of the DC blocker, LPF, and HPF is 1 (i.e., unity) and phase-shift is linear (i.e., constant) for all frequencies over fc. Therefore, path b-c-d does not add any non-linearity to original signal Vt in this design.

Figure 11:
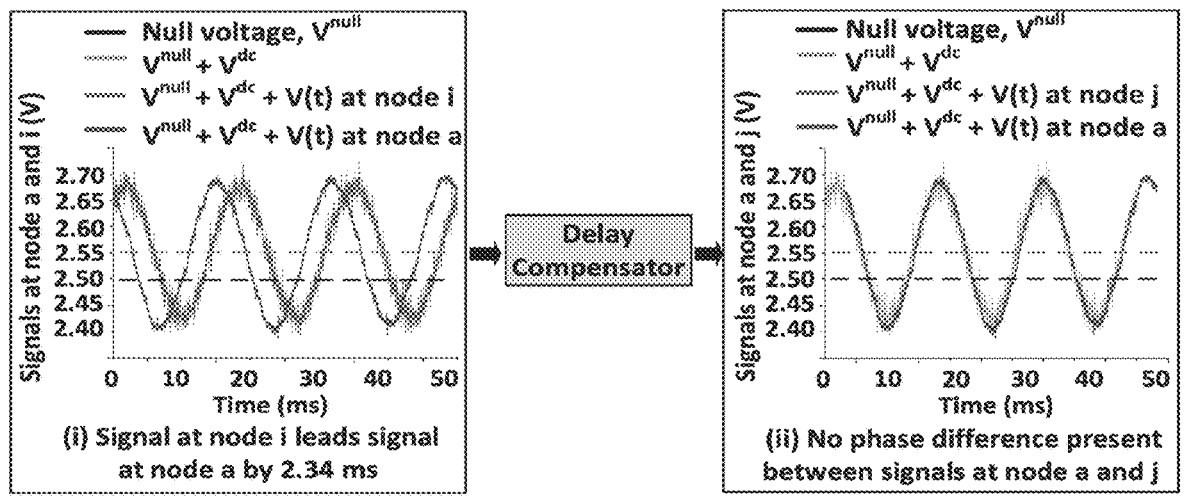
FIG. 11 shows the delay between nodes a and j is compensated.

Delay Compensator: The signal, $V_{out}$ travels from node a to node i through different blocks. These blocks have capacitors and resistors with different values that introduce different phase delays. As a result, the signal at node i is a phase-delayed version of the signal from node a. For example, a 2.34 ms leading phase delay is present between node a and node i of this HALC. This could cause a 2.34 ms delay while taking a time-critical decision by the connected system. To compensate for the phase delay, a delay compensator is placed after node i. The delay compensator is an all-pass filter with a voltage gain, Av=1 at all frequencies and can create a specific phase shift. A lagging phase shift of 50.63° is implemented in our design that is equivalent to 2.34 ms of lagging delay. As a result, the 2.34 ms of leading delay at node i is compensated to zero (See FIG. 11). This ensures that the HALC does not create any timing predictability issue to connected systems and preserves the hard real-time requirement of the overall system.

DC Compensator: The DC compensator is connected with the digital-to-analog-converter (DAC) of the digital core. It converts a signal coming from the digital core to an appropriate feedback signal to nullify the injected DC attack signals $E^c+E^s$. It is implemented using an op-amp and can be used as an inverting and non-inverting amplifier.

Digital Core: The digital core controls the cut-off frequencies of HPF and LPF to remove all low and high frequency AC attack signals from $V_{out}$ while keeping the original AC signal $V_t$ intact. At the same time, it removes the injected DC attack signals $E^c+E^s$ from $V_{out}$ while keeping the original DC signal $V^{dc}$ intact.

External sensing device: As a Hall sensor under attack is a naive device, it cannot alone differentiate the original input magnetic fields from the attacker's provided magnetic fields. The digital core uses an external sensing device (ESD), which helps the compromised Hall sensor by only sensing the presence of the external magnetic fields injected by the attacker. The ESD could be an external coil or another Hall sensor, which should be placed side by side with the compromised Hall sensor.

We know that the ESD is unable to measure the exact amplitude of the magnetic field injected into the compromised Hall sensor because of the physical distance present between the ESD and compromised sensor. This is why we cannot use the signal from the ESD to simply subtract the injected fake magnetic fields from the original signals to recover the original signal (i.e., for the same reason we cannot use the same adaptive filtering technique). However, the ESD only provides the following two pieces of information to the digital core: (i) the attack notification signal, $N_{atk}$, when the attack happens, and (ii) the notification signal, $N_{chng}$, when the injected DC error voltage, $E^c+E^s$ changes. As the ESD can only sense the injected fake signals, the attacker cannot confuse the defense using multiple magnetic sources.

The digital core runs its algorithm in a central processing unit (CPU). To satisfy hard real-time requirements and reduce the energy consumption, the workload of the CPU is shared with the peripheral reflex system (PRS) and direct memory access (DMA) blocks. The PRS and DMA handle the workload related to data movement from peripherals to RAM, whereas the CPU handles the workload related to running the defense algorithm and providing feedback signals to the analog core. The critical blocks of the digital core are described below.

ADC0 and ADC1: Two analog-to-digital converters—ADC0 and ADC1 provide data to the digital core. ADC0 is connected with the ESD and provides the two information coming from the ESD, namely, notification signals $N_{atk}$ and $N_{chng}$ to the defense algorithm 1 (FIG. 8) running in the digital core. At the same time, ADC1 also provides the DC portion, $V^{dc}+V^{null}+E^c+E^s$, of the $V_{out}$ to algorithm 1. To reduce the power consumption, both ADCs use the low sampling frequency (35 kHz) at normal operating conditions (i.e., no attack), but start using the high sampling frequency (900 kHz) when an attack happens.

Central Processing Unit (CPU): The CPU runs the defense algorithm 1 and provides necessary feedback signals to filter out the DC error components, $E^c+E^s$. The proposed defense algorithm is explained here.

Line 1-10: The CPU always checks the data coming from the ESD for the attack notification signal $N_{atk}$ using the ADC0. Let us assume an attack happens at time t. Before any attack (at t−1 time), there is no presence of external spoofing magnetic fields. Therefore, the output of the ESD is zero, which indicates no attack happens (i.e., $N_{atk}$=NO). Moreover, when no attack happens, the data from ADC1 at t−1 is simply equal to $V^{dc}(t-1)+V^{null}(t-1)$ because no DC attack signals are present (i.e., $E^c+E^s$=0). As no DC attack signals are present, the CPU does not need to nullify the DC attack signals $E^c+E^s$. That is why the CPU provides a NULL signal to the DC compensator and the DC compensator provides no feedback signal (i.e., 0 V) at node g.

Line 11-16: However, when the attacker injects magnetic fields at time t, the ESD senses this injection that generates an attack notification signal, $N_{atk}$=YES. The ADC0 and ADC1 increase the sampling frequency from 35 kHz to 900 kHz to capture tiny changes of injected signals. During attack at time t, the data from ADC1 is equal to $V^{dc}(t)+V^{null}(t)+E^c(t)+E^s(t)$. As the DC component of the $V_{original}$ does not change, $V^{dc}(t)+V^{null}(t)$ at time t is equal to the previous value of $V^{dc}(t-1)+V^{null}(t-1)$ at time t−1. As $V^{dc}(t-1)+V^{null}(t-1)$ is known, the injected DC error $E^c(t)+E^s(t)$ can be calculated as shown in line 16.

Line 17-20: If the injected DC error $E^c(t)+E^s(t)$ is positive, the DC compensator is configured as inverting amplifier with a gain of −1 and outputs a feedback signal −($E^c(t)+E^s(t)$) at node g. If $E^c(t)+E^s(t)$ is non-positive, the DC compensator is configured as non-inverting amplifier with a gain of +1 and outputs a feedback signal +($E^c(t)+E^s(t)$) at node g. The adder1 adds signals at node g with signals at node e and nullifies the injected DC error components $E^c(t)+E^s(t)$ from the $V_{out}$ (see FIG. 6).

Line 21-29: After an attack happens at time t, the data from ADC1 may change anytime after time t. Let us assume the data from ADC1 changes at time t+n where n∈{1,2, 3, . . . , ∞}. The change can happen under two scenarios: either the attacker changes the DC components ($E^c+E^s$) of the injected errors, or the DC components ($V^{dc}+V^{null}$) of the $V_{original}$ may change naturally. Under the first scenario, when the attacker changes the DC components of the injected error at time t+n, the ESD outputs a notification signal $N_{chng}$=YES, which is extracted from the ADC0 at t+n. As the DC components of the $V_{original}$ do not change under the first scenario, the previously saved DC components ($V^{dc}(t)+V^{null}(t)$) of the $V_{original}$ at time t must be equal to the most recent DC components ($V^{dc}(t+n)+Vnull(t+n)$) of the $V_{original}$ at time t+n. Therefore, the injected DC errors ($E^c(t+n)+E^s(t+n)$) can be calculated using the data from ADC1 at time t+n shown in line 25. The $E^c(t+n)+E^s(t+n)$ can be similarly used to generate feedback signals already explained in line 17-20.

Line 30-37: Under the second scenario, when the DC component ($V^{dc}+V^{null}$) of the $V_{original}$ changes naturally at time t+n, the ESD outputs a notification signal $N_{chng}$=NO, which is extracted from the ADC0 at t+n. As the DC components of the injected errors do not change under the second scenario, the previously saved DC component ($E^c(t)+E^s(t)$) of the injected errors at time t must be equal to the most recent DC components ($E^c(t+n)+E^s(t+n)$) of the injected errors at time t+n. The calculated $E^c(t+n)+E^s(t+n)$ is similarly utilized to generate feedback signals, which is explained in line 17-20. The DC components ($V^{dc}(t)+V^{null}(t)$) of the $V_{original}$ at time t are updated in line 32 that is used in line 37 to update $V^{dc}(t-1)+V^{null}(t-1)$. The updated $V^{dc}(t-1)+V^{null}(t-1)$ will be used in the next iteration at line 15. In this way, the algorithm nullifies the DC components ($E^c+E^s$) of the injected errors.

Summary and novelty of the defense algorithm: When the ESD gives a notification that an attack happens at time t, the algorithm subtracts the data of original signal at time t from the previous data of original signal at time t−1 (i.e., data before the attack). The difference between the data during the attack and before the attack gives the amount of injected error after the attack. The algorithm tracks this difference all the time and uses the difference to retrieve the original signal. If the injected error signal changes during an attack, the algorithm can also track it from the previously calculated difference. It is noteworthy that the algorithm also tracks when the original signal changes without any attack. This helps to correctly retrieve the original signal with and without attack. In summary, the continuous tracking of the original signal before, after, and during the attack gives information of injected error, and this information is utilized in algorithm 1 to retrieve the original signal from the injected error signal. This idea is absent in the works that exist in the literature/industry.

In lines 21-29 of algorithm 1, two scenarios are considered, change due to attack and change naturally. A question might arise what will happen if a persistent attack coincides with a natural change. The answer lies in the execution time of lines 21-23. Let us denote the time required to execute lines 21-23 is p. Therefore, if the time difference between change due to attack and change naturally is greater than p, the HALC can successfully detect both changes. For example, the time required to execute lines 21-23 is ~3 μs for this prototype. The time difference can be reduced to a lower value using a faster CPU resulting in more robust defense against the error.

Controlling the HPF and LPF: The digital core decides the appropriate cut-off frequencies of the HPF and LPF after sensing the frequency of the injected fake magnetic fields using the ESD. If the injected fake magnetic field has a single frequency (i.e., single tone), the digital core configures the HPF and LPF in such a way that the HPF and LPF jointly act as a band-stop filter, which stops the injected single tone fake signals. If the injected fake magnetic field has multiple frequencies (i.e., multiple tones), the digital core configures the HPF and LPF in such a way that the HPF and LPF jointly act as a band-pass filter, which only passes the original input signal removing the injected fake signals behind. In this way, with the help of the digital core, the HPF and LPF jointly eliminate the AC components of the injected $V_{atk}$ from the $V_{out}$ by keeping the $V_{original}$ intact.

Another concern may arise what will happen if the amplitude and frequency of the injected $V_{atk}$ are same as the $V_{orignal}$. The strength of the HALC is that the novel algorithm 1 running in the digital core can handle this concern in the following way, which other defense techniques cannot. Let us assume the two Hall elements $D_1$ and $D_2$ of a differential Hall sensor see $B_{orignal}$, $B_{atk1}$, and $B_{original2}$, $B_{atk2}$, respectively. The term $B_{atk1}$ is not equal to $B_{atk2}$ as there is a small physical distance present between the two Hall elements $D_1$ and $D_2$. As $V_{original} \propto B_{original}$ and $V_{atk} \propto B_{atk}$ from Eqns. 3 and 5, we can write, $$V_{out} = (V_{original1} - V_{original2}) + V^{null} + (V_{atk1} - V_{atk2}) \qquad (8)$$
$$= 2V_{original1} + V^{null} + E^c$$

where $V_{original1} \approx -V_{original2}$ (i.e., differential input). As the $V_{atk1}$ and $V_{atk2}$ have the same phase and frequency but have different amplitudes, the $(V_{atk1}, V_{atk2})$ results in a DC (i.e., constant) error voltage, $E^c$. The defense algorithm 1 removes the DC error voltage $E^c$ from $V_{out}$.

The terms $V_{atk1}$ and $V_{atk2}$ have the same phase and frequency because the gap present between two Hall elements in a differential Hall sensor is small (e.g., few μm to mm). As the speed of EMI/magnetic field is close to the speed of light (i.e., 3×10⁸ ms⁻¹), the small gap/path difference between two Hall elements results in a negligible phase/frequency difference between $V_{atk1}$ and $V_{atk2}$. Mathematically, phase difference=(2×π×path difference frequency)/speed of light. For example, if the path difference=100 μm, frequency=1 GHz, we get a phase difference ~0 degree. Because of this negligible phase/frequency difference, the $(V_{atk1}-V_{atk2})$ results in a DC (i.e., constant) error voltage.

As the algorithm 1 does not require any amplitude information from the ESD, the HALC does not suffer any voltage shift in the presence of a strong field while the differential sensor does. The HPF and LPF can be dynamically configured to a band-pass/stop filter to filter out the exact attack components. Algorithm 1 can nullify the injected DC error during the natural change of the original input signals. It also can nullify the attack signals, which have the same frequency and amplitude as the original input signals. Moreover, the HALC can contain constant, sinusoidal, and pulsating attack signals in real-time. Reportedly, these ideas are not implemented successfully in the literature and industry until present.

Performance Analysis

Figure 9A:
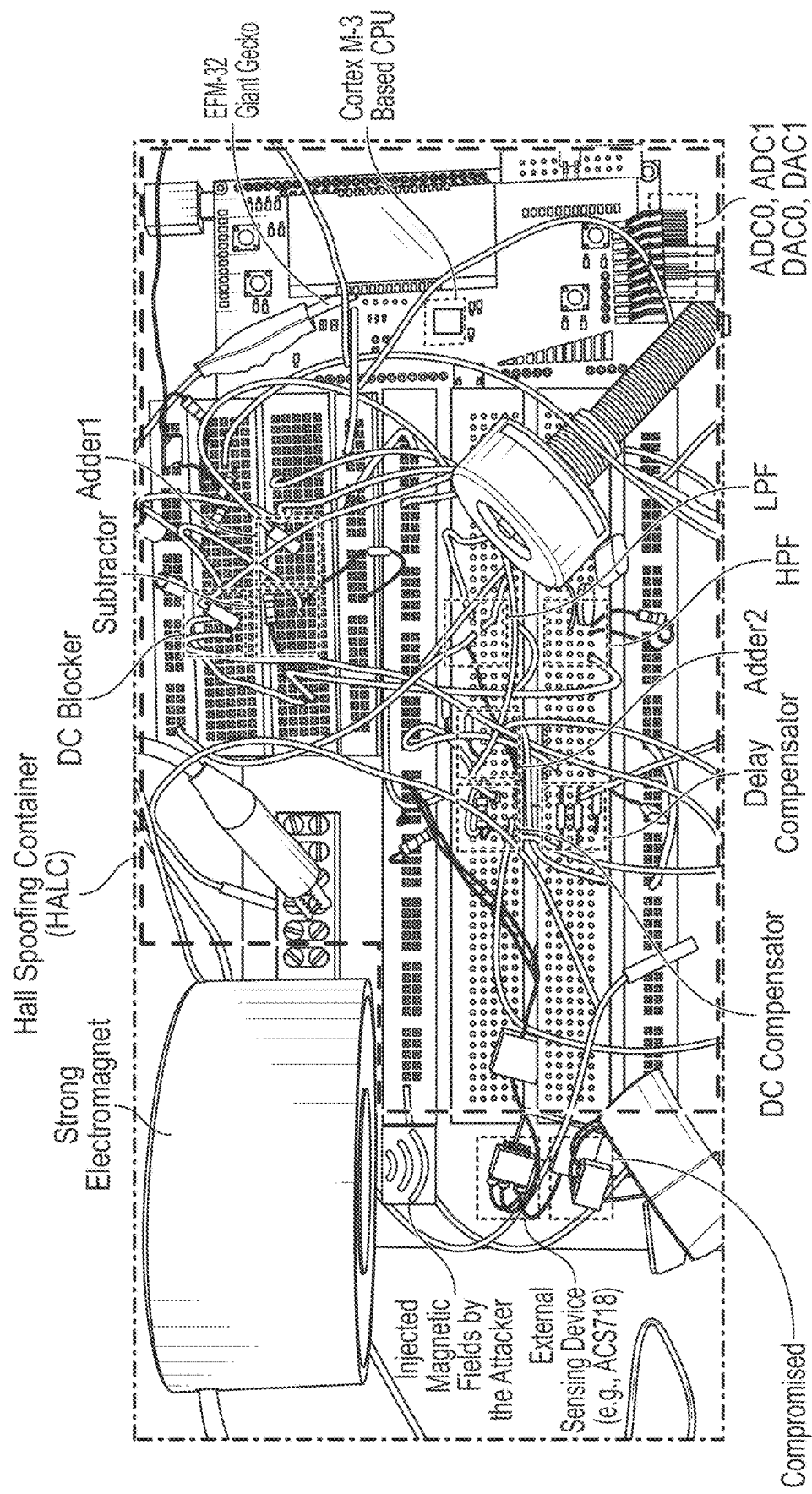
FIG. 9A shows a prototype of the example HALC implemented in the lab.

A prototype of the proposed HALC: A prototype of the proposed HALC is implemented in the lab setup as a proof-of-concept and is shown in FIG. 9A. The DC blocker, subtractor, adder1, adder2, DC compensator, delay compensator, HPF, and LPF of the analog core are implemented using a low-power op-amp (part #TL084CN from Texas Ins.). The TL084CN has a JFET input stage that pro-vides high slew rates, low input bias, and low offset currents. The values of discrete resistors and capacitors of the analog core are shown in FIG. 7. The digital core is implemented in an EFM-32 Giant Gecko board from Silicon Labs that has CortexM-3 based 32-bit CPU with PRS, ADCs, DACs, and DMA. It has an ultra low-power CPU with 48 MHz clock.

Figure 9B:
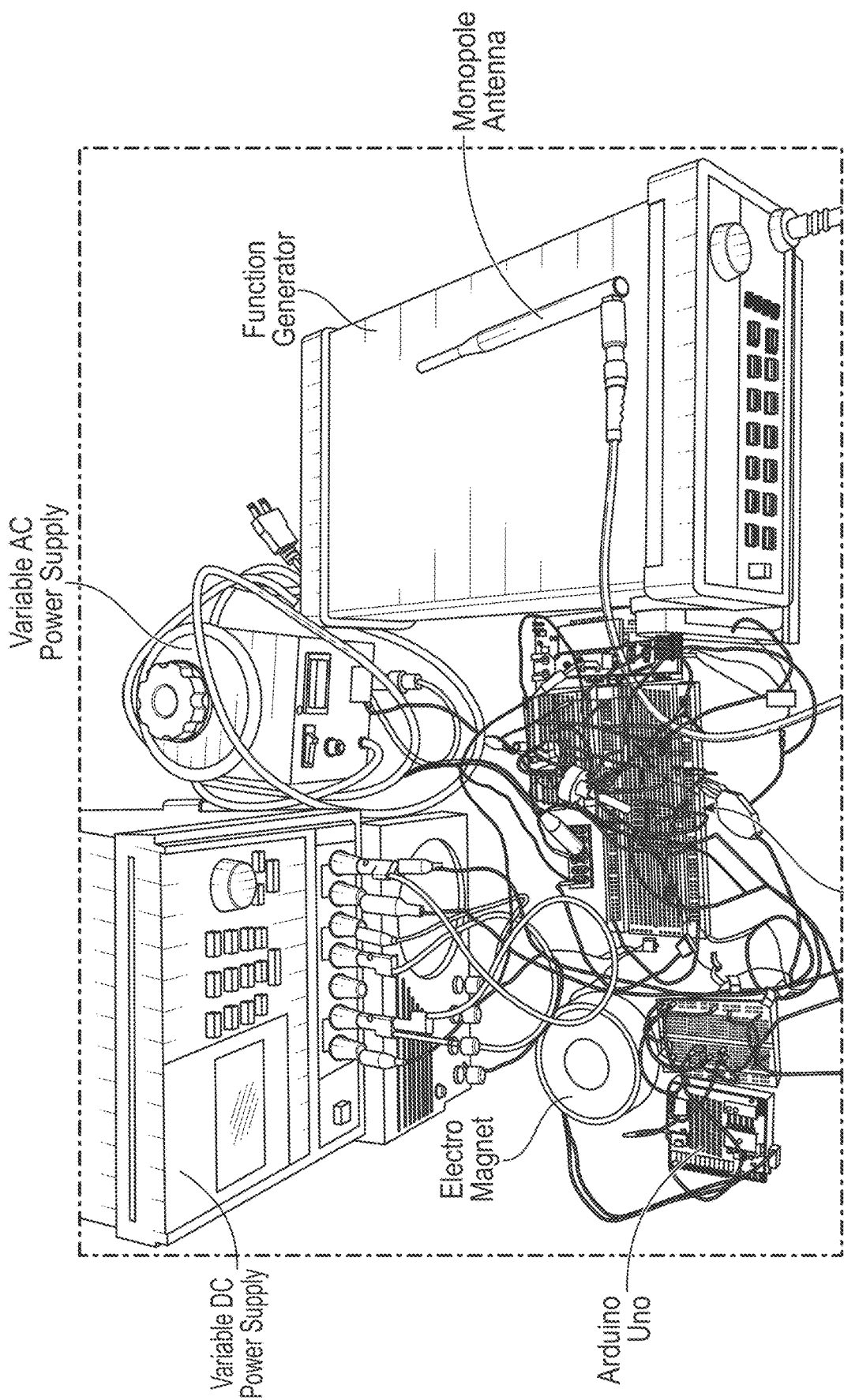
FIG. 9B shows the different types of tools used in the testbed.

Testbed: Different tools used in the testbed are shown in FIG. 9B. We use a Hall sensor (part #ACS718) as the external sensing device (FIG. 9A). We test 10 different Hall sensors (see Table 1) of all types in the testbed. As these sensors require different types of inputs ($S_{in}$), we use different sources to supply input signals to these Hall sensors. We use a variable AC power supply with DC source to supply current/voltage as original input signals to the Hall sensors with serial no. 1-4, and 9-10 of Table 1. We use a permanent magnet to supply magnetic fields as input signals to the Hall sensors with serial no. 5-8 of Table 1. An electromagnet with Arduino Uno, which can generate strong constant, sinusoidal, and pulsating fields, is used as an attack tool in the testbed. In addition, we use a function generator connected with a monopole antenna to radiate high and low frequency EMI signals, which is also used as an attack tool. We can change the power and frequency of the electromagnet and EMI to generate weak and strong magnetic fields with different frequencies.

Figure 10:
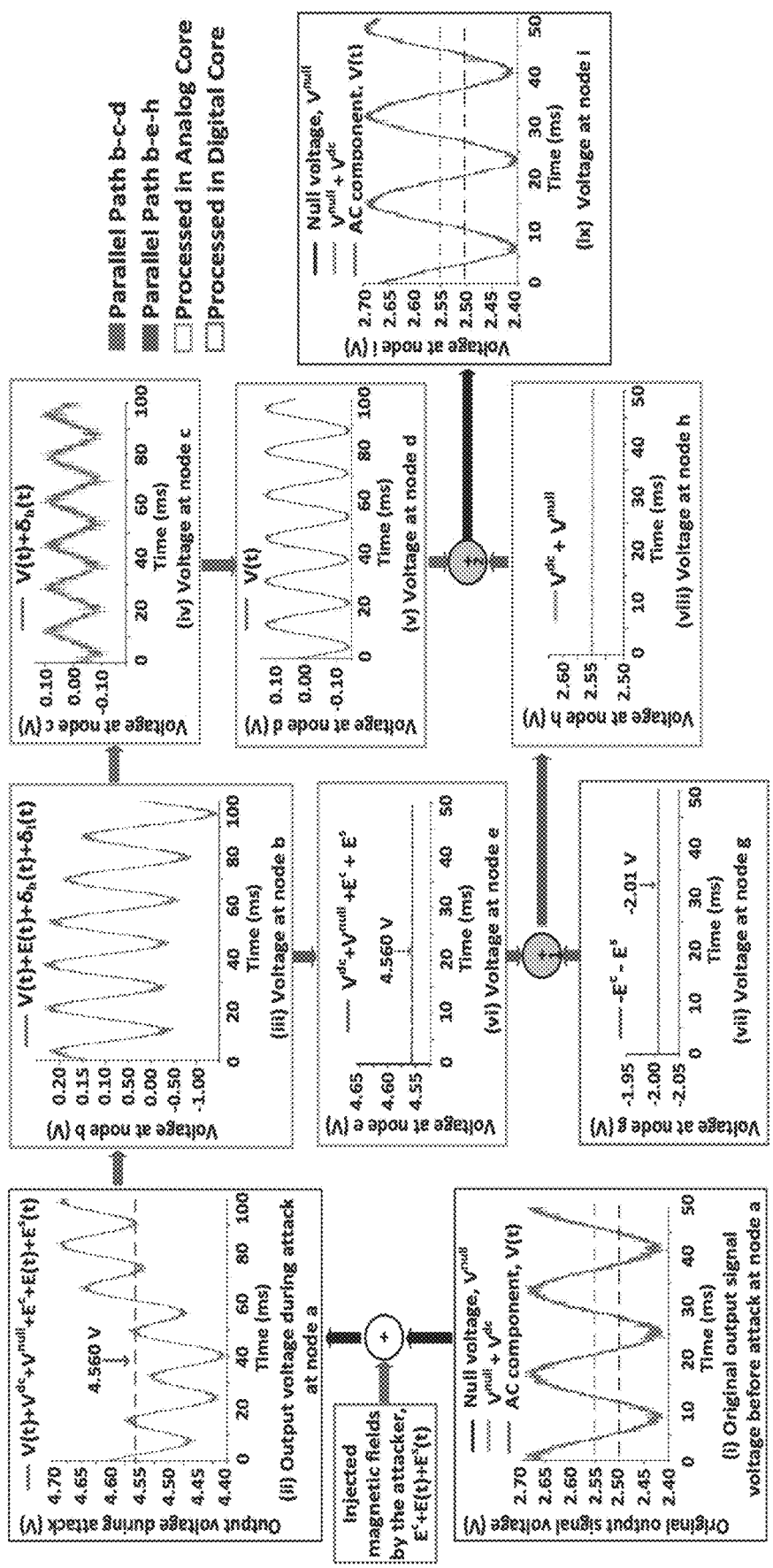

Signal analysis at all nodes of the HALC: We arbitrarily choose ACS718MATR-20B from Table 1 as the target Hall sensor and connect it to the HALC to analyze signals at all of its nodes. A 3 A peak-to-peak AC current of 60 Hz and a 0.5 A DC current are given as input signals (Sin) to the target sensor. Before any attack, the Hall sensor outputs the $V_{original}$ at node a (FIG. 10 (i)). A 300 mV peak-to-peak AC component V(t), 2.5 V of $V^{null}$, and 50 mV of $V^{dc}$ are present in the $V_{original}$ before any attack. An electromagnet with an MMF of 2900 A-t is used to inject constant ($E^c$), sinusoidal (E(t)) and pulsating ($E^s(t)$) external magnetic fields from 1 cm. We use 2 Hz as the frequency of injected E(t) and $E^s(t)$ as an example. FIG. 10 (ii) shows that the output of the Hall sensor at node a is shifted close to its saturation voltage (4.7 V) after the attack. The injection of the AC error, E(t)+$E^s$(t) distorts the $V_{original}$, and the injection of the DC error, $E^c+E^s$ shifts the $V^{null}+V^{dc}$ of the $V_{original}$ from 2.55 V to 4.56 V. The DC blocker blocks only the DC components, $V^{dc}+V^{null}+E^c+E^s$ and outputs the AC components, V (t)+E(t)+$\delta_h$(t)+$\delta_l$(t) at node b (FIG. 10 (iii)).

The signals from node b propagate forward using two paths, namely path b-c-d and path b-e-h. Let us discuss the path b-c-d first. The HPF filters out the injected low-frequency error, E(t)+$\delta_l$(t) and outputs V (t)+$\delta_h$(t) at node c (FIG. 10 (iv)). The LPF filters out the injected high-frequency errors ($\delta_h$(t)) and outputs V (t), which is the AC component of the original input signal, at node d (FIG. 10 (v)).

Now, we discuss the path b-e-h. The subtractor outputs the overall DC components, $V^{dc}+V^{null}+E^c+E^s$, at node e (FIG. 10 (vi)). The value of $V^{dc}+V^{null}+E^c+E^s$ is 4.56 V. As the $V^{null}+V^{dc}$ of the original input signal is shifted from 2.55 V to 4.56 V, a DC error ($E^c+E^s$) of 2.01 V is injected by the attacker. Therefore, the proposed defense algorithm running in the digital core gives a feedback signal ($E^c\ E^s$) of −2.01 V at node g (FIG. 10 (vii)). The adder1 adds signals from node e and node g, and outputs only $V^{dc}+V^{null}$ with a value of 2.55 V at node h. This is shown in FIG. 10 (viii).

The adder2 adds signals from nodes d and h and outputs a delayed version of the $V_{original}$ at node i (FIG. 10 (ix)). A 2.34 ms of leading delay is present between signals at node a and node i (FIG. 11 (i)). A delay compensator compensates for the delay and outputs the $V_{original}$ at node j (FIG. 11 (ii)).

To quantify the similarity between signals before and after an attack, we calculate correlation coefficient (C) between signals of node a and node j. The correlation coefficient (C) indicates the similarity between two signals. The value of C is 0.93 for this case that is very close to unity (i.e., due to the presence of white noise in the signals, C is not unity). This indicates that the signal at node j during an attack is statistically same as the original signal at node a before an attack in a point-by-point fashion. This proves that the HALC can separate $V_{atk}$ from $V_{original}$ and successfully contain the spoofing attack.

Varying the amplitude of the input signals: We vary the amplitude of the input signals (Sin) to 10 different Hall sensors (Table 1) within their entire input range. We keep the frequency of the Sin fixed at 60 Hz/15 Hz. We calculate C for every case and do an average of C for every sensor. The avg. of C is greater than 0.93 when the HALC is used compared to 0.2 when the HALC is not used (Table 2). This indicates that the HALC works within the entire input range of every Hall sensor.

TABLE 2

C for different amplitudes of the input signals

| SI. | Part # | Different amplitudes | Freq. | Avg. C |
|---|---|---|---|---|
| 1 | A0S718 | 1 A, 5 A, 10 A, 15 A, 20 A | 60 Hz | 0.93 |
| 2 | A0S710 | 2 A, 4 A, 6 A, 8 A, 10 A | 60 Hz | 0.93 |
| 0 | ACS715 | 1 A, 5 A, 10 A, 15 A, 20 A | 60 Hz | 0.94 |
| 4 | A0S724 | 2 A, 4 A, 6 A, 8 A, 10 A | 60 Hz | 0.97 |
| 5 | S549ISS19 | 100 G, 200 G, 300 G, 400 G, 500 G | 15 Hz | 0.94 |
| 6 | SS39ET | 100 G, 200 G, 300 G, 400 G, 500 G | 15 Hz | 0.94 |
| 7 | 35490 | 100 G, 200 G, 300 G, 400 G, 500 G | 15 Hz | 0.94 |
| 8 | DRV50530 | 100 G, 200 G, 300 G, 400 G, 500 G | 15 Hz | 0.94 |
| 9 | LTSR6-NP | 1 A, 2 A, 3 A, 4 A, 5 A | 60 Hz | 0.96 |
| 10 | L.V25P | 30 V, 50 V, 70 V, 90 V, 110 V | 60 Hz | 0.96 |

Varying the frequency of the input signals: We vary the frequency of the input signals (Sin) to 10 different Hall sensors (Table 1) within their entire input range. We keep the amplitude of the Sin fixed at 1 A/100 G/110 V. We calculate C for every case and do an average of C for every sensor. The avg. of C is greater than 0.93 for every sensor when the HALC is used compared to 0.2 when the HALC is not used (see Table 3). This indicates that the HALC works within the entire input frequency range of every Hall sensor.

TABLE 3

C for different frequencies of the input signals

| SI. | Part # | Tested frequency range | Amplitude | Avg. C |
|---|---|---|---|---|
| 1 | ACS718 | 0 Hz-40 kHz | 1 A | 0.93 |
| 2 | ACS710 | 0 Hz-120 kHz | 1 A | 0.93 |
| 3 | ACS715 | 0 Hz-80 kHz | 1 A | 0.93 |
| 4 | ACS724 | 0 Hz-120 kHz | 1 A | 0.97 |
| 5 | SS49ISS19 | 0 Hz-30 Hz | 100 G | 0.93 |
| 6 | SS39ET | 0 Hz-40 Hz | 100 G | 0.94 |
| 7 | SS490 | 0 Hz-30 Hz | 100 G | 0.94 |
| 8 | DRV50530 | 0 Hz-20 Hz | 100 G | 0.94 |
| 9 | LTSR6-NP | 0 Hz-100 kHz | 1 A | 0.96 |
| 10 | LV25P | 0 Hz-25 kHz | 110 V | 0.96 |

Figure 12A:
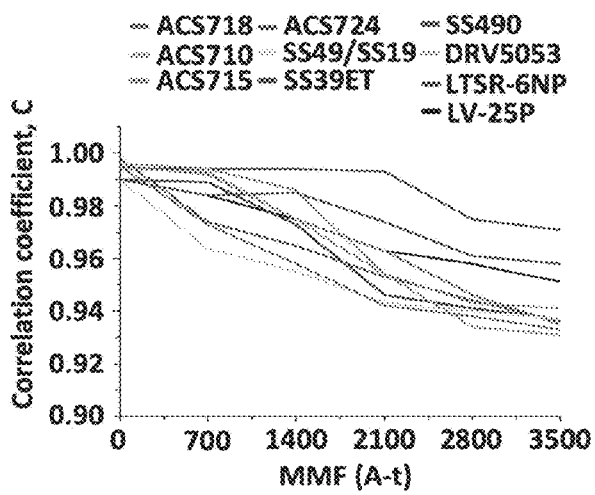
FIG. 12A shows C with varying the MMF of the $B_{atk}$.

Varying the MMF of the $B_k$: Previously, we kept the MMF (i.e., 2900 A-t) and distance (i.e., 1 cm) of the source of $B_{atk}$ (i.e., electromagnet) fixed from the target Hall sensor. In this section, we vary the MMF of the source of $B_{atk}$ from a fixed distance (1 cm) and keep the frequency and amplitude of the input signals ($S_{in}$) fixed at 60 Hz/15 Hz and 1 A/100 G/110 V, respectively. We vary the MMF from 0 A-t to 3500 A-t at freq. zero and calculate C for every case for 10 different Hall sensors (Table 1). The C is less than 0.2 before the HALC is used. However, the C is greater than 0.93 for every sensor (FIG. 12A) when the HALC is used. This proves that the HALC can contain both the weak and strong (i.e., 0-3500 A-t) MMF injected by the attacker satisfactorily.

Figure 12B:
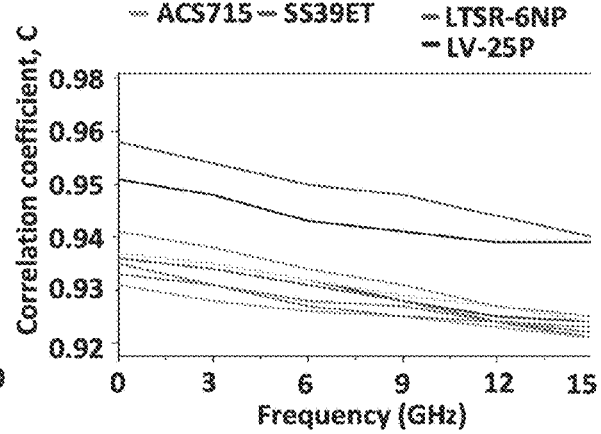
FIG. 12B shows C with varying the frequency of the $B_{atk}$.

Varying the frequency of the $B_{atk}$: At first, we use EMI as the source of injected $B_{atk}$ and vary the frequency of EMI signals from 0 to 150 kHz. We use EMI signals having $B_{atk}$<5 G for weak magnetic spoofing. The avg. value of C is greater than 0.92 when the HALC is used compared to 0.71 when HALC is not used. Next, we use an electromagnet as a source of $B_{atk}$ and vary the sinusoidal and pulsating frequency of the $B_{atk}$ from 0 to 150 kHz using a $B_{atk}$ within 5 G to 9000 G for strong magnetic spoofing. The avg. value of C is greater than 0.92 when the HALC is used. This proves that the HALC can contain both the low and high frequency magnetic spoofing satisfactorily within 0-150 kHz. (FIG. 12B). It is important to note that the range 0-150 kHz covers the entire input frequency range supported by the 10 different Hall sensors from 4 different manufacturers.

Figure 13A:
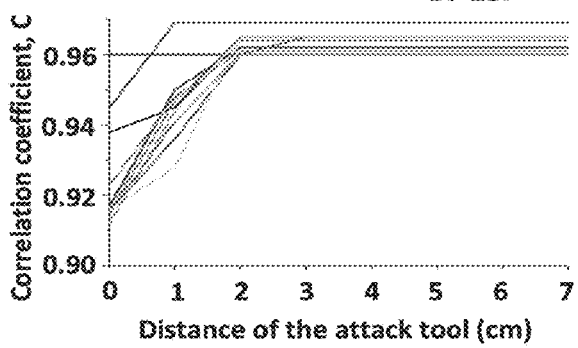
FIG. 13A shows C with distance variation of the attack tool.

Varying the distance of electromagnet: We vary the distance of the electromagnet/EMI source (i.e., attack tool) from the Hall sensor. We use an MMF of 2900 A-t and keep the frequency and amplitude of the input signals ($S_{in}$) fixed at 60 Hz/15 Hz and 1 A/100 G/110 V, respectively. We vary the distance from 0 cm (very dose) to 7 cm with an increment of 1 cm and calculate C for every case for all Hall sensors (Table 1). The value of C is greater than 0.91 for every case (FIG. 13A). This proves that the HALC can contain a magnetic spoofing attack from a very dose distance.

Timing analysis of the analog core: The analog core is typically implemented by using a high-speed op-amp with very high slew rate, low rise-time, and high bandwidth. Therefore, the delay associated with the DC blocker, subtractor, adder1, and adder2 is typically less than 20 μs. The path b-c-d of the analog core comprises HPF and LPF. They introduce a delay in the form of phase shifts at nodes c, and d. The HPF creates a leading phase shift of +72.43 and the LPF creates a lagging phase shift of −21.68. The total phase shift occurs in path b-c-d is +72.43+(−21.68)=+50.74 leading. The +50.74 phase shift is equivalent to 2.36 ms of delay between signals at node a and node d. This 2.34 ms of delay is compensated to zero by using a delay compensator. This preserves the hard real-time requirement of the overall system.

Constant computational complexity: We implement the necessary filters in the analog core using first-order circuits. If these filters were implemented in the digital core using higher-order FIR or IIR digital filters, the CPU would require higher-order operations with a computational complexity. The HALC utilizes the analog and digital cores in such a way that the CPU does not need to handle higher-order arithmetic operations. Instead, it handles first-order tasks that ensure a constant computational complexity of $O(1)$. Moreover, the complexity of the defense algorithm 1 does not grow with the input data, and it remains constant independent of the different input signals/magnetic fields.

Timing analysis of the digital core: Broadly speaking, the digital core of the HALC handles the following four tasks: (i) It samples signals using ADCs, (ii) It transfers sampled data to internal variables using DMAs, (iii) It processes the sampled signals by using proposed defense algorithm, and (iv) It generates feedback signals ($-E_s-E^c$) at node g using DACs. In this section, we calculate the time required to execute each of these tasks by considering the clock cycles required for each of these tasks. Four different clocks are used for the ADCs, DMAs, CPU, and DACs in the digital core. The frequencies of these clocks and the execution-time required for each task are tabulated in Table 4.

TABLE 4

Timing analysis of the digital core

| Task # | Clock name | Clock freq. | Min. time | Max. time |
|---|---|---|---|---|
| Task 1 | ADC clock | 11 MHz | 16 µs | 16 µs |
| Task 2 | DMA clock | 48 MHz | 19 µs | 19 µs |
| Task 3 | CPU clock | 48 MHz | 31 µs | 43 µs |
| Task 4 | DAC clock | 500 kHz | 27 µs | 27 µs |
|  |  |  | 93 µs (total) | 105 µs (total) |

The minimum and maximum execution-time of the tasks 1, 2, and 4 are constant as they don't involve the CPU. The task 3 involves the CPU and requires a minimum execution-time of 31 µs and a maximum execution-time of 43 µs. The CPU requires minimum and maximum time when a minimum and maximum number of cache miss occurs, respectively. The digital core requires a maximum of 105 µs or a minimum of 93 µs in total to generate feedback signals $-(E^s+E^c)$.

Attack containment in hard real-time: It is guaranteed that the digital core will provide feedback signals within a maximum of 105 µs of delay after signal changes at node e. The digital core executes the four tasks sequentially, and there is no task-scheduling involved in the process. Therefore, the delay associated with the digital core is always deterministic. Moreover, the digital core typically handles the low-frequency DC signals, and these signals vary less slowly than the introduced delay/latency by the digital core. Therefore, a 105 µs of delay is negligible compared to the rate of signal change in path b-e-h. In addition, the phase-shift introduced by the analog core is taken care of by the delay compensator. Therefore, the attack is contained in hard real-time inside of the Hall Spoofing Container (HALC).

Figure 13B:
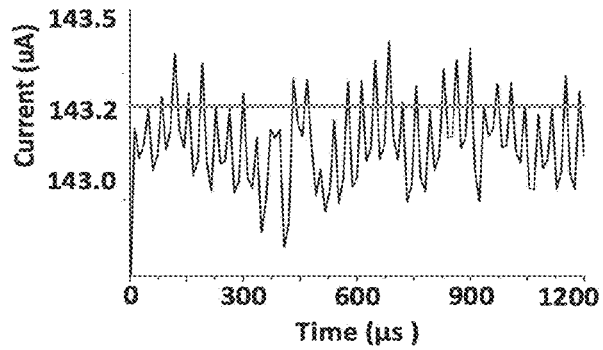
FIG. 13B shows the avg. and inst. current of digital core.

Low-power HALC: The digital core consumes 0.5 mW average power when an attack happens. The power of the digital core is measured using an energy profiler app of the Simplicity Studio IDE. The average and instantaneous current are shown in FIG. 13 (Right). The spike of the instantaneous current occurs during the ADC conversion. When there is no attack, the digital core runs in energy-saving mode with 0.3 mW of average power. The analog core consumes 1.4 mW of average power with/without an attack.

Low-cost HALC and easy to integrate: The HALC uses a cheap ($2) Hall sensor as the ESD. The total cost of the prototype is $12, which is comparable with the sensor cost ($2-$70). However, as $12 is the cost of the prototype, the actual cost will be much less in mass level production using SoC fabrication. The HALC can be connected with the target Hall sensor in a plug-&-play manner after fabricating the HALC in a chip.

Strength of the HALC: Table 5 shows how strong the HALC is compared to recent works. The recent works can prevent up to a $B_{atk} \approx 5$ G; whereas, the HALC is tested up to a $B_{atk} \approx 9000$ G (i.e., MMF=3500 A-t) in the testbed for 0-150 kHz injected $B_{atk}$ (Table 5). However, an attacker can generate an MMF >3500 A-t using a strong magnet present in large devices, such as an MRI machine, which can generate an MMF of 6000 A-t (i.e., $B_{atk}$=15000 G). We mathematically show that if we combine the HALC with a shield around the Hall sensor, we can even prevent the MMF coming from a strong MRI machine. Moreover, the recent works fail to contain certain frequencies; however the HALC works for 0-150 kHz signals of any strength (weak/strong).

TABLE 5

Strength of the HALC.

| Injected $B_{atk}$ | Recent works | HALC |
|---|---|---|
| $B_{atk} < 5$ G | Yes | Yes |
| 5 G < $B_{atk}$ < 9000 G | No | Yes |
| Constant, sinusoidal, and square magnetic spoofing | No | Yes |
| 0 ≤ frequency ≤ 150 kHz | No | Yes |

Evaluation of the HALC: We have evaluated the performance of the HALC in two practical systems: a grid-tied solar inverter and a rotation-per-minute (RPM) measurement system.

Figure 14:
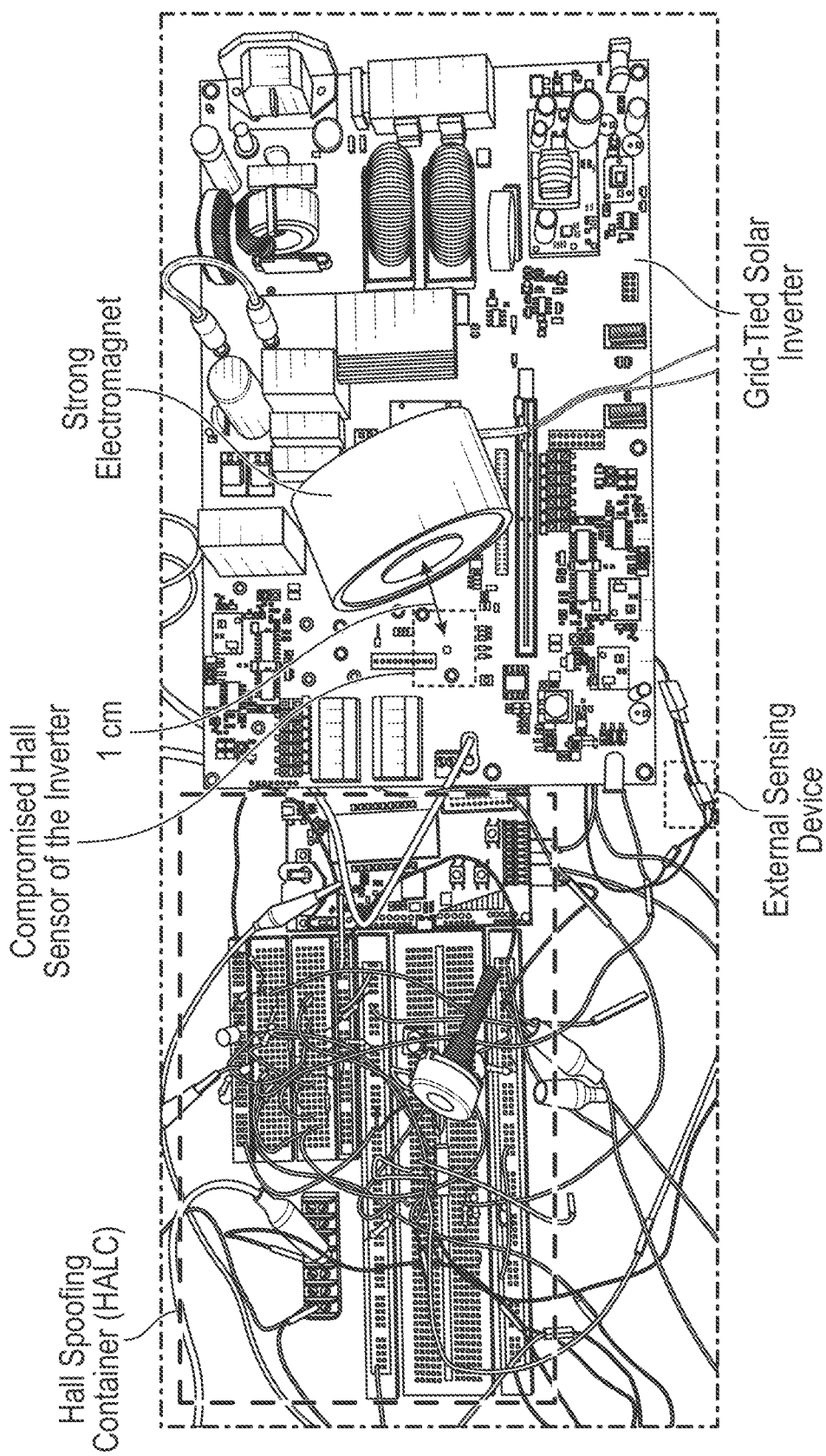
FIG. 14 shows that the HALC can prevent the strong magnetic spoofing attack on the grid-tied solar inverter.

Grid-tied solar inverter Grid-tied solar inverters are typically used as central inverters in solar/industrial plants or shopping malls. They widely use Hall sensors to measure AC and DC current. A 140 Watt inverter from Texas Inst., which is a miniature version of a practical inverter, is used in the testbed to evaluate the HALC. This inverter has a Hall effect current sensor with a part #ACS712ELCTR-20A-T. At first, we use the attack tool to inject constant, sinusoidal, and pulsating magnetic fields with an MMF of 2900 A-t into the Hall sensor from a 1 cm distance. This drives the Hall sensor close to saturation and forces the inverter to shut down, causing a denial-of-service attack. Next, we connect the HALC with the Hall sensor and repeat the same experiment (FIG. 14). At this time, nothing happens to the inverter, and it continues working without any disruption. This proves the efficacy of the HALC against the magnetic spoofing attack.

Figure 15:
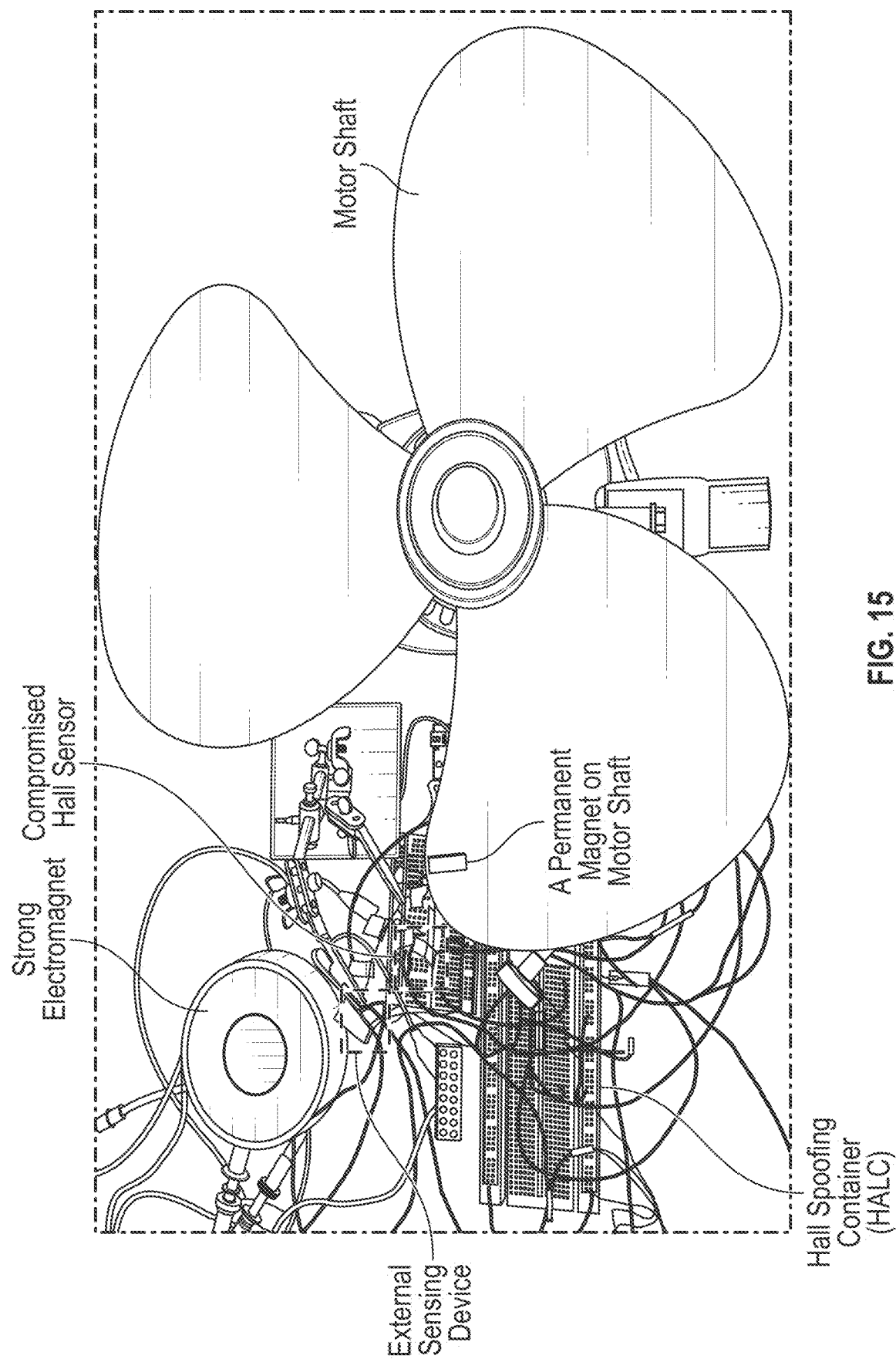
FIG. 15 shows the HALC connected with the Hall sensor of the RPM system to prevent magnetic spoofing.

Rotation-per-minute (RPM) system: The RPM system is used in ICSs to measure the rotational speed of any rotating structure, such as a motor shaft, wheel. We use a motor shaft in the testbed with a Hall sensor having part #SS490. A small permanent magnet (part #HE510-ND) is mounted on the motor shaft. When the motor shaft rotates, the permanent magnet also rotates. The Hall sensor can sense the change of magnetic fields coming from the motor shaft (i.e., permanent magnet) and use this information to count rotations of the motor shaft. At first, we provide a 100 RPM speed to the motor shaft. Then we inject magnetic fields with an MMF of 2900 A-t from 1 cm distance into the Hall sensor. As a result, the Hall sensor cannot measure the number of rotations correctly. Next, we connect the HALC with the Hall sensor and repeat the same experiment. In this time, the Hall sensor starts measuring the RPM correctly without any error (FIG. 15). It is important to note that 100 RPM is equivalent to 1.67 Hz. This proves that the HALC can eliminate the low-frequency $B_{atk}$. This proves the efficacy of the HALC against the magnetic spoofing attack.

Limitations: There are a few limitations of this particular example HALC. These limitations exist because of the limitations of the practical hardware.

Non-zero settling time of rheostat: The digital rheostats R7 and R11 used in the design has non-zero settling time. We use MSP4252 to implement rheostats R7 and R11 in this prototype. MSP4252 has an SPI interface that supports 10 MHz clock. The total time required to calculate the values of R7 and R11 and write these values to the MSP4252 chip using a 10 MHz SPI port, is ~3.5 μs. The time required to settle down the wiper of the digital rheostat is ~240 μs. Therefore, the total settling time of the rheostat is 240+3.5=243.5 μs in this prototype. If the attacker changes the injected magnetic fields within 243 μs, the timeliness of the defense will not be guaranteed. The settling time of the rheostat results from its parasitic capacitance. Therefore, the settling time can be reduced from 243 μs to a lower value using rheostat having lower parasitic capacitance, which can be achieved using JFETs instead of traditional MOSFETs in rheostat.

Upper limit MMF of $B_{atk}$: The prototype of the HALC can work up to an MMF of ~3500 A-t. The upper limit ~3500 A-t originates from the DC compensator, which cannot provide the feedback signal–($E^c+E^s$) more than the supply voltage (i.e., 5 V). By increasing the supply voltage from 5 V to a higher value, the upper limit MMF of the $B_{atk}$ can be increased.

Upper limit frequency of $B_{atk}$: The prototype of the HALC can prevent a $B_{atk}$ with frequencies 0 Hz to 150 kHz. The upper limit 150 kHz can be increased beyond 150 kHz by increasing the maximum upper limits of rheostats R7 and R11. To increase the maximum upper limits of rheostats, multiple digital rheostats can be connected in series in the HALC.

Conclusion: We have presented an example HALC, a defense against a weak and strong magnetic spoofing attack on Hall sensors. This HALC can not only detect but also contain the weak and strong magnetic spoofing of different types, such as constant, sinusoidal, and pulsating fields, in hard real-time. The HALC utilizes the analog and digital cores to achieve a constant computational complexity O(1) and keep the existing data processing speed of the connected system undisturbed. We have done extensive analysis of the HALC through more than 150 experiments on 10 different Hall sensors from 4 different manufacturers and proved its efficacy against the magnetic spoofing attack. We have demonstrated that this proposed defense is low-power and low-cost, and can be implemented in the sensor hardware domain. Moreover, we have evaluated the effectiveness of the HALC in two practical systems. The results from these experiments prove that the HALC can accurately and reliably detect and mitigate the magnetic spoofing attack in hard real-time. To the best of our knowledge, the HALC is the first of its kind that can provide defense against a weak/strong magnetic spoofing on the Hall sensor. Finally, we believe that the HALC has the potential to be adopted for other passive sensors in general to protect them from a spoofing attack.

Generation of magnetic fields: Generation of a constant magnetic field: We use a permanent magnet (part #H33) having 10900 G of B and a solenoid having 100 turns and 3 cm radius with variable DC power supply to generate a constant magnetic field.

Figure 16A:
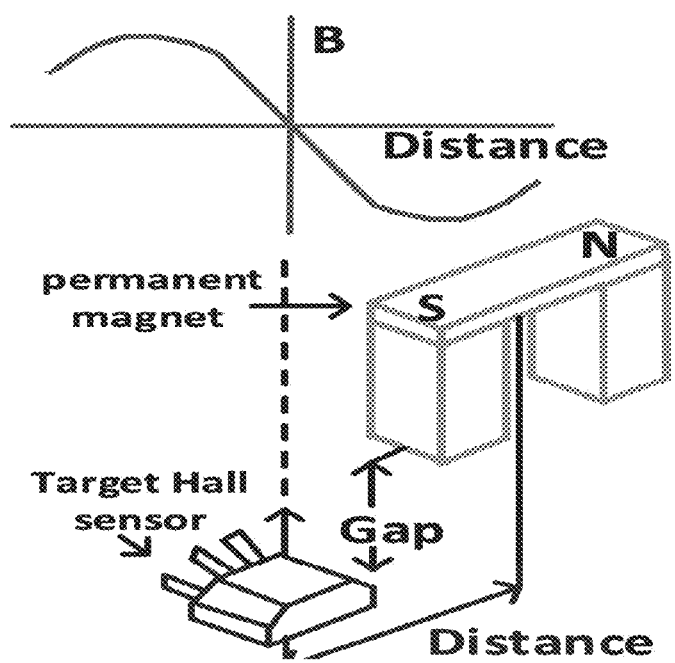
FIG. 16A shows a specially crafted structure to generate sinusoidal MMF using two permanent magnets.

Generation of a sinusoidal magnetic field: A sinusoidal magnetic field variation (Bm sin wt) can be created by two ways. The first way is to use two magnets crafted in a particular way that is shown in FIG. 16A. In our experiment, this magnet pair is crafted using two permanent magnets (part #H33) having 10900 G magnetic field density. We slide this magnet pair from left to right from 3 cm distance peri-odically to generate a sinusoidal magnetic field. The angular frequency (ω) of this sinusoidal magnetic field is equal to the sliding rate of the magnet pair moving from left to right.

Figure 16B:
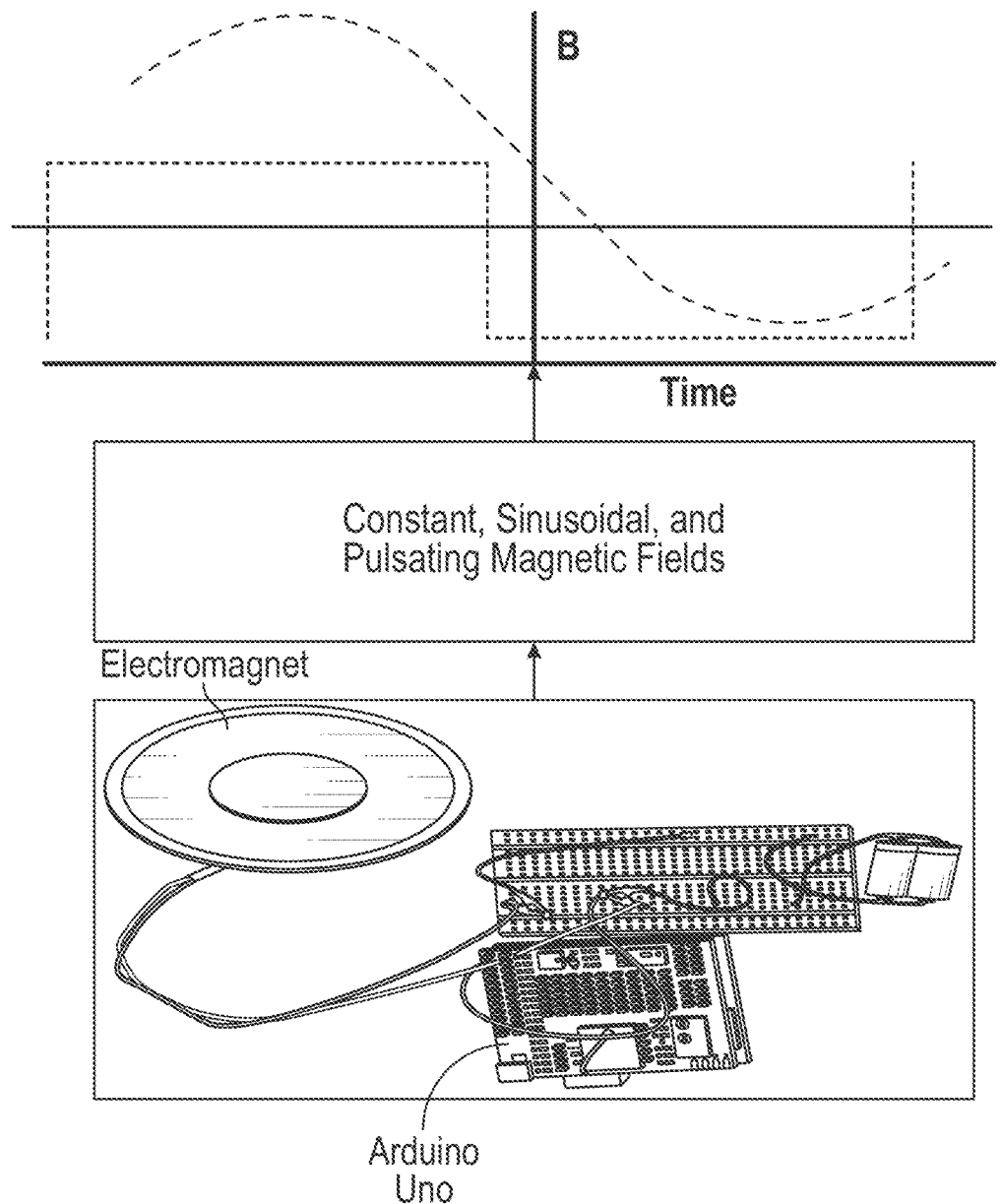
FIG. 16B shows that an electromagnet with Arduino control can generate constant, sinusoidal, and pulsating MMF.

The second way is to use an electromagnet. We sinusoidally vary the input voltage to the electromagnet by using the pulse-width-modulation technique. We use an electronic switch MOSFET (part #P7N20E) with an Arduino control to switch an electromagnet (part #WF-P80/38) (FIG. 16B).

Generation of a square pulsating magnetic field: A square pulsating magnetic field variation (sgn($B_m$ sin ωt) can be created by switching an electromagnet on/off periodically. In our experiment, we use an electronic switch MOSFET (part #P7N20E) to switch an electromagnet (part #WF-P80/38) on/off to generate a square pulsating magnetic field FIG. 16B. The angular frequency (ω) of the injected square pulsating magnetic field is calculated from the switching rate of the electromagnet.

Figure 17A:
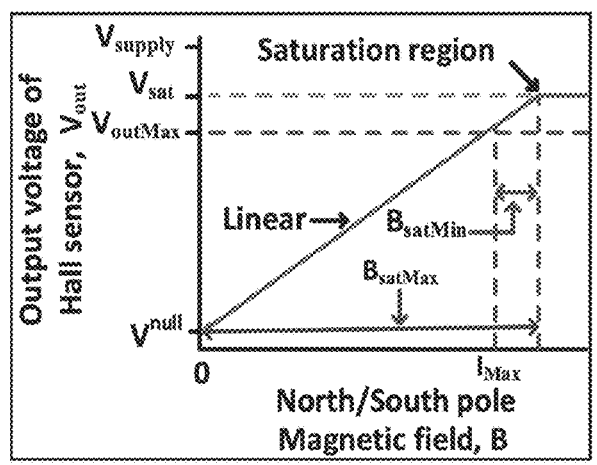
FIG. 17A shows the transfer function of a unipolar Hall sensor.
Figure 17B:
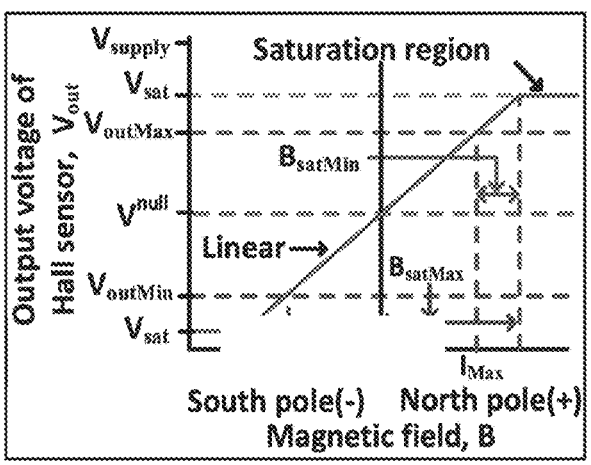
FIG. 17B shows the transfer function of a bipolar Hall sensor.

Calculation of $B_{satMin}$ and $B_{satMax}$: Example 1—ACS718: ACS718MATR-20B is a bipolar Hall effect current sensor. It can measure current from $I_{min}=-20$ A to Imax=+20 A. Its saturation voltage, $V_{sat}=4.7$ V (FIG. 17B) and $V^{null}=2.5$ V. It has a sensitivity (S) of 100 mV/A. The sensitivity means that the $V_{out}$ changes 100 mV for a 1 A of input current change. If the Hall sensor is measuring the maximum current, Imax=+20 A, the maximum output voltage, $V_{outMax}$ of the Hall sensor is calculated as:

$$V_{outMax}=(S \times I_{max})+V^{null}=4.5\ V \qquad (9)$$

Similarly, if the Hall sensor is measuring a zero input current, the output voltage, $V_{out}$ is equal to $V^{null}$. The attacker needs a minimum external magnetic field, $B_{satMin}$, to drive $V_{outMax}$ to $V_{sat}$. In contrast, the attacker needs a maximum external magnetic field, $B_{satMax}$, to drive $V^{null}$ to $V_{sat}$. The terms $B_{satMax}$ and $B_{satMin}$ are calculated as follows:

$$B_{satMax}=\{(V_{sat}-V^{null})/S\} \times C_F \times CMRR=99G$$

$$B_{satMin}=\{(V_{sat}-V_{outMax})/S\} \times C_F \times CMRR=9G \qquad (10)$$

TABLE 6

External magnetic field required to drive Hall sensors close to the saturation region: $V_{supply}=5$ V

| Sl. | Manufacturer | Part # | Polarity/Loop | S |
|---|---|---|---|---|
| 1 | Allegro | ACS718MA1R-20B | Bipolar/Open | 100 mv/A |
| 2 | Allegro | ACS710KLATR-10BB | Bipolar/Open | 85 mv/A |
| 3 | Allegro | ACS715ELCTR-20A | Unipolar/Open | 185 mv/A |

TABLE 6-continued

External magnetic field required to drive Hall sensors close to the saturation region: $V_{supply} = 5$ V

| 4 | Allegro | ACS724LLCTR-10AU | Unipolar/Open | 400 mv/A |
| 5 | Honeywell | SS49/SS19 | Bipolar/Open | 0.9 mV/G |
| 6 | Honeywell | SS39ET | Bipolar/Open | 1.4 mV/G |
| 7 | Honeywell | SS490 | Bipolar/Open | 5 mV/G |
| 8 | Texas Ins. | DRV5053OA | Bipolar/Open | 1.1 mV/G |
| 9 | LEM | LTSR 6-NP | Bipolar/Closed | 104 mV/A |
| 10 | LEM | LV 25 P | Bipolar/Closed | NA |

| Sl. | $C_F$ | $V^{null}$ | $V_{sat}$ | CMRR | $B_{satMin}$ | $B_{satMax}$ |
| --- | --- | --- | --- | --- | --- | --- |
| 1 | 4.5 G/A | 2.5 V | 4.7 V | 1 | 9 G | 99 G |
| 2 | 9.5 G/A | 2.5 V | 4.7 V | 1 | 150.9 G | 245.9 G |
| 3 | 12 G/A | 0.5 V | 4.7 V | 1 | 32.43 G | 272.4 G |
| 4 | 11 G/A | 0.5 V | 4.7 V | 100 | 550 G | 11550 G |
| 5 | 1 | 2 V | 3.0 V | 1 | 8 G | 1111 G |
| 6 | 1 | 2.5 V | 4.0 V | 1 | 71.42 G | 1071.4 G |
| 7 | 1 | 2.5 V | 4.8 V | 1 | 40 G | 460 G |
| 8 | 1 | 1 V | 1.8 V | 1 | 9 G | 727.2 G |
| 9 | NA | 2.5 V | 4.5 V | 1 | 7 G | 370 G |
| 10 | NA | 2.5 V | 4.5 V | 1 | 10 G | 290 G | where CF is magnetic coupling factor and CMRR is the short form of common-mode-rejection-ratio. The CF means how much magnetic fields are coupled into the Hall element for 1 A current. CMRR means how much common-mode noise can be rejected from the original signal.

Example 2—SS49: SS49 is our second example that demonstrates the calculation of the $B_{satMin}$ and $B_{satMax}$ in the right two columns of Table 6. The IC SS49 is a Hall proximity sensor, which is used in pump controlling system, magnetic code reading utility, position sensing in infusion pumps, etc. As SS49 directly measures magnetic field, the magnetic coupling factor, CF is 1 for SS49. The terms S, $V^{null}$, and $V_{sat}$ are given in its datasheet. There is no information on the $V_{outMax}$ of the SS49 in its datasheet. Therefore, we have done experiment to calculate the $V_{outMax}$. We get ~2.998 V as the value of $V_{outMax}$ and from Eqn. 10, $B_{satMin}$ is calculated as ~8 G. The term $B_{satMax}$ can be similarly calculated from Eqn. 10 as S, $V^{null}$, and $V_{sat}$ are known from the datasheet.

Example 3—LTSR6-NP: LTSR 6-NP is our third example that demonstrates the calculation of the $B_{satMin}$ and $B_{satMax}$ in the right two columns of Table 6. As its value of $C_F$ is not available in the datasheet, its $B_{satMin}$ and $B_{satMax}$ are calculated by experiments. An electromagnet is used to generate external magnetic field to drive $V_{outMax}$ to $V_{sat}$ and the amount of magnetic field needed for this is the $B_{satMin}$. Again, an electromagnet is used to generate external magnetic field to drive $V^{null}$ to $V_{sat}$ and the amount of magnetic field needed for this is the $B_{satMax}$.

MMF to overcome a 0.5 cm air gap with a 6000 G: We want to calculate the MMF required to overcome a 0.5 cm air gap with a 6000 G of magnetic field density. Here the given values are: B=6000 G, air gap length l=0.5 cm, and the magnetic permeability of air $\mu_o = 4\pi \times 10^{-7}$, $\mu_r = 1$. We can write:

$$H = \frac{B}{\mu_o} = \frac{6000 \text{ G}}{4\pi \times 10^{-7}} = \frac{0.6 \text{ T}}{4\pi \times 10^{-7}} = 477464.82 \text{ A-t/m} \quad (11)$$

$MMF = H \times l = 477464.82$ A-t/m $\times 0.5$ cm =

477464.82 A-t/m $\times 0.005$ m = 2387.32 A-t

MMF to saturate a 0.5 cm thick steel shield with a 6000 G: We want to calculate the MMF required to saturate a 0.5 cm thick steel shield with a 6000 G of magnetic field density. Here the given values are: B=6000 G, thickness of the steel shield l=0.5 cm, the relative magnetic permeability of carbon steel $\mu_r = 1000$, and the magnetic permeability of air $\mu_o = 4\pi \times 10^{-7}$. We can write:

$$H = \frac{B}{\mu_o \mu_r} = \frac{6000 \text{ G}}{4\pi \times 10^{-7} \times 1000} = \frac{0.6 \text{ T}}{4\pi \times 10^{-7} \times 1000} = 477.46 \text{ A-t/m} \quad (12)$$

$MMF = H \times l =$ 477.464 A-t/m $\times 0.5$ cm = 477.46 A-t/m $\times 0.005$ m = 2.38 A-t MMF to penetrate a 0.1 cm thick Hall sensor with a 6000 G: We want to calculate the MMF required to penetrate a 0.1 cm thick Hall sensor with a 6000 G of magnetic field density. Here the given values are: B=6000 G, thickness of the Hall sensor l=0.1 cm, the relative magnetic permeability of Hall sensor $\mu_r = \sim 1$, and the magnetic permeability of air $\mu_o = 4\pi \times 10^{-7}$. We can write:

$$H = \frac{B}{\mu_o \mu_r} = \frac{6000 \text{ G}}{4\pi \times 10^{-7} \times 1} = \frac{0.6 \text{ T}}{4\pi \times 10^{-7} \times 1} = 477464.82 \text{ A-t/m} \quad (13)$$

$MMF = H \times l = 477464.82$ A-t/m $\times 0.1$ cm =

477464.82 A-t/m $\times 0.001$ m = 477.46 A-t

MMF to overcome a 0.5 cm air gap with a 7 G: We want to calculate the MMF required to overcome a 0.5 cm air gap with a 7 G of magnetic field density. Here the given values are: B=7 G, air gap length l=0.5 cm, and the magnetic permeability of air $\mu_o = 4\pi \times 10^{-7}$, $\mu_r = 1$. We can write:

$$H = \frac{B}{\mu_o} = \frac{7 \text{ G}}{4\pi \times 10^{-7}} = \frac{0.0007 \text{ T}}{4\pi \times 10^{-7}} = 557.04 \text{ A-t/m} \quad (14)$$

$MMF = H \times l = 557.04$ A-t/m $\times 0.5$ cm =

477464.82 A-t/m $\times 0.005$ m = 2.78 A-t

MMF to penetrate a 0.1 cm thick Hall sensor with a 7 G: We want to calculate the MMF required to penetrate a 0.1 cm thick Hall sensor with a 7 G of magnetic field density. Here the given values are: B=7 G, thickness of the Hall sensor l=0.1 cm, the relative magnetic permeability of Hall sensor $\mu_r = \sim 1$, and the magnetic permeability of air $\mu_o = 4\pi \times 10^{-7}$. We can write:

$$H = \frac{B}{\mu_o \mu_r} = \frac{7 \text{ G}}{4\pi \times 10^{-7} \times 1} = \frac{0.0007 \text{ T}}{4\pi \times 10^{-7} \times 1} = 557.04 \text{ A-t/m} \quad (15)$$

$MMF = H \times l =$ 557.04 A-t/m $\times 0.1$ cm = 557.04 A-t/m $\times 0.001$ m = 0.56 A-t Preventing MMF coming from MRI: A 1.5 T MRI machine has a B=1.5 T=15000 G. To penetrate an air-gap of 0.5 cm the MMF required from the MRI machine can be calculated to be:

$$H = \frac{B}{\mu_o \mu_r} = \frac{15000 \text{ G}}{4\pi \times 10^{-7} \times 1} = \frac{1.5 \text{ T}}{4\pi \times 10^{-7} \times 1} = 1193662.07 \text{ A-t/m} \quad (16)$$

$$MMF = H \times l = 1193662.07 \text{ A-t/m} \times 0.5 \text{ cm} =$$

$$1193662.07 \text{ A-t/m} \times 0.005 \text{ m} = 5968.31 \text{ A-t}$$

If we consider a shield having a magnetic saturation density, $B_{sat}=15000$ G, with a thickness, l=3 cm and $\mu_r=15$, the MMF required to penetrate this shield can be calculated as:

$$H = \frac{B}{\mu_o \mu_r} = \frac{15000 \text{ G}}{4\pi \times 10^{-7} \times 15} = \frac{1.5 \text{ T}}{4\pi \times 10^{-7} \times 15} = 79577.47 \text{ A-t/m} \quad (17)$$

$$MMF = H \times l = 79577.47 \text{ A-t/m} \times 3.5 \text{ cm} =$$

$$79577.47 \text{ A-t/m} \times 0.035 \text{ m} = 2785.21 \text{ A-t}$$

Therefore, 2785.21 A-t of MMF coming from the MRI machine will be used to penetrate the shield. The remaining MMF=5968.31-2785.21=3183.09 A-t will be prevented by the HALC.

External sensing device: Let us elaborate on how the external sensing device (ESD) works. Let us consider a scenario of Hall current sensor in a solar inverter. If a Hall current sensor is connected in series with a current source, it can sense magnetic fields coming from the original current source and use the magnetic fields to measure current. In contrast, if a Hall current sensor is not connected in series with a current source, it cannot sense magnetic fields coming from the original current source; rather, it can only sense the external injected magnetic fields from the attacker. This second hall sensor can be used as an external sensing device.

Implementation of the DC Compensator: The DC compensator is connected with digital-to-analog converters (DACs) of the digital core and provides a feedback signal ($-E^c-E^s$) to adder1 (FIG. 7). It is implemented using an op-amp and can be used as an inverting and non-inverting amplifier. For example, if the +input is set to 0, the DC compensator works as an inverting amplifier with a gain, $A_v=-R23/R24=-1$. If the −input is set to 0, it works as a non-inverting amplifier with a gain, $A_v=1+R23/R24=+2$. This variable gain can provide exact feedback signals to the adder1 to compensate the injected DC error, $E^c+E^s$.

Two DACs—DAC0 and DAC1, are connected to the CPU (see FIG. 7). The analog output of DAC0 is connected to +input and the analog output of DAC1 is connected to −input of the DC compensator. When no attack happens, both DACs output 0 V. This indicates that the digital core provides a feedback signal of 0 V at node as no attack happens.

Peripheral Reflex System (PRS): A timer is used to control the sampling frequency of the ADC0 and ADC1. The PRS is a network, which allows the timer to communicate directly with the ADC0 and ADC1 without involving the CPU. Therefore, the PRS reduces the CPU workload that, in effect, reduces the power consumption and improves the system-performance (i.e., speed).

Direct Memory Access (DMA): The DMA is configured to be triggered by ADCs. Whenever a conversion is complete in ADCs, the DMA moves the converted data from ADC0 to an internal variable and ADC1 to another internal variable without CPU intervention, effectively reducing the energy consumption and time for a data transfer.

Example 2: PreMSat—Preventing Magnetic Saturation Attack on Hall Sensors

Spoofing a passive Hall sensor with fake magnetic fields can inject false data into the downstream of the connected systems. Several works try to provide a defense against the intentional spoofing of different sensors over the last few years. However, they either only work on active sensors or against externally injected unwanted weak signals (e.g., EMIs, acoustics, ultrasound, etc.), which can spoof sensor output in its linear region. However, they do not work against a strong magnetic spoofing attack that can drive the passive Hall sensor output in its saturation region (i.e., saturation attack). In the saturation region, the output gets flattened, and no information can be retrieved, resulting in a denial-of-service attack on the sensor.

In this example, we propose a defense against the saturation attack on passive Hall sensors. We name the defense as PreMSat, which is a real-time and low-cost (~$10) defense technique and easy to integrate with the existing Hall sensors. The core idea behind the PreMSat is that it can generate an internal magnetic field having the same strength but in opposite polarity to the external magnetic fields injected by the attacker. The PreMSat integrates a low resistive magnetic path to collect the external magnetic fields injected by the attacker and utilizes a finely tuned PID controller to nullify the external fields in real-time. The PreMSat can prevent the magnetic saturation attack having a strength up to ~4200 A-t within a frequency range 0 Hz-30 kHz, whereas the existing works cannot prevent the saturation attack with any strength. Moreover, it works against the saturation attack originating from any type, such as constant, sinusoidal, and pulsating magnetic fields. We have done over 300 experiments on 10 different industry-used Hall sensors to prove the efficacy of the PreMSat against the saturation attack and found that the correlation coefficient between the signals before the attack and after the attack is satisfactory (i.e., greater than 0.94) in every test case. Moreover, we create a prototype of the PreMSat and evaluate its performance in a practical system—a grid-tied solar inverter. Reportedly, the PreMSat is the first of its kind that can satisfactorily prevent the saturation attack on passive Hall sensors in real-time.

Introduction: A Hall sensor can sense the presence of magnetic fields from the surrounding environment and generates a proportional voltage at its output. It has been known for more than one hundred years, however it has only been put to noticeable use in the last three decades. Today, Hall sensors are available in many cyber-physical systems (CPS), ranging from computers to sewing machines, industrial controllers to medical equipment, and automobiles to aircraft.

Reportedly, the technological developments happen in the Hall sensor in terms of making the sensor more efficient, improving the accuracy and linearity at its output. However, to the best of our knowledge, designers do not still consider security as one of the important requirements while designing the hall sensor. This security issue is also supported by the literature where few works have recently been published on how to attack a Hall sensor by using an external magnetic field. In these works, the attacker uses an electromagnet to spoof the Hall sensor resulting in a denial-of-service (DoS) attack on the connected systems.

Inside of a Hall sensor, a Hall element is present, which outputs a voltage proportional to the sensed magnetic fields to a differential amplifier. The input-output transfer characteristic of a differential amplifier is linear. If the output voltage from the Hall element is small, the differential amplifier works typically in its linear region. However, if the output voltage from the Hall element is large, the differential amplifier cannot work in its linear region anymore, and it is driven to its saturation region. In the saturation region, the input-output characteristic gets flattened; hence no information can be recovered that may cause a catastrophic DoS attack on the Hall sensor. An attacker can use this knowledge to drive the differential amplifier to its saturation region by using a strong external magnetic field. We name this type of attack by the saturation attack.

Moreover, Hall sensors are broadly two types: active and passive Hall sensors. Passive Hall sensors are naive devices; they basically send signals to the upper level without checking the integrity of the signals that makes them vulnerable to external fake magnetic fields.

It is believed that there is no work in the literature and industry that can provide a defense against the saturation attack on passive Hall sensors. As used herein, the term "Hall sensors" refers to unipolar, bipolar, open-loop, closed-loop passive Hall sensors, unless stated otherwise. Recent works can prevent the attack when the attacker spoofs the Hall sensor in its linear region. However, none of these can prevent attacks when the attacker drives the Hall sensor to its saturation region. This example provides a defense technique that can prevent the Hall sensor from the saturation attack and spoofing it in its linear region. We name this proposed defense technique as PreMSat: Preventing Magnetic Saturation, to the best of our knowledge, which is a first robust real-time defense against the saturation attack on Hall sensors.

One core idea behind the PreMSat is that it can generate an internal magnetic field having the same strength but in opposite polarity to the external magnetic fields injected by the attacker. As a result, the internal magnetic fields generated by the PreMSat can nullify the external magnetic fields injected by the attacker. It is important to note that all portions of the externally injected field do not contribute to the saturation attack on Hall sensors. Therefore, the PreMSat introduces a novel magnetic structure to measure the strength and detect the polarity of the contributing portion of the externally injected magnetic fields. This magnetic structure is a circular ferrite core, which hosts a secondary sensor and a primary coil. The circular ferrite core provides a low-resistive magnetic path to collect the contributing portion of the externally injected fields. Then, the secondary sensor located in the same circular ferrite core measures the strength and polarity of the contributing portions of the external fields. The strength and polarity of the externally injected fields are used by a proportional-integral-derivative (PID) controller to generate an internal magnetic field to nullify the external fields injected by the attacker. The PID controller is tuned in such a way that it takes a settling time of 23 μs to generate the stable internal magnetic field. The minimum settling time by the PID controller ensures the real-time defense against the saturation attack and does not hamper the existing data processing speed of the Hall sensor. Reportedly, the PreMSat is the first of its kind that prevents the saturation attack on Hall sensors in real-time with low cost and complexity.

Contributions: The technical contributions of this example include the three following:

1. The PreMSat example is effective against the saturation attack on passive Hall sensors. It also works against any type, such as constant, sinusoidal, and pulsating magnetic fields, in real-time.

2. We create a prototype of the PreMSat and show its effectiveness through experiments on 10 different Hall sensors from 4 different manufacturers. We consider different types, namely unipolar, bipolar, open-loop, and closed-loop passive Hall sensors in our experiments to prove that the PreMSat is a general defense technique against the saturation attack on passive Hall sensors.

3. We evaluate the PreMSat in a real-world practical system—a grid-tied inverter, which is vastly used in smart grids. We prove that the PreMSat prevents the DoS attack on a practical system by nullifying the saturation attack on a Hall sensor.

Related works: It is important to note that to the best of our knowledge, no state-of-the-artwork exists in the literature that can prevent a Hall sensor from the saturation attack. However, there are few works that exist that can prevent low power spoofing to some extent in a context other than Hall sensors. Trippel et al. proposed randomized sampling and 1800 out-of-phase sampling as defenses against the low power acoustic signal injection into MEMs accelerometers. These two defense techniques can only prevent unwanted periodic signals but will not work against DC (i.e., constant)/ aperiodic signals, and hence, cannot prevent the saturation attack. Cheng et al. used a differential model in Hall sensors to suppress common-mode interference and zero drift. Kune et al. used an adaptive filtering technique to mitigate EMI noises in microphones. Razavi et al. proposed a differential comparator in the output stage of the sensor to cancel out common-mode noises from the signals. Zhang et al. designed a low-pass-filter (LPF)/band-pass-filter (BPF) to filter out the injected ultrasound to prevent spoofing on the microphones. Roy et al. proposed a nonlinearity tracing classifier to prevent inaudible voice commands stealthily injected into microphones. The limitations of all the above techniques are three folds. First, they are proven to work well against low power unwanted signals, such as voice commands, acoustics, EMIs. Still to the best of our knowledge, they have not been proved to prevent high power spoofing attack, which can drive the sensors to its saturation region. Second, some of these techniques only work against periodic signals, but they do not capable of preventing aperiodic spoofing signals injected into Hall sensors. Third, most importantly, none of these techniques can prevent saturation attack on any type of sensor. In addition to these defense techniques, Yan et al., Park et al., and Shin et al. proposed other novel defense techniques they can only detect spoofing signals but do not have the capability to contain the attack in real-time.

Shoukry et al. proposed PyCRA to detect intentional spoofing on sensors, but the main drawback is that PyCRA only works for active sensors; it is not applicable for passive sensors. Wang et al. designed a state graph-based approach to detect state corruption due to intentional spoofing. Again, Shoukry et al. used the satisfiability modulo theory (SMT) to recover from corrupted states. The main drawback of the above-mentioned state recovery techniques as a defense is that they do not work against time-varying spoofing signals, which may create oscillations between corrupted and recovered states of the system controller. The oscillations between corrupted and recovered states may eventually compromise the integrity and availability of the system under attack. Moreover, they cannot prevent saturation attacks on any sensor.

To the best of our knowledge, our proposed defense PreMSat is the first of its kind that uses a proportional-integral-derivative (PID) controller to prevent the saturation attack on Hall sensors. It is new in the sense that it does not require sensor fusion techniques to prevent a saturation attack originating from any type of external magnetic spoofing, such as constant, sinusoidal, and pulsating magnetic fields. The PreMSat can work as a firewall against the saturation attack on Hall sensors and keep the connected system safe and healthy during the saturation attack.

Figure 18A:
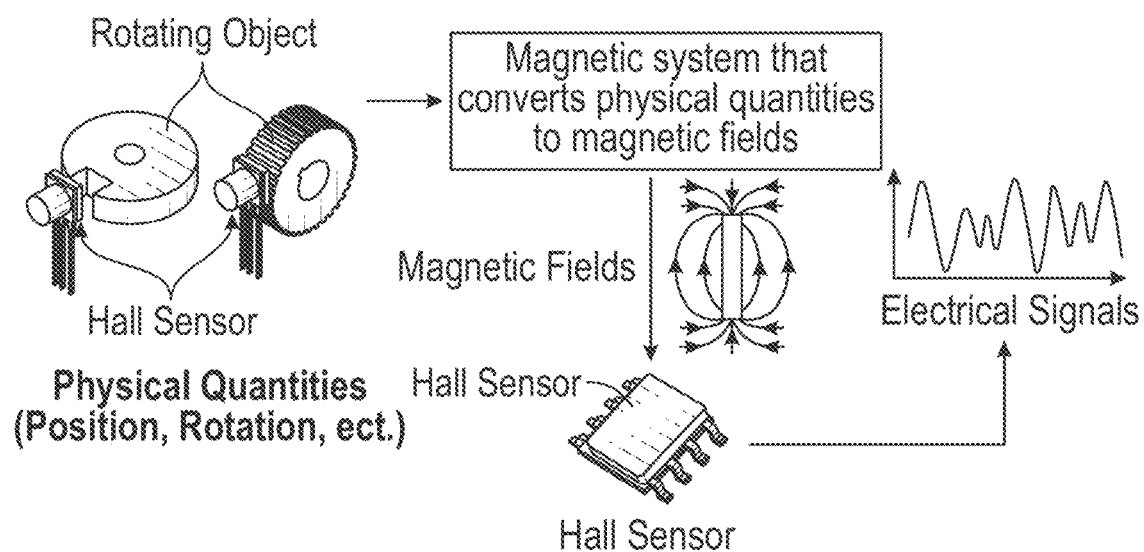
FIG. 18A shows an illustration of a general Hall effect system.
Figure 18B:
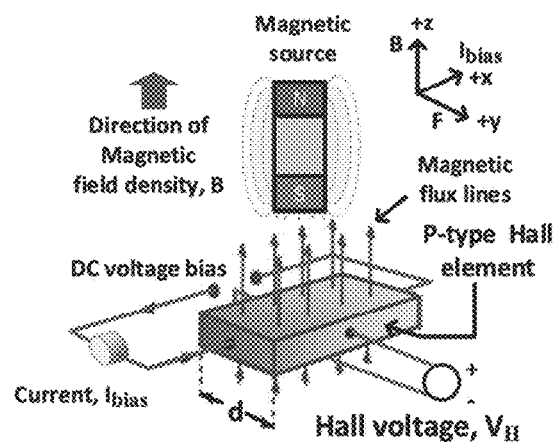
FIG. 18B shows the physics of a typical Hall sensor.

Preliminaries: The physics of the Hall sensor. Hall effect sensors can sense a magnetic field and convert it to a useful electrical signal (FIG. 18A). Magnetic fields can be generated from different physical quantities, such as position, rotation, etc. The physics of the Hall sensor is shown in FIG. 18B. The Hall sensor has a Hall element, which is a p-type semiconductor. Let us denote the thickness of the Hall element by d. A DC voltage bias is applied across the Hall element that causes a current-flow, $I_{Bias}$ through the Hall element along the +X axis. Let us assume a magnetic field/flux density, B is present along the +Z axis. The magnetic field, B exerts a Lorentz force, F on electrons and holes of the Hall element that deflects them to either side of the Hall element along the +Y axis. As electrons and holes move sidewards along the +Y axis, a voltage is generated between two sides of the Hall element along the +Y axis. The voltage is known as Hall voltage, $V_H$ and is expressed as:

$$V_H = k\left(\frac{I_{Bias}}{d} \times B\right) \quad (1)$$

where k is the Hall coefficient. Typically $I_{Bias}$, d and k are held constant: therefore. $V_H$ is proportional to the magnetic field density B.

Figure 19A:
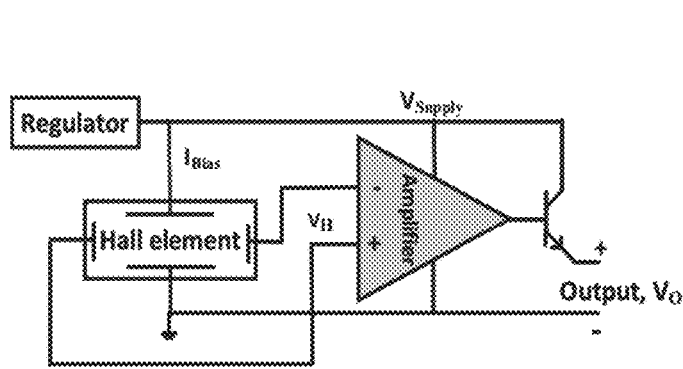
FIG. 19A shows Hall sensor electronics. A defense against a saturation attack is still absent in today's sensor hardware.

Hall sensor electronics: The Hall element of a Hall sensor is a basic magnetic field sensor that is already shown in FIG. 18B. In addition to the Hall element, there are other additional blocks present inside of a Hall sensor. The output of the Hall element, $V_H$ requires a signal conditioning block to make the output available for other applications. A differential amplifier is used as an amplifier stage in the signal conditioning block with the Hall element. The purpose of the differential amplifier is to amplify the potential difference present across the Hall element (a.k.a $V_H$) and also remove the common-mode noises. Moreover, a voltage regulator is integrated with the Hall element to provide a regulated power to the Hall element. The reason behind this is that as the Hall voltage, $V_H$ (see Eqn. 1) is a function of the current $I_{Bias}$, this current needs to be held constant so that $V_H$ is only proportional to magnetic field B. The basic components of a Hall sensor are shown in FIG. 19A. It is clear from this figure that Hall sensors are lacking hardware in the sensor domain to prevent the saturation attack.

Saturation Region of a Hall Sensor

Figure 19B:
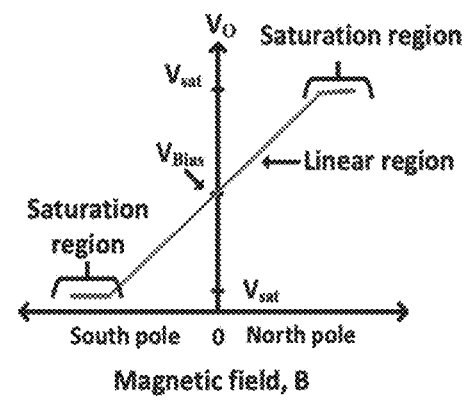
FIG. 19B shows the transfer function of a typical Hall sensor.

Defining saturation region: The sensed magnetic field B in Eqn. 1 can be either positive or negative depending upon the polarity of the magnetic fields (i.e., north/south pole). Therefore, the output of the differential amplifier, denoted as $V_O$, can go either positive and negative, thus requiring both positive and negative power supplies. To avoid the requirement for positive/negative power supplies, a fixed bias voltage, $V_9$, is added into the differential amplifier. The $V_{Bias}$ appears on the output when sensed magnetic field B is zero. A positive/negative magnetic field B can drive the $V_O$ to upper/lower position from the $V_{Bias}$. The term $V_O$ works in the linear region, and the $V_O$ cannot exceed the limit imposed by the power supply. In fact, the $V_O$ will begin to flatten before the limits of the power supply are reached. This flattened region is known as the saturation region, denoted by $V_{sat}$, which is illustrated in FIG. 19B. It is noteworthy that the saturation occurs in the differential amplifier, not in the Hall element. Therefore, a strong spoofing magnetic field can drive the Hall sensor to saturation without damaging the Hall element. As the output of the differential amplifier $V_O$ is flattened in the saturation region, the value of B cannot be recovered in any way while $V_O$ is in the saturation region.

Attacking the saturation region: It is important to note that no defense technique actually exists that can prevent the Hall sensor from going to the saturation region in the presence of an intentional magnetic spoofing attack. It may appear that increasing the voltage of an amplifier where the saturation occurs may solve the problem. However, this is not a permanent solution as the attacker can still drive the Hall sensor to the saturation region by using a stronger spoofing magnetic field. As the saturation attack can change the sensor output on a large scale (i.e., from $V_{Bias}$ to $V_{sat}$, V range), defense techniques that exist in the literature will not work against the saturation attack. Instead, these defense techniques work against low-power unwanted magnetic fields (e.g., EMI, noise, etc.), which can change the sensor output on a small scale (i.e., mV range). In this sense, our proposed defense PreMSat is the first step to provide a defense against the saturation attack on Hall sensors.

Active and passive Hall sensor: An active Hall sensor can measure signals transmitted by the sensor that were reflected, refracted or scattered by the physical environment. A passive Hall sensor can only measure natural emissions coming from the physical environment. A defense technique exists in the literature that may provide a defense against the saturation attack on the active Hall sensor, but it does not work with passive Hall sensors. Therefore, this example provides a defense against the saturation attack on passive Hall sensors.

Figure 20:
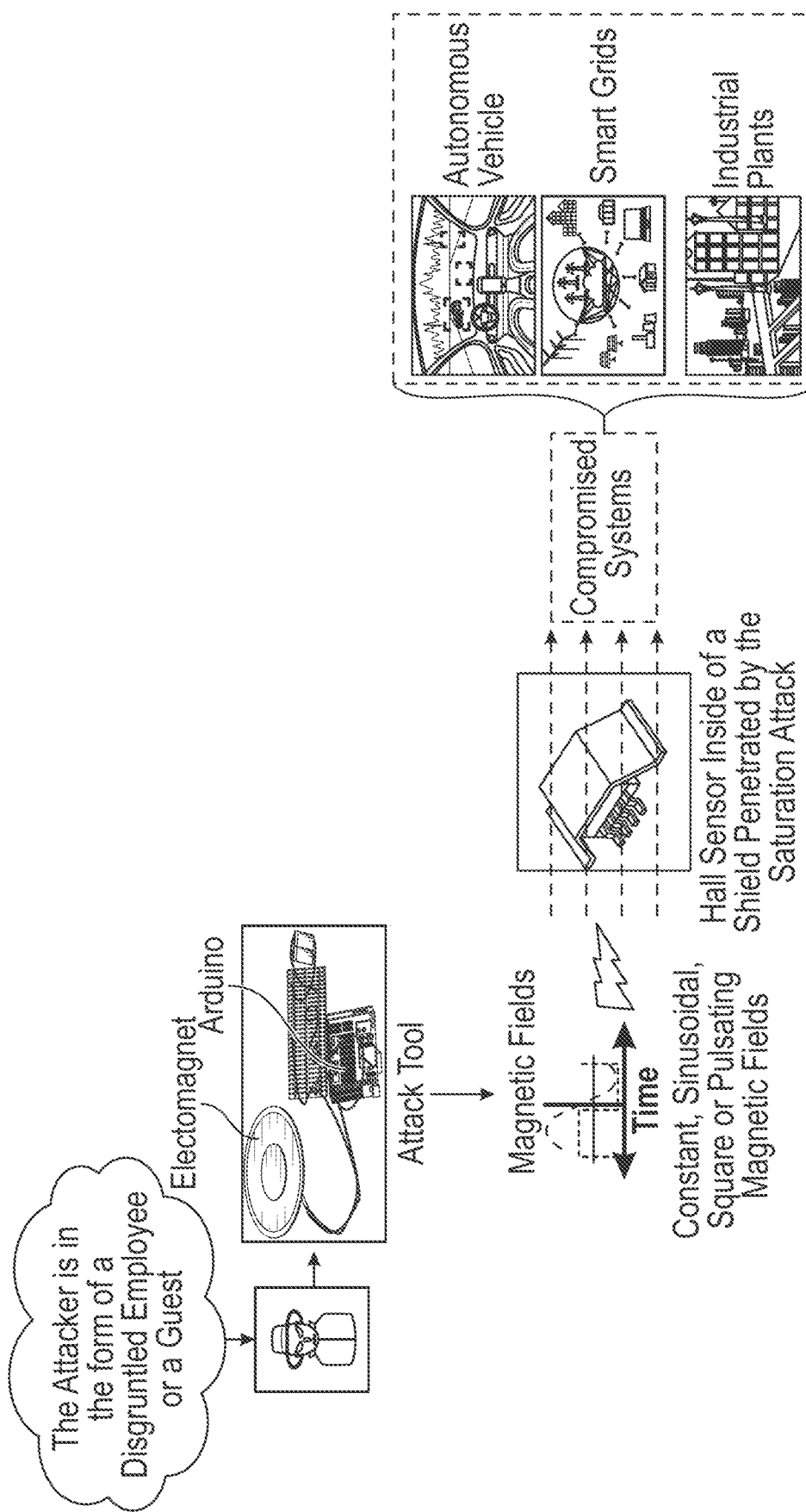
FIG. 20 shows how an attacker can noninvasively inject different types of magnetic fields to the target Hall sensor for a saturation attack.

Defining the saturation attack model: The different components of the saturation attack model are shown in FIG. 20 that are also explained below:

1. Adversarial goals: The attacker only uses high power magnetic energy from a distance to noninvasively spoof and inject malicious signals into the Hall sensor to drive it to its saturation region. As Hall sensors are critical parts of autonomous vehicles, smart grids, and industrial plants, the attacker can disrupt the normal operations of the connected systems just by attacking a Hall sensor with magnetic energy. It has been demonstrated that an attacker can noninvasively spoof a Hall sensor located in the ABS of a car using an external magnetic field to cause an intentional accident resulting in death of the passenger.

Moreover, it has been demonstrated that an attacker can attack a Hall sensor of a smart inverter located in a smart power grid using external magnetic energy and can cause an intentional shutdown of the power grid. The monetary loss that would be faced by an authority because of this kind of adversarial attack is remarkable.

2. Assumptions about the adversary: The attacker can be a disgruntled employee or a guest and is not allowed to access and modify the target Hall sensor. The type of attack this example considers can be termed as a noninvasive physical attack, and defense against a noninvasive physical attack is critical in today's cyber-physical systems. The attacker can inject any type, such as constant, sinusoidal, square, or pulsating magnetic fields from the physical environment for the saturation attack.

3. Attack tool: For the saturation attack, the attacker needs to generate a strong magnetic field of different types, such as constant, sinusoidal, square or pulsating magnetic fields. The attacker can use an electromagnet with an Arduino control to generate the different types of external magnetic fields for the saturation attack. The attacker may also use a permanent magnet or EMIs for the saturation attack.

4. Sensor shield: A sensor shield may or may not be present around a Hall sensor. The saturation attack is strong enough to drive the Hall sensor to its saturation region even in the presence of a shield.

PreMSat defense scheme: One core idea behind the PreMSat is that it can generate an internal magnetic field having the same strength equal to the externally injected magnetic fields in opposite polarity. As a result, the internal magnetic fields generated by the PreMSat can nullify the externally injected magnetic fields. Therefore, the externally injected magnetic fields will not have any spoofing effect on the target Hall sensor to cause the saturation attack.

Before discussing how the PreMSat generates the internal magnetic fields, it is required to discuss few important concepts related to electromagnetism that are going to be conceptualized in the PreMSat.

Contributing direction of the magnetic fields on Hall sensors: The Hall element in the Hall sensor is not sensitive to all directions of a magnetic field. Rather, the Hall element is sensitive to a particular direction of a magnetic field that actually contributes to the generation of the Hall voltage $V_H$. We bring the Proposition 1 below to state the contributing direction of magnetic fields on Hall sensors.

Proposition 1: The Hall element located in the Hall sensor is sensitive to only the vertical component of the magnetic fields that is perpendicular to the current flow $I_{Bias}$.

Figure 21:
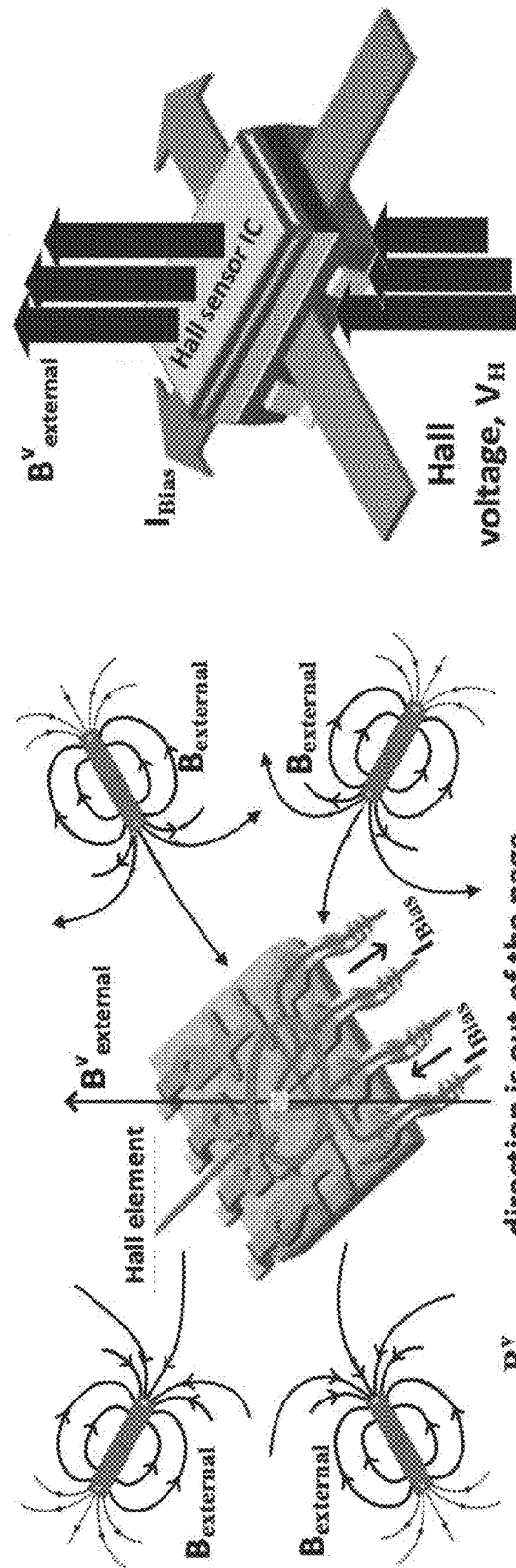
FIG. 21 shows that in the presence of multiple magnetic sources/$B_{external}$, the vector summation of vertical components of $B_{external}$, which is perpendicular to $I_{Bias}$, only contribute to the Hall voltage, VH.

Explanation of Proposition 1: It is important to note that the magnetic field B in Eqn. 1 and FIG. 18B is present along the +z direction. Moreover, according to the law of Lorentz Force, the term $V_H$ in Eqn. 1 is only sensitive to the magnetic fields B present along the +z direction. The +z direction is perpendicular to the direction of current flow $I_{Bias}$. Therefore, the Hall element located in the Hall sensor is sensitive to only the vertical component of the magnetic fields that is perpendicular to the current flow $I_{Bias}$. Let us denote the external magnetic fields injected by the attacker by $B_{external}$. The vertical component of the $B_{external}$, which is perpendicular to $I_{Bias}$, will only contribute to the Hall voltage, $V_H$. If the attacker uses multiple magnetic sources to generate $B_{external}$, the vector summation of all the vertical components of the $B_{external}$ will contribute to the Hall voltage, $V_H$. Let us denote the magnitude of the summation of all vertical components of $B_{external}$ perpendicular to $I_{Bias}$ by $B^v_{external}$. FIG. 21 depicts the presence of the $B^v_{external}$ in the case of multiple magnetic sources. As $B^v_{external}$ only contributes to the $V_H$, the PreMSat should need to generate an internal magnetic field having the same magnitude of $B^v_{external}$ in opposite polarity to nullify the $B^v_{external}$ injected by the attacker. Let us denote the magnitude of the internal magnetic field generated by the PreMSat by $B_{internal}$ where $B_{internal}$ should be equal to $B^v_{external}$ to nullify $B^v_{external}$.

Internal Magneto-Motive Force generated by the PreMSat: The attacker needs a magnetic source (i.e., electromagnet, EMI, etc.) to generate external magnetic fields $B_{external}$ to drive the Hall sensor to its saturation region. The strength of the magnetic-source is quantified by Magneto-Motive Force (MMF). For defense, the PreMSat needs to use an internal magnetic source that can generate the exact MMF to provide an internal field $B_{internal}$ to nullify the $B^v_{external}$. Let us denote the internal MMF generated by the PreMSat by $MMF_{internal}$.

Figure 22A:
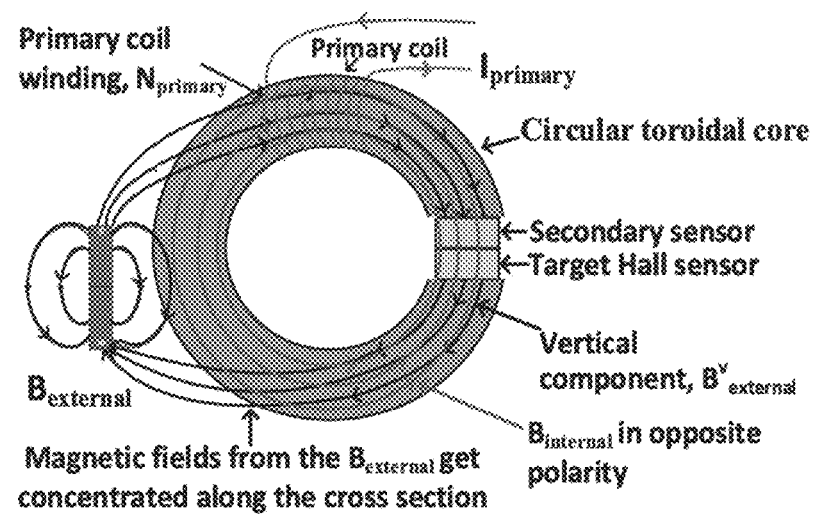
FIG. 22A shows how a circular core hosts the target Hall sensor and the secondary sensor and provides a magnetic path to collect the injected $B_{external}$.
Figure 22B:
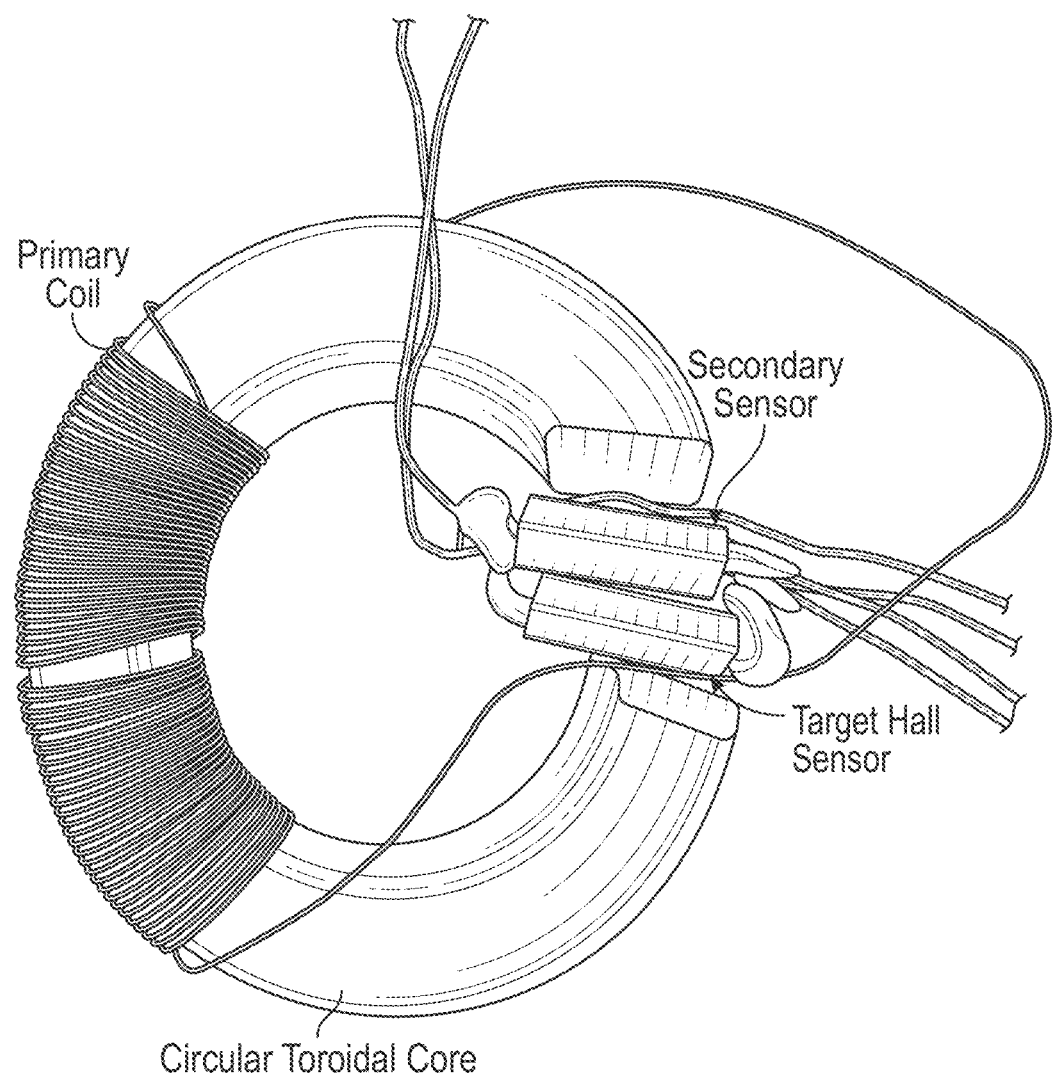
FIG. 22B shows the implementation of the circular core.

The PreMSat implements a solenoid to generate the $MMF_{internal}$. The solenoid is constructed using a ferrite core, which has a coil winding in a spiral direction. The shape of the ferrite core is circular, and the coil is winded on the body of this circular ferrite core. As the ferrite core is in a circular shape, it can also be called by a toroidal ferrite core. The construction of the toroidal ferrite core is shown in FIG. 22A-B. Let us denote the winded coil on the ferrite core that generates the $MMF_{internal}$ by the primary coil. The $MMF_{internal}$ a generated by the primary coil can be expressed as:

$$MMF_{internal} = N_{primary} I_{primary} \quad (2)$$

where $N_{primary}$ is the total number of turns of the primary coil on the toroidal core and $I_{primary}$ is the current flowing through the primary coil. The $MMF_{internal}$ generates an internal magnetic field $B_{internal}$ which can be expressed as follows:

$$B_{internal} = \frac{\mu_r \mu_o N_{primary} I_{primary}}{2\pi r} = \frac{\mu_r \mu_o MMF_{internal}}{2\pi r} \quad (3)$$

where $\mu_o$ is the magnetic permeability of air, $\mu_r$ is the relative permeability of ferrite, and r is the radius of the toroidal core. The generated $B_{internal}$ should have a magnitude equal to the $B^v_{external}$ but in opposite polarity to nullify the $B^v_{external}$. This will be discussed in the next section.

Use of the $B_{internal}$ to nullify the $B^v_{external}$: We already discussed that the term $B^v_{external}$, which is the magnitude of the vector summation of all vertical components of the $B_{external}$, is perpendicular to the $I_{Bias}$. The PreMSat generates an $MMF_{internal}$ using a toroidal core to provide a magnetic field $B_{internal}$ to oppose the external magnetic fields $B^v_{external}$ injected by the attacker. The PreMSat generates the $MMF_{internal}$ by addressing the following two important questions:

Q1. How does the PreMSat generate $B_{internal}$ having equal magnitude to the $B^v_{external}$?

Q2. How does the PreMSat align the generated $B_{internal}$ in the opposite direction to nullify the $B^v_{external}$?

These two questions are addressed below.

Generating the $B_{internal}$ having equal magnitude to the $B^v_{external}$: To generate a $B_{internal}$ having equal magnitude to $B^v_{external}$, the PreMSat needs a methodology to sense the magnitude and direction of $B^v_{external}$ correctly. As a Hall sensor under attack is a naive device, it cannot alone differentiate the original input magnetic fields from the attacker's provided external magnetic fields. Let us denote the original input magnetic fields by $B_{input}$ that actually needs to be measured by the Hall sensor. To differentiate the $B_{input}$ from the externally injected magnetic fields $B^v_{external}$, the PreMSat uses a secondary sensor placed in the toroidal ferrite core. The secondary sensor is just for sensing the presence of the externally injected magnetic fields $B^v_{external}$. The secondary sensor is placed close to the target Hall sensor so that it can only sense the external magnetic fields injected to the target Hall sensor (see FIG. 22A-B).

The secondary sensor. The next question we need to answer is how the secondary sensor actually differentiates the original input magnetic fields $B_{input}$ from the externally injected magnetic fields $B^v_{external}$. Let us answer the question by giving an example. Let us consider a scenario of a Hall current sensor in a solar inverter. If a Hall current sensor is connected in series with a current source in the solar inverter, it can sense magnetic fields coming from the current source and use the sensed magnetic fields to measure current. The magnetic field coming from the current source is the $B_{input}$ here. On the other hand, the secondary sensor is not connected with the current source in the solar inverter. As the secondary sensor is not connected with the current source in the solar inverter, the secondary sensor works as a passive sensing device that cannot sense the input magnetic fields $B_{input}$ coming from the current source. Rather, the secondary sensor only senses the external magnetic fields injected into the target Hall sensor. The secondary sensor can be implemented using either a Hall sensor or a magnetic coil.

1. Explanation of sensing $B^v_{external}$ by the secondary sensor: As the $B^v_{external}$ is the magnitude of the vector summation of vertical components of the $B_{external}$ (see FIG. 21), the PreMSat should provide a magnetic path to collect the vertical components $B^v_{external}$ from the $B_{external}$. The circular ferrite core used as a toroid in the PreMSat actually provides the magnetic path to collect the vertical components $B^v_{external}$ from the $B_{external}$.

We bring the Proposition 2 to elaborate this concept below.

Proposition 2: As the ferrite core used in the toroidal core of the PreMSat has very low magnetic resistance compared to the air, practically speaking, most of the magnetic fields of $B_{external}$ will get concentrated along the cross-section of the ferrite core.

Explanation of Proposition 2: The way how the circular ferrite core provides a magnetic path to collect the vertical components $B^v_{external}$ is shown in FIG. 22A-B. When single/multiple external magnetic fields $B_{external}$ are present near the target Hall sensor, the $B_{external}$ needs to overcome the air gap present between the target Hall sensor and the source of the $B_{external}$. As the air has very low magnetic permeability (e.g., $4\pi 10^{-7}$ Wb/A–t·m), the air gap present between the target Hall sensor and the external magnetic sources works as a magnetic path having very high resistance. Because of the high magnetic resistance of the air, the magnetic field lines coming from the $B_{external}$ change their normal path and try to find a new path having a low magnetic resistance. The circular ferrite core provides the very low resistive magnetic path to the $B_{external}$. In numbers, the relative magnetic permeability of ferrite can vary between 1150 to 25000. In other words, the magnetic resistance of the ferrite core is 1150-25000 times less than the air. As the ferrite core has very low magnetic resistance compared to the air, practically speaking, most of the external magnetic fields from the $B_{external}$ get concentrated along the body of the ferrite core. In this way, the presence of the ferrite core influences the patterns of magnetic fields of the $B_{external}$. As a result, practically speaking, most of the magnetic fields from the $B_{external}$ get concentrated along the cross-sectional area of the ferrite core.

Vertical projection of $B_{external}$ onto the Hall sensor: As the $B_{external}$ is concentrated along the cross-section of the ferrite core, if we could place the target Hall sensor in the cross-section of the ferrite core, the $B_{external}$ will be projected onto the target Hall sensor vertically. The reason behind this is that as the ferrite core has a circular shape, the concentrated magnetic fields $B_{external}$ along the circular core will be vertical to any plane placed in the cross-section of the circular core. The idea is illustrated in FIG. 22A-B. To place the target Hall sensor in the cross-section of the ferrite core, a small gap having the same dimension of the target Hall sensor is created in the cross-section of the ferrite core. The target Hall sensor is placed in this gap shown in FIG. 22A-B. The placement of the target Hall sensor in the cross-section of the circular ferrite core enables the vertical projection of $B_{external}$ onto the Hall sensor. In other words, the concentrated $B_{external}$ in the cross-section of the circular ferrite core will act as $B^v_{external}$ to the target Hall sensor as the Hall sensor is placed in the cross-section of the circular ferrite core.

The secondary sensor is also placed together with the target Hall sensor in the gap of the circular ferrite core. This is illustrated in FIG. 22A-B. As the secondary sensor is placed together with the target Hall sensor, the same $B^v_{external}$ passes through the secondary sensor. Therefore, the secondary sensor sees the same amount of $B^v_{external}$, similar to the target Hall sensor. In this way, the secondary sensor placed in the toroidal core can sense the $B^v_{external}$ injected by the attacker.

Explanation of generating an electrical signal proportional to the $B^v_{external}$ by the secondary sensor. The PreMSat uses a Hall sensor as the secondary sensor for simplicity. A magnetic coil could also be used as the secondary sensor. For the Hall sensor as the secondary sensor, after sensing the $B^v_{external}$, the secondary sensor generates a Hall voltage following Eqn. 1. Let us denote the generated Hall voltage in the secondary sensor by $V_{secondary}$.

Types of $B^v_{external}$: It is already mentioned that the attacker can actually use any type of external magnetic fields $B^v_{external}$ for the saturation attack. We know from the Fourier transformation that any type of signal can be generated from a combination of constant, sinusoidal, and square pulsating waves. That is why, here, we have discussed how $V_{secondary}$ changes for the constant, sinusoidal, and square pulsating magnetic fields. This information on $V_{secondary}$ is required to design algorithm 2, which can prevent the saturation attack generating from any type of $B^v_{external}$. Let us define the constant, sinusoidal and square pulsating magnetic fields mathematically in Eqn. 4.

$$B_{atk} = \{C; \text{ constant field } B_{amplitude}\sin\sin\omega t; \text{ sinusoidal} \quad \text{field } \text{sgn}(B_{amplitude}\sin\sin\omega t); \text{ square pulsating field} \quad (4)$$

where C is a constant, $\omega$ is the angular frequency and $B_{amplitude}$ is the magnitude of the injected magnetic field, and sgn is the signum function. If magnetic fields $B^v_{external}$ from Eqn. 4 is used in Eqn. 1, $V_{secondary}$ can be calculated. The calculated $V_{secondary}$ is graphically illustrated in FIG. 23.

Figure 23:
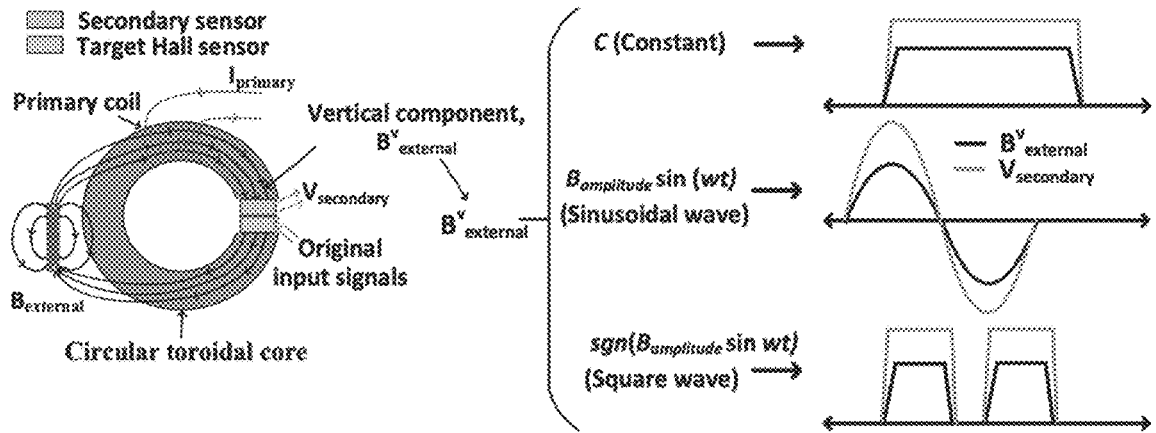
FIG. 23 shows that the $B^v_{external}$ can have constant, sinusoidal, or square pulsating shapes. The generated voltage in the secondary sensor, $V_{secondary}$, has the same shape as the $B^v_{external}$.

The $V_{secondary}$ is proportional to the $B^v_{external}$: Eqn. 1 shows that the term $V_H$ is proportional to the magnetic fields B present in the +z direction. Therefore, the generated $V_{secondary}$ in the secondary sensor is also proportional to the vertical components of the externally injected magnetic fields, previously denoted by $B^v_{external}$. For this reason, it is also illustrated in FIG. 23 that the $B^v_{external}$ and the $V_{secondary}$ both have the same shape and frequency.

In summary, the secondary sensor can sense the presence, shape, and frequency of the externally injected magnetic fields $B^v_{external}$ and generate an equivalent voltage $V_{secondary}$. We discuss in the next section how the $V_{secondary}$ can be used to generate the internal magnetic fields $B_{internal}$ to nullify the $B^v_{external}$.

Explanation of generating the $B_{internal}$ having equal magnitude to the $B^v_{external}$: The PreMSat needs to calculate the magnitude of the $B^v_{external}$ first before generating the $B_{internal}$. It is evident from Eqn. 1 that if $I_{Bias}$, and $V_H$ are known, B can be calculated. As the secondary sensor provides the $V_{secondary}$, it is possible to calculate the $B^v_{external}$ from the $V_{secondary}$ using Eqn. 5. The Eqn. 5 is derived by adjusting the terms of Eqn. 1.

$$B^v_{external} = K\left(\frac{d \times V_{secondary}}{I_{Bias}}\right) = K_c \times V_{secondary} \quad (5)$$

where $K_c$ is known as sensitivity of the Hall sensor that includes all the constant terms to simplify the calculation. The term $K_c$ is provided by the manufacturer of the Hall sensor in its datasheet.

Figure 24:
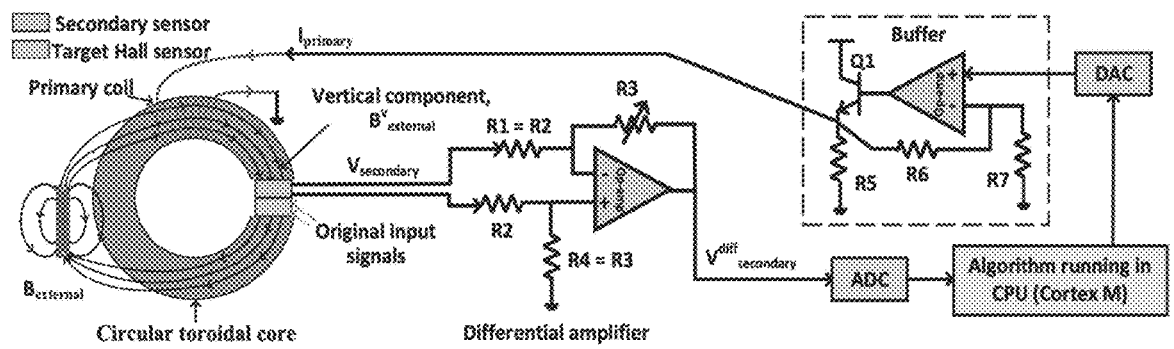
FIG. 24 shows the different blocks of the PreMSat.

Blocks of the PreMSat: It is clear that $V_{secondary}$ is the output of the secondary sensor. A processor actually calculates the $B^v_{external}$ from the $V_{secondary}$ using Eqn. 5. Before calculating the $B^v_{external}$ from $V_{secondary}$ using Eqn. 5, the voltage $V_{secondary}$ is given as an input to a differential amplifier for noise cancellation. Moreover, the PreMSat also uses other blocks beside the circular toroidal core and differential amplifier to generate the $B_{internal}$ equal to $B^v_{external}$ to nullify the $B^v_{external}$. In this section, we discuss all the blocks used in the PreMSat (see FIG. 24) and its algorithm in detail.

Circular toroidal core: The toroidal core is a circular ferrite core that acts as a host for the primary coil and secondary sensor. The use cases of the primary coil and secondary sensor are discussed above.

Differential amplifier: The differential amplifier takes the $V_{secondary}$ as its input and provides an amplified version at its output. The differential amplifier removes the common-mode noises from the $V_{secondary}$. The differential amplifier is implemented using an operational amplifier in the configuration shown in FIG. 24. When resistors R1=R2 and R3=R4, the output of the differential amplifier, denoted by $V^{diff}_{secondary}$, can be simplified to Eqn. 6.

$$V^{diff}_{secondary} = \frac{R_3}{R_1} V_{secondary} \quad (6)$$

where the ratio $R_3/R_1$ is set to 1 in the PreMSat. Therefore, the differential amplifier only rejects the common-mode noises from the $V_{secondary}$ with a gain 1.

Analog-to-digital converter (ADC): The ADC samples the $V^{diff}_{secondary}$ and digitizes it to provide it to an algorithm 2 (FIG. 26) for generating the $B_{internal}$ to nullify the $B^v_{external}$. The ADC can be configured to have a high (900 kHz) and a low (35 kHz) sampling frequency. To reduce the power consumption, the ADC uses the low sampling frequency at normal operating condition (i.e, when there is not any presence of $B^v_{external}$), but start using the high sampling frequency when an attack happens (i.e, when there is a presence of $B^v_{external}$). It is already explained how the secondary sensor located in the toroidal core can sense the presence of the injected $B^v_{external}$.

Algorithm running in the PreMSat: An algorithm 2 runs in the central processing unit (CPU) of the PreMSat to provide proper signals for generating the $B_{internal}$. The CPU must need to generate the $B_{internal}$, which should have the same magnitude, frequency and in the reverse direction of the $B^v_{external}$ to nullify the $B^v_{external}$.

PID controller: The algorithm running in the CPU is designed in such a way that the generation of the $B_{internal}$ should be fast enough so that the $B_{internal}$ can nullify the $B^v_{external}$ in real-time. To meet the real-time requirement and the fast response of the PreMSat, a proportional-integral-derivative (PID) controller is implemented in the z-domain/discrete-time domain. The reasons behind implementing the PID controller in the z-domain instead of the s-domain/continuous-time domain are three-fold. First, The z-domain implementation takes the sampling time in consideration that makes the PID controller more stable in the z-domain compared to the s-domain. Second, the PID controller in the z-domain is highly deterministic. Third, most importantly, the PID controller in the z-domain has a much faster response time than the s-domain implementation. These properties are critical for real-time defense against the saturation attack.

The functional diagram of the PID controller is shown in FIG. 25. The variable e(z) represents the tracking error, which is the difference between the desired output $B^v_{external}$, and the actual output $B_{internal}$. Here, the $B^v_{external}$ is defined as the desired output because the PID controller should generate the $B_{internal}$ equal to the $B^v_{external}$. The $B^v_{external}$ is also known as reference output. This error signal e(z) is fed to the PID controller, and the controller computes both the derivative and the integral of this error signal with respect to time. The output of the PID controller is a control signal u(z) that is equal to the proportional gain Kp times the magnitude of the error plus the integral gain Ki times the integral of the error plus the derivative gain Kd times the derivative of the error.

The control signal u(z) is fed to the primary coil, and the new output $B_{internal}$ is obtained. To obtain a continuous-time signal $B_{internal}$ from a discrete-time signal u(z), a digital-to-analog converter (DAC) is used before the primary coil. The new output $B_{internal}$ is then fed back and compared to the reference $B^v_{external}$ to find the new error signal e(z). The controller takes this new error and computes an update of the control signal u(z) again. This process continues until the error e(z) settles to a minimum value.

The transfer function of the PID controller in z-domain is expressed in Eqn. 7.

$$\frac{u(z)}{e(z)} = K_p + K_i \frac{T_s(z+)}{2(z-1)} + K_d \frac{z-1}{zT_s} \quad (7)$$

$$=> u(z) = z^{-1}u(z) + ae(z) + bz^{-1}e(z) + cz^{-2}e(z)$$

where $a = K_p + K_i(T_s/2) + (K_d/T_s)$, $b = -K_p + K_i(T_s/2) - (2K_d/T_s)$, $c = (K_d/T_s)$, and $T_s$ is the sampling period of the ADC. Eqn. 7 can be expressed as a difference equation shown in Eqn. 8.

$$u(k) = u(k-1) + ae(k) + be(k-1) + ce(k-2) \quad (8)$$

where u(k) and e(k) are discrete-time domain equivalent of z-domain terms u(z) and e(z), respectively. Eqn. 8 is a recursive equation and has a second-order infinite-impulse-response (IIR) filter format. Therefore, the PID controller, used in the PreMSat, is a second-order IIR filter that requires less memory space and computational time compared to the finite-impulse-response (FIR) filters. This supports the idea that the PreMSat provides a real-time defense against the saturation attack on Hall sensors.

Analysis of the PID controller: As the PID controller is the critical component of the real-time machine of the PreMSat, few parameters that control the real-time properties of the PID controller need to be discussed first. These parameters are rise time, overshoot, settling time, and steady-state error. The values of $K_p$, $K_i$, $K_d$ are tuned using MATLAB for a sampling frequency 900 kHz in such a way that results in the lowest rise time, overshoot, settling time and steady-state error. The values of these parameters used in the PreMSat are tabulated in Table 7.

TABLE 7

Parameters of the PID controller used in the PreMSat

| Response | Rise time | Overshoot | Settling time | Steady-state error |
|---|---|---|---|---|
| $K_p = 350$;<br>$K_i = 300$;<br>$K_d = 50$ | 8 µs | <1% | 23 µs | <1% |

Table 7 indicates that the settling time is 23 µs. In other words, it takes 23 µs to generate the $B_{internal}$ equal to the $B^v_{external}$ with less than 1% steady-state error. The less than 1% steady-state error is negligible compared to the large values of the $B^v_{external}$ required for the saturation attack.

Algorithm: Algorithm 2 (FIG. 26), which handles the PID controller and controls the $B_{internal}$ generation process, is explained below.

Line 1-4: The ADC is configured initially to a low sampling frequency of 35 kHZ to ensure low power consumption by the PreMSat. The ADC samples the $V^{diff}_{secondary}$, and algorithm 2 continuously tracks the $V^{diff}_{secondary}$ to check whether any attack happens.

Line 5-9: As $V^{diff}_{secondary}$ is coming from the secondary sensor, any change of $V^{diff}_{secondary}$ from a reference voltage indicates the presence of the $B^v_{external}$. The ADC changes its sampling frequency (i.e., 1/Ts) to a higher value (i.e., 900 kHz) to provide the optimum a, b, and c in Eqns. 7 and 8. Then $B^v_{external}$ is calculated using Eqn. 5 and the calculated $B^v_{external}$ is used to calculate the term e(z).

Line 10-17: The PID controller is implemented in algorithm 2 using the difference Eqn. 8. The PID controller generates u(k), which is the discrete-time representation of u(z), and converts the term u(k) to an equivalent analog signal $I_{primary}$. The $I_{primary}$ is used to generate $B_{internal}$ using Eqns. 2, and 3. The error signal e(z) is calculated and this process repeats until the term e(z) settles within the 1% of the reference $B^v_{external}$. If no attack happens, the algorithm does not generate any $B_{internal}$ and keeps the Hall sensor running as it is.

Digital-to-Analog converter (DAC): The DAC converts the digital signal u(k), which is the output of the PID controller, to an analog signal $I_{primary}$. As the DAC does not have the capability to provide high values of $I_{primary}$ to the primary coil, a buffer is used after the DAC to support high current to the primary coil. The primary coil, next, generates the $B_{internal}$ that is explained above.

Generating the $B_{internal}$ in Opposite Direction to the $B^v_{External}$

After generating the $B_{internal}$ having equal magnitude to the $B^v_{external}$, the PreMSat should provide the generated $B_{internal}$ in opposite direction to the $B^v_{external}$. As the $B^v_{external}$ is concentrated along the cross-section of the toroidal ferrite core, the $B_{internal}$ should also be provided along the same cross-section of the toroidal ferrite core in opposite direction to nullify the $B^v_{external}$. The primary coil winded on the toroidal core serves this purpose. To provide the $B_{internal}$ in opposite polarity, the primary coil is connected in reverse polarity with the buffer chip. Therefore, the PID controller running in algorithm 2 does not need to spend any extra time to make the polarity of the $B_{internal}$ reverse to nullify the $B^v_{external}$.

Evaluation of the PreMSat

Figure 27A:
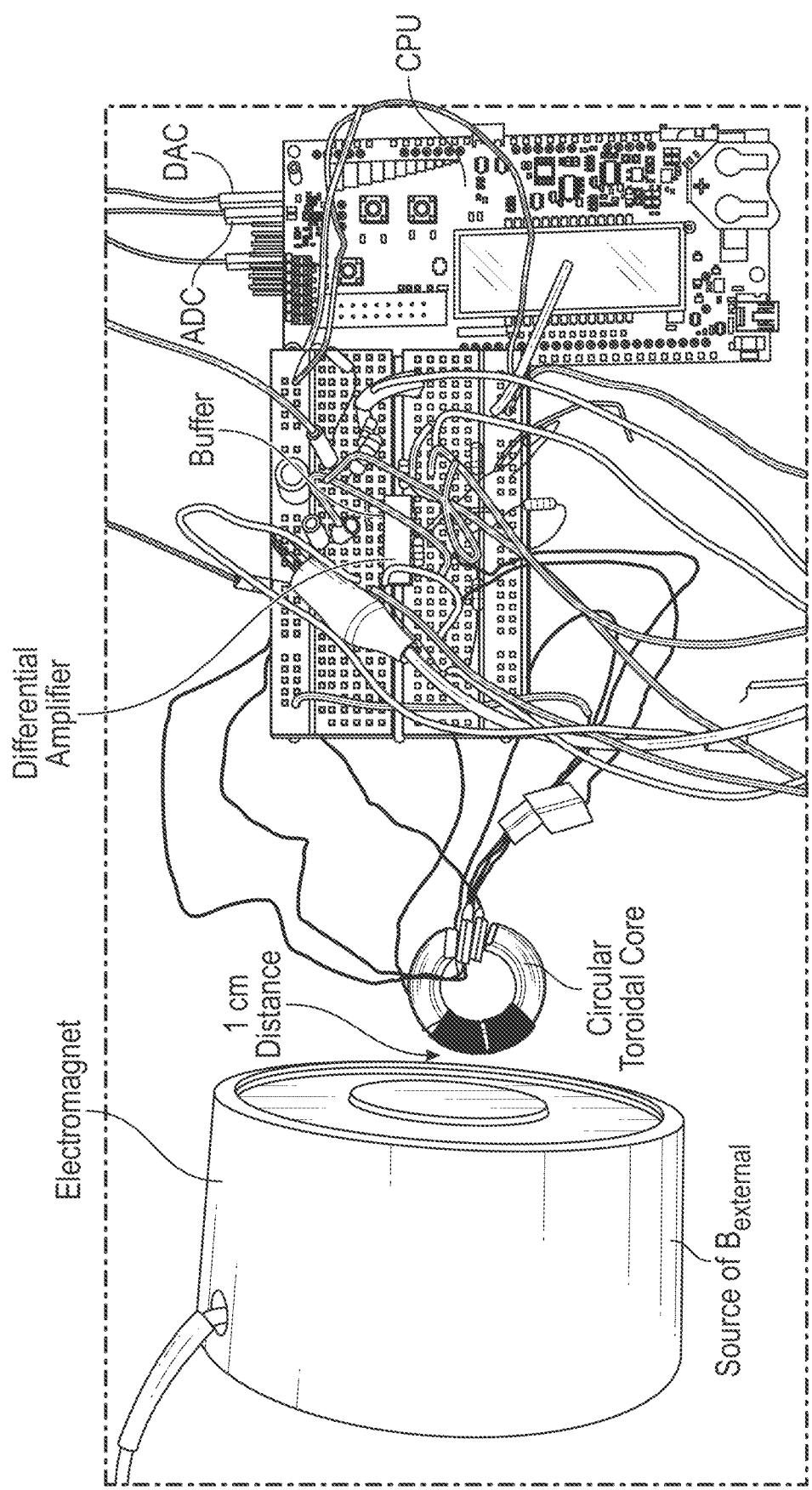
FIG. 27A shows an example of a prototype PreMSat.

A prototype: A prototype of the proposed PreMSat is implemented here using different discrete components, which is shown in FIG. 27A. A Hall sensor (part #ACS718) is used as the secondary sensor. The differential amplifier uses a low-power op-amp (i.e., part #TL084CN) having high slew rate, low input bias, and offset currents with a rise time of 0.05 µs and a unity-gain bandwidth of 3 MHz. The buffer uses an op-amp (part #TL084CN) in voltage-follower configuration with a high-power transistor Q1 (part #MPSA44) connected at the op-amp's output (see FIG. 24). The CPU of the PreMSat is an EFM-32 Giant Gecko development board from Silicon Labs having a Cortex M-3 based 32-bit CPU with built-in ADCs and DACs. The EFM-32 has an ultra-low-power CPU with a 48 MHz clock. A low-cost soft ferrite, such as manganese-zinc (Mn—Zn) ferrite is used as the material of the circular toroidal core in the PreMSat. Mn—Zn ferrite has a high relative permeability (~25000), and can support high frequency and low eddy current loss. Therefore, Mn—Zn ferrite can provide a low-resistive path to collect the externally injected field $B_{external}$ for the PreMSat.

Testbed: This example tests 10 different Hall sensors (Table 8) of all types, such as open/close loop, bipolar/unipolar as target Hall sensors. As different types of Hall sensors measure different types of input signals, we use different sources to supply input signals to these different Hall sensors. We use a variable AC power supply with DC source to supply current/voltage as original input signals to the Hall sensors with serial no. 1-6 and use a permanent magnet to supply magnetic fields as input signals to Hall sensors with serial no. 7-10 in Table 8.

Figure 27B:
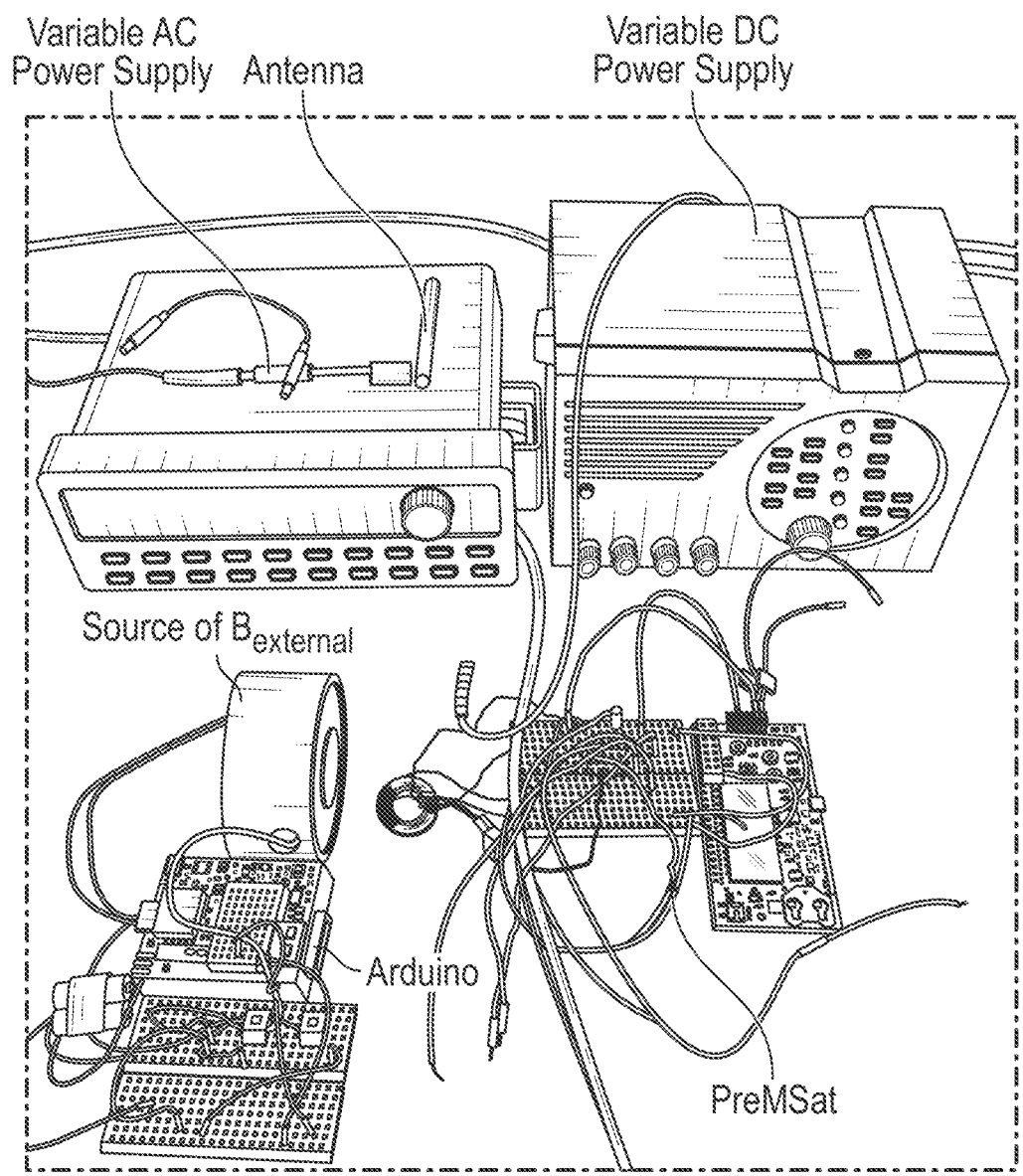
FIG. 27B shows an example of different instruments used in the testbed.

The external magnetic fields $B_{external}$ are generated in two ways: an electromagnet with an electronic switch connected with an Arduino Uno is used to generate constant, sinusoidal, and pulsating fields, and a function generator connected with a mono-pole antenna is used to radiate high and low frequency EMI signals. Different tools used in the testbed are shown in FIG. 27B.

PreMSat prevents the saturation attack: In this section, we demonstrate that the PreMSat prevents the saturation attack on Hall sensors. We randomly pick ACS710KLATR-10BB from Table 8 as the target Hall sensor to demonstrate the capability of the PreMSat. A 7.5 A peak-to-peak AC current of 60 Hz frequency is given as an input signal to the target Hall sensor ACS710KLATR-10BB.

Figure 28:
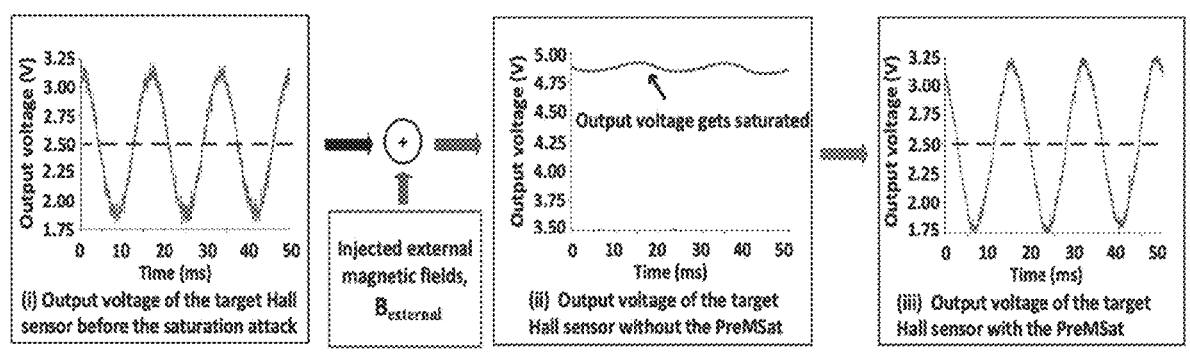
FIG. 28 shows (i) The output signal of the target Hall sensor before the saturation attack. (ii) The output signal of the target Hall sensor gets saturated if PreMSat is not used. (iii) The output signal of the target Hall sensor does not change if PreMSat is used.

Before any injection of external magnetic fields, the output of the target Hall sensor is shown in FIG. 28 (*i*), which shows an undistorted sinusoidal signal. An electromagnet with an MMF of ~3600 A-t is used to inject different types of external magnetic fields $B_{external}$, such as constant, sinusoidal, and square pulsating fields, to the target Hall sensor from 1 cm. We use 2 Hz as the frequency of injected sinusoidal and square pulsating fields as an example. FIG. 28 (*ii*) shows that the output of the target Hall sensor is driven to its saturation voltage (4.8 V) after the saturation attack resulting in a flattened output signal.

As the output signal is flattened, any critical information cannot be recovered from the output signal in its saturation region. This saturation attack can be prevented by our proposed defense PreMSat shown in FIG. 28 (iii). After integrating the PreMSat with the target Hall sensor, the PreMSat generates an internal magnetic field $B_{internal}$ to nullify the $B_{external}$. As a result, the external magnetic fields $B_{external}$ cannot drive the output of the target Hall sensor to its saturation region. We can see from FIG. 28 (iii) that the output of the target Hall sensor remains unperturbed during the saturation attack.

We also quantify whether the output voltage of the target Hall sensor before the saturation attack is similar to the output voltage of the target Hall sensor after the saturation attack with the PreMSat. If we can prove that the output voltage of the target Hall sensor before the saturation attack is similar to the output voltage of the target Hall sensor after the saturation attack with the PreMSat, we can claim that the PreMSat is effective to prevent the saturation attack. To quantify the similarity, we calculate the correlation coefficient (C) between signals in FIG. 28 (i) (i.e., before the saturation attack) and FIG. 28 (iii) (i.e., after the saturation attack with the PreMSat).

The value of correlation coefficient (C) is 0.97 for this case that is very close to unity. This indicates that the signal in FIG. 28 (i) (i.e., before the saturation attack) is statistically the same as the signal in FIG. 28 (iii) (i.e., after the saturation attack with the PreMSat) in a point-by-point fashion. This proves that the PreMSat can successfully prevent the saturation attack on a Hall sensor.

Testing the PreMSat for different amplitudes of input signals: Table 8 shows the average correlation coefficient C for different amplitude of input signals to 10 different types of Hall sensors. We vary the amplitude of the input signals within the entire input range of Hall sensors and calculate C for every input value and do an average of C for every sensor. The average of C is greater than 0.94 for every sensor when the PreMSat is used compared to 0.1 when the PreMSat is not used. We keep the frequency of the input signals to Hall sensors fixed at 60 Hz and do a total of 50 experiments. This indicates that the PreMSat works within the entire input range of every Hall sensor.

TABLE 8

Testing different Hall sensors in testbed for different amplitudes of input signals

| Sl. | Manufacturer | Part # | Polarity/Loop | Amplitude of input signal | Avg. C |
|---|---|---|---|---|---|
| 1 | Allegro | ACS718MATR-20B | Bipolar/Open | 1 A, 5 A, 10 A, 15 A, 20 A | 0.94 |
| 2 | Allegro | ACS710KLATR-10BB | Bipolar/Open | 2 A, 4 A, 6 A, 8 A, 10 A | 0.95 |
| 3 | Allegro | ACS715ELCTR-20A | Unipolar/Open | 1 A, 5 A, 10 A, 15 A, 20 A | 0.95 |
| 4 | Allegro | ACS724LLCTR-10AU | Unipolar/Open | 2 A, 4 A, 6 A, 8 A, 10 A | 0.96 |
| 5 | LEM | LTSR 6-NP | Bipolar/Closed | 1 A, 2 A, 3 A, 4 A, 5 A | 0.95 |
| 6 | LEM | LV 25 P | Bipolar/Closed | 30 V, 50 V, 70 V, 90 V, 110 V | 0.96 |
| 7 | Texas Ins. | DRV50530A | Bipolar/Open | 100 G, 200 G, 300 G, 400 G, 500 G | 0.97 |
| 8 | Honeywell | SS49/SS19 | Bipolar/Open | 100 G, 200 G, 300 G, 400 G, 500 G | 0.97 |
| 9 | Honeywell | SS39ET | Bipolar/Open | 100 G, 200 G, 300 G, 400 G, 500 G | 0.96 |
| 10 | Honeywell | SS490 | Bipolar/Open | 100 G, 200 G, 300 G, 400 G, 500 G | 0.96 |

Testing the PreMSat for different frequencies of input signals: In this section, we vary the frequency of the input signals to different types of Hall sensors within their entire input range and calculate the correlation coefficient (C) for every case. We keep the amplitude of input signals fixed at 1 A/100 G/110 V. We find that the average value of C is greater than 0.94 for every sensor category when the PreMSat is used compared to 0.1 when the PreMSat is not used. This indicates that the prototype of the PreMSat works within the entire input frequency range of every Hall sensor. The different frequencies of input signals used in our testbed and the values of C are listed in Table 9.

TABLE 9

Testing different Hall sensors in testbed for different frequencies of input signals and different strength of injected $B_{external}$

| Sl. | Part # | Frequency range of input signal | Avg. C | Strength of $B_{external}$ | Avg. C |
|---|---|---|---|---|---|
| 1 | ACS718MATR-208 | 0 Hz-40 kHz | 0.94 | 0 A-t-4200 A-t | 0.95 |
| 2 | ACS710KLATR-10BB | 0 Hz-120 kHz | 0.94 | 0 A-t-4200 A-t | 0.94 |
| 3 | ACS715ELCTR-20A | 0 Hz-80 kHz | 0.96 | 0 A-t-4200 A-t | 0.97 |
| 4 | ACS724LLCTR-10AU | 0 Hz-120 kHz | 0.96 | 0 A-t-4200 A-t | 0.95 |
| 5 | LTSR 6-NP | 0 Hz-100 kHz | 0.94 | 0 A-t-4200 A-t | 0.94 |
| 6 | LV25P | 0 Hz-25 kHz | 0.95 | 0 A-t-4200 A-t | 0.95 |
| 7 | DRV50530A | 0 Hz-20 Hz | 0.96 | 0 A-t-4200 A-t | 0.96 |
| 8 | SS49/SS19 | 0 Hz-30 Hz | 0.97 | 0 A-t-4200 A-t | 0.97 |
| 9 | SS39ET | 0 Hz-40 Hz | 0.95 | 0 A-t-4200 A-t | 0.96 |
| 10 | SS490 | 0 Hz-30 Hz | 0.96 | 0 A-t-4200 A-t | 0.94 |

Testing the PreMSat for different strength of injected $B_{external}$: At first, we find the strength of the external magnetic fields $B_{external}$ required to drive the Hall sensors to their saturation region (i.e., saturation attack) experimentally in our testbed. It is already mentioned that the strength of the magnetic field is quantified by the magneto-motive force (MMF). At first, we vary the MMF of the $B_{external}$ in our testbed using an electromagnet and find that a $B_{external}$ having an MMF>3600 A-t can cause the saturation attack from 1 cm distance for all of the 10 different Hall sensors from 4 different manufacturers (see Table 9). If the distance is <1 cm, an MMF less than 3600 A-t is required for the saturation attack.

To test the PreMSat, we vary the MMF from 0 A-t to 4200 A-t (i.e., ~1.2× of 3600 A-t) at frequency zero with a step size of 200 A-t and calculate C for every case for 10 different Hall sensors. We do a total of ~200 experiments in our testbed and find that the average value of C is greater than 0.94 for every sensor category when the PreMSat is used compared to 0.1 when the PreMSat is not used. This proves that the prototype PreMSat can prevent the external magnetic fields $B_{external}$ within a range of 0-4200 A-t (please note that an MMF>3600 A-t is required for the saturation attack). The different MMFs of $B_{external}$ used in our testbed and the average values of C are listed in Table 9.

Testing the PreMSat for different frequencies of injected $B_{external}$: In this section, we vary the frequency of the $B_{external}$. As mentioned above, we use an electromagnet and a function generator connected with a mono-pole antenna to radiate high and low frequency $B_{external}$. We vary the frequency of the $B_{external}$ from 0 Hz to 30 kHz with a step size of 1 kHz and calculate C for every case for 10 different Hall sensors. We do an average of C for every Hall sensor in our testbed and find that the average value of C is greater than 0.94 for every sensor category when the PreMSat is used compared to 0.1 when the PreMSat is not used. This proves that the prototype PreMSat can prevent both low and high frequency external magnetic spoofings capable of the saturation attack. The different frequencies of $B_{external}$ used in our testbed and the average values of C are listed in Table 10.

TABLE 10

Testing different Hall sensors for different frequencies and distances of $B_{external}$

| Sl. | Part # | Different frequencies of $B_{external}$ | Avg. C | Different distances of $B_{external}$ | Avg. C |
|---|---|---|---|---|---|
| 1 | ACS718MATR-20B | 0 Hz-30 kHz | 0.94 | 0 cm-7 cm | 0.94 |
| 2 | ACS710KLATR-10BB | 0 Hz-30 kHz | 0.95 | 0 cm-7 cm | 0.97 |
| 3 | ACS715ELCTR-20A | 0 Hz-30 kHz | 0.96 | 0 cm-7 cm | 0.95 |
| 4 | ACS724LICTR-10AU | 0 Hz-30 kHz | 0.97 | 0 cm-7 cm | 0.96 |
| 5 | LTSR 6-NP | 0 Hz-30 kHz | 0.94 | 0 cm-7 cm | 0.97 |
| 6 | LV25P | 0 Hz-30 kHz | 0.96 | 0 cm-7 cm | 0.94 |
| 7 | DRV50530A | 0 Hz-30 kHz | 0.96 | 0 cm-7 cm | 0.95 |
| 8 | SS49/SS19 | 0 Hz-30 kHz | 0.97 | 0 cm-7 cm | 0.96 |
| 9 | SS39ET | 0 Hz-30 kHz | 0.94 | 0 cm-7 cm | 0.94 |
| 10 | SS490 | 0 Hz-30 kHz | 0.96 | 0 cm-7 cm | 0.95 |

Testing the PreMSat for different distances of the magnetic source: It is already mentioned that the $B_{external}$ is generated by a magnetic source by the attacker. Previously, we placed the magnetic source 1 cm away from the target Hall sensor. In this section, we vary the distance of the magnetic-source (i.e., attack tool) from the Hall sensor. We use an MMF of ~3600 A-t and keep the frequency and amplitude of the input signals fixed at 60 Hz and 1 A/100 G/110 V, respectively. We vary the distance from 0 cm (very close) to 7 cm with an increment of 1 cm and calculate the average of C for every Hall sensor. The average value of C is greater than 0.94 for every case when the PreMSat is used compared to 0.1 when the PreMSat is not used. This proves that the prototype PreMSat can prevent the saturation attack from a very close distance. The different distances used in our testbed and the average values of C are listed in Table 10.

Real-time defense against the saturation attack: Broadly speaking, the PreMSat spends most of its time executing the following five tasks: (i) to remove common mode noise by the differential amplifier, (ii) to sample the $V^{diff}_{secondary}$ by the ADC, (iii) to generate the $B_{internal}$ and settle it (i.e., PID controller), (iv) to convert the u(k) to $I_{primary}$ by the DAC, and (v) to provide the $B_{internal}$ in opposite polarity. In Table 11, we provide the amount of time required to execute each of these tasks along with the name of the block responsible for each task.

TABLE 11

Timing analysis of the PreMSat

| Task name | Block name | Clock freq. | Time |
|---|---|---|---|
| Remove common-mode noise | Differential amplifier | NA | 0.25 μs |
| Sample the $V^{diff}_{secondary}$ | ADC | 11 MHz | 1.2 μs |
| Generate the $B_{internal}$ (PID controller) | CPU | 48 MHz | 23 μs |
| Convert the u(k) to $I_{primary}$ | DAC | 500 kHz | 4 μs |
| provide the $B_{internal}$ in opposite polarity | Buffer | NA | 0.34 μs |
| | | | 28.79 μs (total) |

From Table 11, it is important to note that the PreMSat can provide the $B_{internal}$ within 28.79 μs. This execution time is deterministic, and no additional latency/delay is involved in this process. Therefore, the PreMSat can prevent the saturation attack within 28.79 μs that can be termed as a real-time defense against the saturation attack.

Easy to integrate with the Hall sensor: At first sight, it may seem complex to integrate the Hall sensor, secondary sensor, and primary coil into the circular ferrite core. However, to integrate the Hall and secondary sensors, a small gap needs to be created in the cross-section of the circular core. The complexity of creating the small gap and winding the primary coil is similar to creating a small transformer that is doable in today's available technology. Moreover, as a saturation attack itself is a strong attack, we need to adopt this technology to prevent it.

Low-cost defense methodology: The total cost of our prototype is ~$10, comparable with the sensor cost (~$2-$70). However, the actual cost will be much less than ~$10 in mass level production.

TABLE 12

Comparing the PreMSat with other defenses.

| MMF of the injected $B_{external}$ | Recent works | PreMSat |
|---|---|---|
| Saturation attack | No | Yes |
| 0 A-t < MMF < 4200 A-t | No | Yes |
| Constant, sinusoidal, and square magnetic spoofing | No | Yes |
| 0 ≤ frequency ≤ 30 kHz with 0 A-t < MMF < 4200 A-t | No | Yes |

Comparing the PreMSat with other defenses: No defense exists in the literature that can prevent the Hall sensor from going into its saturation region. To drive a Hall sensor to its saturation region, the attacker at least needs to provide an MMF>3600 A-t. The value 3600 A-t is verified experimentally in the testbed using 10 different Hall sensors from 4 different manufacturers. The PreMSat can prevent the saturation attack and can nullify constant, sinusoidal, pulsating, or any type of external magnetic fields. The PreMSat works against an MMF within a range of 0-4200 A-t. All the recent works cannot prevent the saturation attack and do not work against an MMF within the range of 0-4200 A-t for constant, sinusoidal, and square pulsating magnetic fields. Moreover, the recent works fail to contain certain frequencies, and cannot contain constant (i.e, frequency=0) magnetic fields; however the PreMSat works for 0 to 30 kHz signals. The comparison between the PreMSat and the recent works is tabulated in Table 12 that demonstrates the strength of the PreMSat over the recent works.

Demonstration of preventing the saturation attack: In this section, we demonstrate the capability of the PreMSat on a practical system—a grid-tied solar inverter. Grid-tied solar inverters are critical components in smart grids and typically used as a source of power in solar plants. Hall sensors are present inside of the inverter that are typically used to measure AC and DC current/voltage.

Therefore, an attacker can target the grid-tied inverters and inject external magnetic fields to drive the Hall sensors of the inverters to the saturation region. This type of attack can shut down the inverter and for a weak grid scenario, it can also cause a blackout in the region. To demonstrate that the PreMSat can prevent the saturation attack, we use a 140 Watt inverter from Texas Instruments in the testbed. This inverter has a Hall effect current sensor with a part #ACS712ELCTR-20A-T. At first, we inject constant, sinusoidal, and pulsating magnetic fields into the inverter with an MMF=3600 A-t from 1 cm distance. This causes saturation attack on the Hall sensor located inside of the inverter. As a result, the inverter shuts down itself causing a DoS attack on the inverter.

Figure 29:
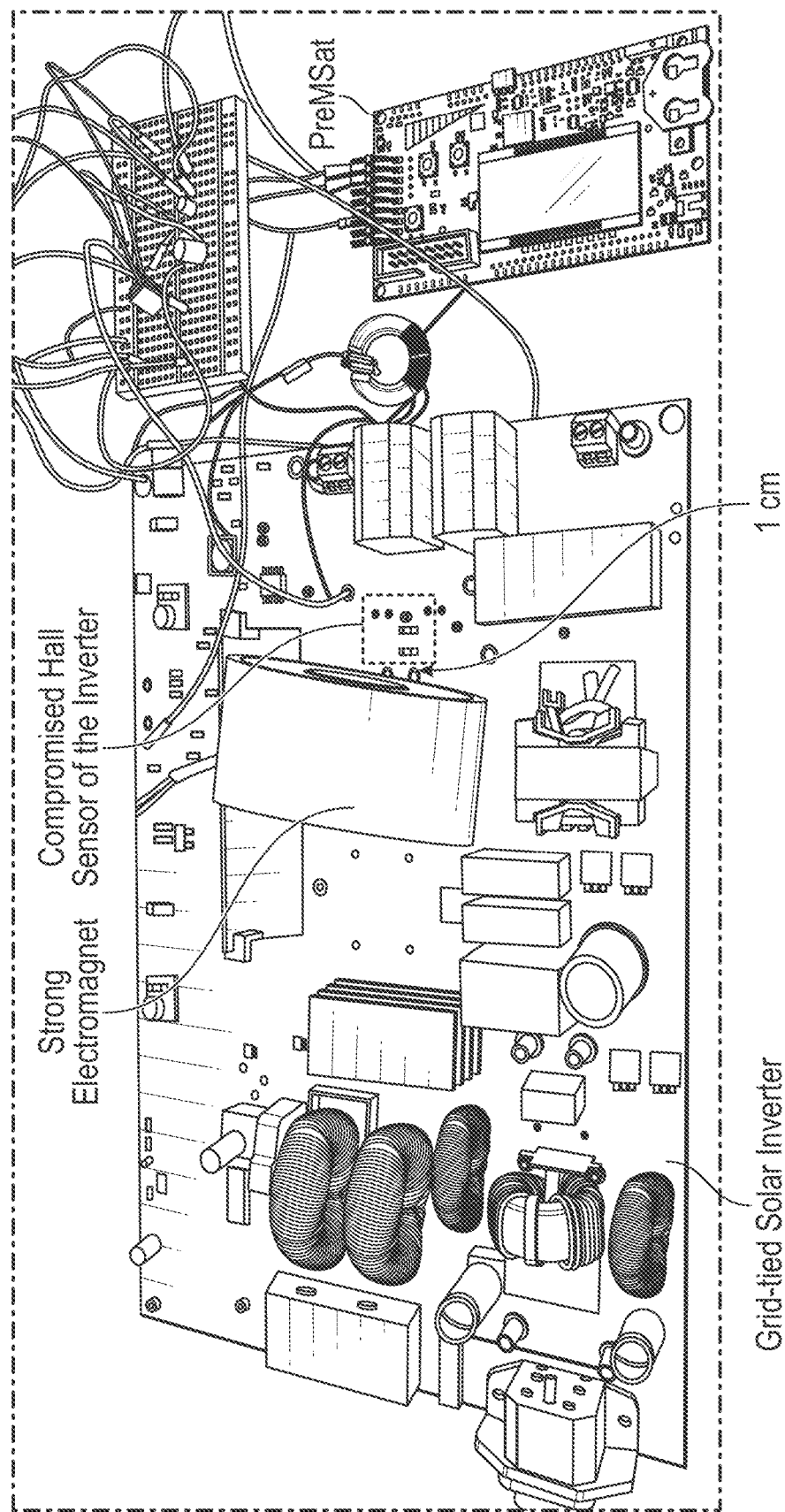
FIG. 29 shows a PreMSat preventing a saturation attack on a grid-tied solar inverter.

To evaluate the PreMSat, we integrate the PreMSat with the Hall sensor and repeat the same experiment (FIG. 29). We notice that at this time, the inverter continues working without any shutdown. This proves that the PreMSat can prevent the saturation attack on a practical system.

Limitations of this particular PreMSat example: Here we discuss the limitations of this particular PreMSat example. These limitations exist because of the limitations of the practical hardware and PID controller.

Non-zero settling time of the PID controller. It is already described that the PID controller has a non-zero settling time (i.e., 23 μs), which is also the main contributing factor to the total time (see Table 11) required to generate the $B_{internal}$. Therefore, if the attacker changes the injected magnetic fields $B_{external}$ within 23 μs, the timeliness of the defense will not be guaranteed. We have already finely tuned the values of $K_p$, $K_i$, $K_d$ to obtain the lowest possible rise-time and settling time for the PID controller.

Non-zero steady-state error of the PID controller: The PID controller is tuned in such a way to have the lowest amount of steady-state error (i.e., <1%) possible for the problem at hand. In spite of the fine-tuning, the PID controller has a non-zero steady-state error, which may add error to the $B_{internal}$ while nullifying the $B^v_{external}$. However, <1% error is negligible compared to the large values of the $B^v_{external}$ required for the saturation attack. For example, 3600 A-t is required for the saturation attack from 1 cm distance, and 1% of 3600 A-t is only 36 A-t that results in a negligible noise at the output of the Hall sensor.

Upper limit strength of the injected $B_{external}$: This prototype can prevent an external magnetic field $B_{external}$ up to an MMF of 4200 A-t. The reason behind this is that our prototype cannot generate a $B_{internal}$ having an MMF more than 4200 A-t. The upper limit 4200 A-t, is limited by the amount of power that the buffer can provide. The idea is supported by Eqn. 3, which says $B_{internal}$ depends on the $I_{primary}$. The $I_{primary}$ is provided by the buffer to the primary coil. The buffer used in the prototype has its maximum power capacity that can support a $I_{primary}$, which can generate an MMF up to 4200 A-t. The value can be increased from 4200 A-t to a higher value by using a high power buffer that causes a trade-off between cost and strength.

Upper limit frequency of the injected $B_{external}$: This prototype can prevent an external magnetic field $B_{external}$ up to a frequency of ~30 kHz. The upper limit 30 kHz results from the total time 28.79 μs required to generate the $B_{internal}$ (see Table 11). The reciprocal of 28.79 μs is 1/28.79 μs=~35 kHz. The prototype PreMSat supports up to ~30 kHz instead of 35 kHz because an additional time is spent to overcome the parasitic inductance/capacitance present in the primary coil. Note that the total time of 28.79 μs is obtained for this prototype using a clock frequency of 48 MHz. This time can be reduced further using a faster CPU having a clock frequency higher than 48 MHz.

Conclusion: We have presented an example PreMSat, a defense against the saturation attack on Hall sensors. It is important to note that there is no defense exist in the literature that can prevent a sensor from the saturation attack. In this sense, the PreMSat is the first of its kind in literature and industry that can prevent the saturation attack satisfactorily. The PreMSat can prevent the saturation attack originating from different types, such as constant, sinusoidal, and pulsating magnetic fields, in hard real-time. The PreMSat integrates a low resistive magnetic path to collect the external magnetic fields injected by the attacker and utilizes a finely tuned PID controller to nullify the external fields. The PID controller is tuned in such a way that has minimum settling time and steady-state error. This helps to keep the existing data processing speed of the connected system undisturbed. We have done extensive analysis of the PreMSat through more than 300 experiments on 10 different Hall sensors from 4 different manufacturers and proved its efficacy against the saturation attack. This supports the idea that the PreMSat is a general defense against the saturation attack. The PreMSat requires a deterministic amount of time to execute its algorithm and can be integrated with the existing Hall sensor with low efforts. Moreover, we have demonstrated the efficacy of the PreMSat in a practical system—grid-tied solar inverter.

This demonstration proves that the PreMSat can prevent the DoS attack on a practical system by nullifying the saturation attack on a Hall sensor. Finally, we believe that the necessity of developing a similar defense like this is going to be increased in the near future for other sensors when sensors will pervade our lives.

While some of the various examples described herein use analog components such as HPF and LPF to cancel portions of attack signals, one of skill in the art would appreciate that various analog components could be replaced via additional digital processing. In some embodiments, all processing may be done digitally.

Table of selected structural components

| General Name | Example Function | Examples |
| --- | --- | --- |
| Hall element | Senses all magnetic fields | Any passive Hall sensor |
| External sensing device | Senses only external magnetic fields | $2^{nd}$ Hall sensor (not connected in series with current source) |
| Signal splitter | Splits AC and DC portions of signal | DC blocker, HPF (0.8 Hz) |
| Low-frequency Attack Canceller | Removes low-frequency component of attack | HPF |
| High-frequency Attack Canceller | Removes high-frequency component of attack | LPF |
| AC cancelling tuner | Tunes low and high frequency attack cancellers | Rheostats |
| Delay compensator | Compensates for delay of AC signal | All-pass filter with a voltage gain |
| Computing core | Determines amplitude of DC component of attack Determines frequency of AC component of Attack | CPU |
| First adder | Nullifies DC component of attack by adding opposite of DC component | An operational-amplifier with adder configuration |
| Second adder | Adds corrected AC and DC signals | An operational-amplifier with adder configuration |
| Subtractor | Subtracts AC component of signal from original signal to provide DC component of signal | An operational-amplifier with subtractor configuration |

Table of selected structural components

| General Name | Example Function | Examples |
| --- | --- | --- |
| DC compensator | Provides appropriate feedback signal to the first adder to nullify the injected DC attack signals | An operational-amplifier with inverting and non-inverting configuration |
| Algorithm running on the CPU | Provides appropriate feedback signal to the DC compensator to nullify the injected DC attack signals and tune the LPF/HPF to cancel out the low/high frequency attack signals. LPF and HPF are configured in a band-pass or band-notch filter depending upon requirement to nullify the low/high frequency attack components. | A software which controls the AC cancelling tuner and DC compensator to nullify the AC and DC attack components |
| Hall element | Senses all magnetic fields | Any passive Hall sensor |
| Secondary sensor | Senses only attack components of external magnetic fields | $2^{nd}$ Hall sensor (not connected in series with current source) |
| Toroid core | Collects vertical components of the external magnetic fields that only influence the Hall sensor | Circular ferrite core |
| Primary coil | Generates an internal magnetic field to nullify the attack magnetic fields | Coil winded on the toroid |
| Differential amplifier | Removes the common mode noise in the signal coming from the secondary sensor | An operational-amplifier with the differential configuration |
| PID controller | Generate a proportional signal, which can be used to generate an internal magnetic field to nullify the attack magnetic fields | PID controller |
| Computing core | Runs the PID controller | CPU |
| Buffer | Provides a power to the primary coil to generate the internal magnetic fields | An operational-amplifier with the power transistor at the output stage |

As used herein, the term "about" refers to plus or minus 10% of the referenced number.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting essentially of" or "consisting of", and as such the written description requirement for claiming one or more embodiments of the present invention using the phrase "consisting essentially of" or "consisting of" is met.

The reference numbers recited in the below claims are solely for ease of examination of this patent application, and are exemplary, and are not intended in any way to limit the scope of the claims to the particular features having the corresponding reference numbers in the drawings.

What is claimed is:

1. A structure to mitigate non-invasive physical attacks upon a magnetic flux sensor, said structure comprising:
    a. a first magnetic flux sensor, configured to output a signal A corresponding to a magnetic flux, the first magnetic flux sensor connected in series with a current source;
    b. a second magnetic flux sensor, configured to output a signal B corresponding to a magnetic flux attack, the second magnetic flux sensor not connected in series with the current source;
    c. a central processing unit (CPU), configured to identify a portion of signal A which is due to the magnetic flux attack; and
    d. an attack signal canceller, configured to cancel the portion of signal A which is due to the magnetic flux attack.

2. The structure of claim 1, wherein the first magnetic flux sensor is a passive Hall sensor.

3. The structure of claim 1, wherein the attack signal canceller filters out the portion of signal A which is due to the magnetic flux attack.

4. The structure of claim 1, wherein the attack signal canceller generates a magnetic flux that opposes the magnetic flux attack so as to cancel out the effect of the magnetic flux attack.

5. The structure of claim 1, wherein the attack signal canceller comprises:
    a. a high-frequency attack canceller, configured to cancel a high-frequency attack signal;
    b. a low-frequency attack canceller, configured to cancel a low-frequency attack signal; and
    c. a direct-current (DC) attack canceller, configured to cancel a DC attack signal.

6. The structure of claim 1, wherein the first magnetic flux sensor senses all magnetic flux, and the second magnetic flux sensor senses only external magnetic flux.

7. The structure of claim 1, wherein the attack signal canceller comprises:
    a. a signal splitter and a subtractor configured to split alternating current (AC) and direct current (DC) portions of signal A;
    b. a high pass filter (HPF) configured to remove a low-frequency component of signal A which is due to the magnetic flux attack;
    c. a low pass filter (LPF) configured to remove a high-frequency component of signal A which is due to the magnetic flux attack;
    d. a plurality of AC canceller tuners configured to tune the HPF and LPF;
    e. a delay compensator configured to compensate for a delay or phase change of the AC signal; and
    f. a DC compensator configured to provide a feedback signal to cancel a DC component of signal A which is due to the magnetic flux attack;
wherein the HPF and LPF are configured to work in combination as either a band pass or band notch filter to filter out the AC attack components.

8. The structure of claim 1, wherein the CPU uses an algorithm to:
    a. provide a feedback signal to a DC compensator to cancel a DC component of signal A which is due to the magnetic flux attack; and
    b. tune a low-frequency attack canceller and a high-frequency attack canceller to cancel an AC component of signal A which is due to the magnetic flux attack.

9. The structure of claim 1, wherein the attack signal canceller comprises:
   a. a circular toroid core with a gap configured to fit the first magnetic flux sensor and the second magnetic flux sensor;
   b. a primary coil disposed around the circular toroid core, the primary coil configured to generate an internal magnetic field to cancel the magnetic flux attack;
   c. a differential amplifier configured to remove a common mode noise from signal B;
   d. a PID controller configured to generate a signal which is proportional to the magnetic flux attack; and
   e. a buffer configured to provide a power to the primary coil to generate the internal magnetic field.

10. The structure of claim 9, wherein the CPU runs the PID controller.

11. A method of mitigating a non-invasive physical attack upon a magnetic flux sensor, said method comprising:
   a. detecting a signal A corresponding to a magnetic flux via a first magnetic flux sensor;
   b. detecting a signal B corresponding to a magnetic flux attack via a second magnetic flux sensor;
   c. identifying a portion of signal A which is due to the magnetic flux attack via a central processing unit (CPU); and
   d. canceling the portion of signal A which is due to the magnetic flux attack via an attack signal canceller.

12. The method of claim 11, wherein the attack signal canceller filters out the portion of signal A which is due to the magnetic flux attack.

13. The method of claim 11, wherein the attack signal canceller use separate digital and analog cores to cancel a AC attack component of signal A and a DC attack component of signal A.

14. The method of claim 11, additionally comprising:
   a. blocking a direct current (DC) component of signal A via a DC blocker, and outputting the remaining alternating current (AC) signal down an AC processing path;
   b. subtracting the AC signal from signal A via a subtractor, and outputting the remaining DC signal down a DC processing path;
   c. identifying a frequency of a AC attack component of signal A via the CPU using signal B;
   d. tuning a high pass filter (HPF) and a low pass filter (LPF) in the AC processing path based on the identified frequency of the AC attack;
   e. filtering out the AC attack component from the AC signal via the HPF and the LPF;
   f. compensating for a delay in the AC signal via a delay compensator;
   g. identifying a magnitude of a DC attack component of signal A via the CPU using signal B;
   h. generating a signal equal and opposite to the DC attack component using a DC compensator in the CPU;
   i. cancelling the DC attack component by adding the equal and opposite signal to the DC signal via a first adder;
   j. adding the corrected AC signal and the corrected DC signal via a second adder; and
   k. outputting the corrected and recombined signal.

15. The method of claim 11, wherein the attack signal canceller generates a magnetic flux that opposes the magnetic flux attack so as to cancel out the effect of the magnetic flux attack.

16. The method of claim 11, additionally comprising:
   a. detecting the presence of a magnetic flux attack via the second magnetic flux sensor;
   b. providing signal B to a differential amplifier,
   c. removing a common-mode noise from signal B via the differential amplifier;
   d. converting the corrected signal B from analog to digital, and calculating a magnitude of the magnetic flux attack from the digital signal;
   e. generating an internal signal via a PID controller which is configured to generate magnetic flux which is equal and opposite of the magnetic flux attack, based on the calculated magnitude of the magnetic flux attack;
   f. converting the internal signal generated by the PID controller to an equivalent analog signal;
   g. passing the converted analog signal through a buffer to increase a driving capability of the signal;
   h. passing the buffered signal through a primary coil so as to generate an internal magnetic flux which is equal and opposite to the magnetic flux attack, thereby cancelling the magnetic flux attack.

17. The method of claim 16, additionally comprising providing a circular toroid core, a rectangular ferrite core, or a square ferrite core to collect a component of the magnetic flux attack that influences the first magnetic flux sensor, wherein the core comprises a material to support high frequency magnetic flux.

18. The method of claim 11, wherein the magnetic flux attack is a saturation attack.

19. The method of claim 11, wherein the method cancels the magnetic flux attack in real time.

20. A structure to mitigate non-invasive physical attacks upon a magnetic flux sensor, said structure comprising:
   A) a plurality of proximate magnetic flux sensors N in number, each proximate magnetic flux sensor (PMFS) (100) comprising:
      1) an analog output port (110);
   B) a plurality of external magnetic flux sensors M in number, each external magnetic flux sensor (EMFS) (200) comprising:
      1) an analog output port (210);
   C) an analog sensor conditioning block (ASC) (300), comprising:
      1) an overall analog output port (310);
      2) a plurality of decomposed analog output ports (320) N in number,
      3) a plurality of recomposed analog input ports (330);
      4) a plurality of raw analog input ports (340) N in number;
   D) a mixed-signal processing block (MSP) (400), comprising:
      1) a first plurality of analog-to-digital converters (ADC1s) N in number, each ADC1 (410) comprising:
         a) an analog input port (411);
         b) an output port (412);
      2) a second plurality of analog-to-digital converters (ADC2s) M in number, each ADC2 (420) comprising:
         a) an analog input port (421);
         b) an output port (422);
      3) a plurality of digital-to-analog converters (DACs), each DAC (430) comprising:
         a) an analog output port (431);
         b) an input port (432);
      4) a first plurality of direct memory access channels (DMA1s) N in number, each DMA1 (440) comprising:
         a) a peripheral port (441);
         b) a random-access memory (RAM) port (442);

5) a second plurality of direct memory access channels (DMA2s) M in number, each DMA2 (450) comprising:
   a) a peripheral port (451):
   b) a random-access memory (RAM) port (452):
6) a random-access memory (RAM) (500);
7) a digital signal processor (DSP) (600), comprising:
   a) a defense algorithm (610);

wherein the plurality of PMFSs (100) senses intentional magnetic flux; wherein the plurality of PMFSs (100) further senses external magnetic flux; wherein the plurality of EMFSs (200) senses external magnetic flux; wherein the PMFS analog output ports (110) connect electrically, respectively, to the ASC raw analog input ports (340); wherein the EMFS analog output ports (210) connect electrically, respectively, to the ADC2 analog input ports (421); wherein the ASC decomposed analog output ports (320) connect electrically, respectively, to the ADC1 analog input ports (411); wherein the DAC analog output ports (431) connect electrically, respectively, to the ASC recomposed analog input ports (330); wherein the ADC1 output ports (412) connect electrically, respectively, to the DMA1 peripheral ports (441); wherein the ADC2 output ports (422) connect electrically, respectively, to the DMA2 peripheral ports (451); wherein the DMA1 RAM ports (442) connect electrically to the RAM (500); wherein the DMA2 RAM ports (452) connect electrically to the RAM (500); wherein the RAM (500) connects electrically to the DSP (600); wherein the DSP (600) connects electrically, respectively, to the DAC input ports (432); wherein the ASC (300) decomposes the PMFS signals from the ASC raw analog input ports (340) and sends a first partition of the PMFS signals to the ASC decomposed analog output ports (320); wherein the ASC (300) recomposes a second partition of the PMFS signals with signals from the ASC recomposed analog input ports (330); wherein the DSP (600) applies the defense algorithm (610) to detect an attack by means of external magnetic flux upon the EMFSs (200); wherein, if an attack is detected, the DSP (600) suppresses and replaces the decomposed signal arising from the PMFSs (100) with the last known best estimate from the PMFSs (100), otherwise the DSP (600) updates the last known best estimate arising from the PMFSs (100); wherein the DSP (600) configures the DAC analog output ports (431) with the last known best estimate arising from the PMFSs (100); wherein the ASC (300) recomposes the magnetic flux sensor signal free from external magnetic flux; wherein the ASC (300) applies the recomposed magnetic flux sensor signal to the ASC overall analog output port (310); so as to mitigate non-invasive physical attacks upon the PMFSs (100) by external magnetic flux.

* * * * *